(12) United States Patent  
Anthony et al.

(10) Patent No.: US 9,036,319 B2  
(45) Date of Patent: *May 19, 2015

(54) ARRANGEMENT FOR ENERGY CONDITIONING

(75) Inventors: Anthony A. Anthony, Erie, PA (US); William M. Anthony, Erie, PA (US)

(73) Assignee: X2Y Attenuators, LLC, Erie, PA (US)

( * ) Notice: Subject to any disclaimer, the term of this patent is extended or adjusted under 35 U.S.C. 154(b) by 825 days.

This patent is subject to a terminal disclaimer.

(21) Appl. No.: 13/195,476

(22) Filed: Aug. 1, 2011

(65) Prior Publication Data

US 2012/0023741 A1   Feb. 2, 2012
US 2014/0298647 A2   Oct. 9, 2014

Related U.S. Application Data

(63) Continuation of application No. 13/073,967, filed on Mar. 28, 2011, now Pat. No. 8,018,706, which is a continuation of application No. 12/848,676, filed on Aug. 2, 2010, now Pat. No. 7,916,444, which is a (Continued)

(51) Int. Cl.
*H02H 9/00* (2006.01)
*H01L 23/552* (2006.01)
*H01G 4/40* (2006.01)
*H03H 1/00* (2006.01)

(52) U.S. Cl.
CPC .............. *H01L 23/552* (2013.01); *H01G 4/40* (2013.01); *H01L 2924/3011* (2013.01); *H03H 2001/0014* (2013.01); *H03H 2001/0085* (2013.01); *H01L 2924/0002* (2013.01)

(58) Field of Classification Search
CPC ...................................................... H01L 23/552
USPC ....................................................... 361/118
See application file for complete search history.

(56) References Cited

U.S. PATENT DOCUMENTS

| 676,185 | A | 6/1901 | Gattinger |
| 3,104,363 | A | 9/1963 | Butler |
| 3,240,621 | A | 3/1966 | Flower, Jr. et al. |
| 3,273,027 | A | 9/1966 | Bourgault et al. |
| 3,343,034 | A | 9/1967 | Ovshinsky |
| 3,379,943 | A | 4/1968 | Breedlove |
| 3,381,244 | A | 4/1968 | Dalley |
| 3,488,528 | A | 1/1970 | Emond |
| 3,496,434 | A | 2/1970 | Prokopowicz |
| 3,519,959 | A | 7/1970 | Bewley et al. |

(Continued)

FOREIGN PATENT DOCUMENTS

| CA | 747079 | 11/1966 |
| CA | 1237534 | 5/1988 |

(Continued)

OTHER PUBLICATIONS

Oct. 1, 2002, PCT International Search Report for PCT/US01/48861.

(Continued)

*Primary Examiner* — Stephen W Jackson
(74) *Attorney, Agent, or Firm* — Kenneth C. Spafford

(57) ABSTRACT

Circuit arrangement embodiments that use relative groupings of energy pathways that include shielding circuit arrangements that can sustain and condition electrically complementary energy confluences.

250 Claims, 7 Drawing Sheets

Related U.S. Application Data continuation of application No. 12/554,976, filed on Sep. 7, 2009, now Pat. No. 7,768,763, which is a continuation of application No. 11/866,437, filed on Oct. 3, 2007, now abandoned, which is a continuation of application No. 11/296,391, filed on Dec. 8, 2005, now Pat. No. 7,321,485, which is a continuation of application No. 10/189,339, filed on Jul. 2, 2002, now Pat. No. 7,110,235, which is a continuation-in-part of application No. 10/155,159, filed on Apr. 2, 2002, now Pat. No. 6,894,884, which is a continuation-in-part of application No. 09/845,680, filed on Apr. 30, 2001, now Pat. No. 6,580,595, which is a continuation-in-part of application No. 09/777,021, filed on Feb. 5, 2001, now Pat. No. 6,687,108, which is a continuation-in-part of application No. 09/632,048, filed on Aug. 3, 2000, now Pat. No. 6,738,249, which is a continuation-in-part of application No. 09/594,447, filed on Jun. 15, 2000, now Pat. No. 6,636,406, which is a continuation-in-part of application No. 09/579,606, filed on May 26, 2000, now Pat. No. 6,373,673, which is a continuation-in-part of application No. 09/460,218, filed on Dec. 13, 1999, now Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/280,819, filed on Apr. 2, 2001, provisional application No. 60/320,429, filed on Jul. 2, 2001, provisional application No. 60/310,962, filed on Aug. 8, 2001, provisional application No. 60/349,954, filed on Jan. 18, 2002, provisional application No. 60/388,388, filed on Jun. 12, 2002.

(56) References Cited

U.S. PATENT DOCUMENTS

| | | | |
|---|---|---|---|
| 3,534,301 | A | 10/1970 | Golembeski |
| 3,568,000 | A | 3/1971 | Martre et al. |
| 3,573,677 | A | 4/1971 | Detar |
| 3,652,941 | A | 3/1972 | Neuf |
| 3,680,005 | A | 7/1972 | Bewley et al. |
| 3,681,612 | A | 8/1972 | Vogl |
| 3,688,361 | A | 9/1972 | Bonini |
| 3,691,563 | A | 9/1972 | Shelton |
| 3,701,958 | A | 10/1972 | Herbert |
| 3,736,471 | A | 5/1973 | Donze et al. |
| 3,740,678 | A | 6/1973 | Hill |
| 3,742,420 | A | 6/1973 | Harnden, Jr. |
| 3,764,727 | A | 10/1973 | Balde |
| 3,790,858 | A | 2/1974 | Brancaleone et al. |
| 3,842,374 | A | 10/1974 | Schlicke |
| 3,880,493 | A | 4/1975 | Lockhart, Jr. |
| 3,896,354 | A | 7/1975 | Coleman et al. |
| 3,898,541 | A | 8/1975 | Weller |
| 3,921,041 | A | 11/1975 | Stockman |
| 4,023,071 | A | 5/1977 | Fussell |
| 4,030,190 | A | 6/1977 | Varker |
| 4,071,878 | A | 1/1978 | Stynes |
| 4,081,770 | A | 3/1978 | Mayer |
| 4,119,084 | A | 10/1978 | Eckels |
| 4,135,132 | A | 1/1979 | Tafjord |
| 4,139,783 | A | 2/1979 | Engeler |
| 4,148,003 | A | 4/1979 | Colburn et al. |
| 4,160,220 | A | 7/1979 | Stachejko |
| 4,191,986 | A | 3/1980 | ta Huang et al. |
| 4,198,613 | A | 4/1980 | Whitley |
| 4,237,522 | A | 12/1980 | Thompson |
| 4,259,604 | A | 3/1981 | Aoki |
| 4,262,317 | A | 4/1981 | Baumbach |
| 4,275,945 | A | 6/1981 | Krantz et al. |
| 4,290,041 | A | 9/1981 | Utsumi et al. |
| 4,292,558 | A | 9/1981 | Flick et al. |
| 4,308,509 | A | 12/1981 | Tsuchiya et al. |
| 4,312,023 | A | 1/1982 | Frappart et al. |
| 4,312,026 | A | 1/1982 | Iwaya et al. |
| 4,320,364 | A | 3/1982 | Sakamoto et al. |
| 4,322,698 | A | 3/1982 | Takahashi et al. |
| 4,328,530 | A | 5/1982 | Bajorek et al. |
| 4,328,531 | A | 5/1982 | Nagashima et al. |
| 4,335,417 | A | 6/1982 | Sakshaug et al. |
| 4,342,143 | A | 8/1982 | Jennings |
| 4,349,862 | A | 9/1982 | Bajorek et al. |
| 4,353,040 | A | 10/1982 | Krumm et al. |
| 4,353,044 | A | 10/1982 | Nossek |
| 4,366,456 | A | 12/1982 | Ueno et al. |
| 4,374,368 | A | 2/1983 | Viola et al. |
| 4,375,053 | A | 2/1983 | Viola et al. |
| 4,384,263 | A | 5/1983 | Neuman et al. |
| 4,394,639 | A | 7/1983 | McGalliard |
| 4,412,146 | A | 10/1983 | Futterer et al. |
| 4,424,552 | A | 1/1984 | Saint Marcoux |
| 4,441,088 | A | 4/1984 | Anderson |
| 4,494,083 | A | 1/1985 | Josefsson et al. |
| 4,494,092 | A | 1/1985 | Griffin |
| 4,498,122 | A | 2/1985 | Rainal |
| 4,533,931 | A | 8/1985 | Mandai et al. |
| 4,541,035 | A | 9/1985 | Carlson et al. |
| 4,551,746 | A | 11/1985 | Gilbert et al. |
| 4,551,747 | A | 11/1985 | Gilbert et al. |
| 4,553,114 | A | 11/1985 | English et al. |
| 4,556,929 | A | 12/1985 | Tanaka et al. |
| 4,560,962 | A | 12/1985 | Barrow |
| 4,563,659 | A | 1/1986 | Sakamoto |
| 4,577,214 | A | 3/1986 | Schaper |
| 4,586,104 | A | 4/1986 | Standler |
| 4,587,589 | A | 5/1986 | Marek |
| 4,590,537 | A | 5/1986 | Sakamoto |
| 4,592,606 | A | 6/1986 | Mudra |
| 4,597,029 | A | 6/1986 | Kucharek et al. |
| 4,612,140 | A | 9/1986 | Mandai |
| 4,612,497 | A | 9/1986 | Ulmer |
| 4,626,958 | A | 12/1986 | Lockard et al. |
| 4,628,411 | A | 12/1986 | Balderes et al. |
| 4,633,368 | A | 12/1986 | Frederick |
| 4,636,752 | A | 1/1987 | Saito |
| 4,639,826 | A | 1/1987 | Val et al. |
| 4,654,694 | A | 3/1987 | Val |
| 4,658,334 | A | 4/1987 | McSparran et al. |
| 4,665,465 | A | 5/1987 | Tanabe |
| 4,667,267 | A | 5/1987 | Hernandez et al. |
| 4,675,644 | A | 6/1987 | Ott et al. |
| 4,682,129 | A | 7/1987 | Bakermans et al. |
| 4,685,025 | A | 8/1987 | Carlomagno |
| 4,688,151 | A | 8/1987 | Kraus et al. |
| 4,694,265 | A | 9/1987 | Kupper |
| 4,698,721 | A | 10/1987 | Warren |
| 4,703,386 | A | 10/1987 | Speet et al. |
| 4,706,162 | A | 11/1987 | Hernandez et al. |
| 4,707,671 | A | 11/1987 | Suzuki et al. |
| 4,710,854 | A | 12/1987 | Yamada et al. |
| 4,712,062 | A | 12/1987 | Takamine |
| 4,712,540 | A | 12/1987 | Tucker et al. |
| 4,713,540 | A | 12/1987 | Gilby et al. |
| 4,720,690 | A | 1/1988 | Popek et al. |
| 4,720,760 | A | 1/1988 | Starr |
| 4,725,878 | A | 2/1988 | Miyauchi et al. |
| 4,729,058 | A | 3/1988 | Gupta et al. |
| 4,734,818 | A | 3/1988 | Hernandez et al. |
| 4,734,819 | A | 3/1988 | Hernandez et al. |
| 4,739,448 | A | 4/1988 | Rowe et al. |
| 4,746,557 | A | 5/1988 | Sakamoto et al. |
| 4,752,752 | A | 6/1988 | Okubo |
| 4,755,910 | A | 7/1988 | Val |
| 4,760,485 | A | 7/1988 | Ari et al. |
| 4,772,225 | A | 9/1988 | Ulery |

(56) References Cited

U.S. PATENT DOCUMENTS

| | | |
|---|---|---|
| 4,777,460 A | 10/1988 | Okubo |
| 4,780,598 A | 10/1988 | Fahey et al. |
| 4,782,311 A | 11/1988 | Ookubo |
| 4,785,135 A | 11/1988 | Ecker et al. |
| 4,785,271 A | 11/1988 | Higgins |
| 4,789,847 A | 12/1988 | Sakamoto et al. |
| 4,793,058 A | 12/1988 | Venaleck |
| 4,794,485 A | 12/1988 | Bennett |
| 4,794,499 A | 12/1988 | Ott |
| 4,795,658 A | 1/1989 | Kano et al. |
| 4,799,070 A | 1/1989 | Nishikawa |
| 4,799,128 A | 1/1989 | Chen |
| 4,801,904 A | 1/1989 | Sakamoto et al. |
| 4,814,295 A | 3/1989 | Mehta |
| 4,814,938 A | 3/1989 | Arakawa et al. |
| 4,814,941 A | 3/1989 | Speet et al. |
| 4,819,126 A | 4/1989 | Kornrumpf et al. |
| 4,827,327 A | 5/1989 | Miyauchi et al. |
| 4,845,606 A | 7/1989 | Herbert |
| 4,847,730 A | 7/1989 | Konno et al. |
| 4,856,102 A | 8/1989 | Insetta et al. |
| 4,864,465 A | 9/1989 | Robbins |
| 4,875,087 A | 10/1989 | Miyauchi et al. |
| 4,884,170 A | 11/1989 | Ohki et al. |
| 4,891,616 A | 1/1990 | Renken et al. |
| 4,891,686 A | 1/1990 | Krausse |
| 4,901,039 A | 2/1990 | Corzine et al. |
| 4,904,967 A | 2/1990 | Morii et al. |
| 4,908,586 A | 3/1990 | Kling et al. |
| 4,908,590 A | 3/1990 | Sakamoto et al. |
| 4,909,909 A | 3/1990 | Florjancic et al. |
| 4,916,576 A | 4/1990 | Herbert et al. |
| 4,924,340 A | 5/1990 | Sweet |
| 4,942,353 A | 7/1990 | Herbert et al. |
| 4,945,399 A | 7/1990 | Brown et al. |
| 4,947,286 A | 8/1990 | Kaneko et al. |
| 4,949,217 A | 8/1990 | Ngo |
| 4,954,929 A | 9/1990 | Baran |
| 4,967,315 A | 10/1990 | Schelhorn |
| 4,975,761 A | 12/1990 | Chu |
| 4,978,906 A | 12/1990 | Herbert et al. |
| 4,982,311 A | 1/1991 | Dehaine et al. |
| 4,989,117 A | 1/1991 | Hernandez |
| 4,990,202 A | 2/1991 | Murata et al. |
| 4,994,936 A | 2/1991 | Hernandez |
| 4,999,595 A | 3/1991 | Azumi et al. |
| 5,012,386 A | 4/1991 | McShane et al. |
| 5,018,047 A | 5/1991 | Insetta et al. |
| 5,027,253 A | 6/1991 | Lauffer et al. |
| 5,029,062 A | 7/1991 | Capel |
| 5,034,709 A | 7/1991 | Azumi et al. |
| 5,034,710 A | 7/1991 | Kawaguchi |
| 5,034,850 A | 7/1991 | Hernandez et al. |
| 5,034,851 A | 7/1991 | Monsorno et al. |
| 5,040,092 A | 8/1991 | Katho et al. |
| 5,040,093 A | 8/1991 | Greuel |
| 5,041,899 A | 8/1991 | Oku et al. |
| 5,051,712 A | 9/1991 | Naito et al. |
| 5,059,140 A | 10/1991 | Philippson et al. |
| 5,065,284 A | 11/1991 | Hernandez |
| 5,073,523 A | 12/1991 | Yamada et al. |
| 5,075,665 A | 12/1991 | Taira et al. |
| 5,079,069 A | 1/1992 | Howard et al. |
| 5,079,223 A | 1/1992 | Maroni |
| 5,079,669 A | 1/1992 | Williams |
| 5,083,101 A | 1/1992 | Frederick |
| 5,089,688 A | 2/1992 | Fang et al. |
| 5,089,880 A | 2/1992 | Meyer et al. |
| 5,089,881 A | 2/1992 | Panicker |
| 5,095,402 A | 3/1992 | Hernandez et al. |
| 5,099,387 A | 3/1992 | Kato et al. |
| 5,105,333 A | 4/1992 | Yamano et al. |
| 5,107,394 A | 4/1992 | Naito et al. |
| 5,109,206 A | 4/1992 | Carlile |
| 5,115,221 A | 5/1992 | Cowman |
| 5,119,062 A | 6/1992 | Nakamura et al. |
| 5,140,297 A | 8/1992 | Jacobs et al. |
| 5,140,496 A | 8/1992 | Heinks et al. |
| 5,140,497 A | 8/1992 | Kato et al. |
| 5,142,352 A | 8/1992 | Chambers et al. |
| 5,142,430 A | 8/1992 | Anthony |
| 5,146,191 A | 9/1992 | Mandai et al. |
| 5,148,005 A | 9/1992 | Fang et al. |
| 5,150,088 A | 9/1992 | Virga et al. |
| 5,151,770 A | 9/1992 | Inoue |
| 5,153,379 A | 10/1992 | Guzuk et al. |
| 5,155,464 A | 10/1992 | Cowman et al. |
| 5,155,655 A | 10/1992 | Howard et al. |
| 5,159,750 A | 11/1992 | Dutta et al. |
| 5,161,086 A | 11/1992 | Howard et al. |
| 5,162,977 A | 11/1992 | Paurus et al. |
| 5,165,055 A | 11/1992 | Metsler |
| 5,166,772 A | 11/1992 | Soldner et al. |
| 5,167,483 A | 12/1992 | Gardiner |
| 5,170,317 A | 12/1992 | Yamada et al. |
| 5,172,299 A | 12/1992 | Yamada et al. |
| 5,173,670 A | 12/1992 | Naito et al. |
| 5,173,767 A | 12/1992 | Lange et al. |
| 5,177,594 A | 1/1993 | Chance et al. |
| 5,177,663 A | 1/1993 | Ingleson et al. |
| 5,177,670 A | 1/1993 | Shinohara et al. |
| 5,179,362 A | 1/1993 | Okochi et al. |
| 5,181,859 A | 1/1993 | Foreman et al. |
| 5,184,210 A | 2/1993 | Westbrook |
| 5,186,647 A | 2/1993 | Denkmann et al. |
| 5,187,455 A | 2/1993 | Mandai et al. |
| 5,206,786 A | 4/1993 | Lee |
| 5,208,502 A | 5/1993 | Yamashita et al. |
| 5,212,402 A | 5/1993 | Higgins, III |
| 5,216,278 A | 6/1993 | Lin et al. |
| 5,218,230 A | 6/1993 | Tamamura et al. |
| 5,219,812 A | 6/1993 | Doi et al. |
| 5,220,480 A | 6/1993 | Kershaw, Jr. et al. |
| 5,220,483 A | 6/1993 | Scott |
| 5,223,741 A | 6/1993 | Bechtel et al. |
| 5,225,709 A | 7/1993 | Nishiuma et al. |
| 5,227,951 A | 7/1993 | deNeuf et al. |
| 5,235,208 A | 8/1993 | Katoh |
| 5,236,376 A | 8/1993 | Cohen |
| 5,237,204 A | 8/1993 | Val |
| 5,243,308 A | 9/1993 | Shusterman et al. |
| 5,251,092 A | 10/1993 | Brady et al. |
| 5,257,950 A | 11/1993 | Lenker et al. |
| 5,261,153 A | 11/1993 | Lucas |
| 5,262,611 A | 11/1993 | Danysh et al. |
| 5,264,983 A | 11/1993 | Petrinec |
| 5,268,810 A | 12/1993 | DiMarco et al. |
| 5,272,590 A | 12/1993 | Hernandez |
| 5,278,524 A | 1/1994 | Mullen |
| 5,283,717 A | 2/1994 | Hundt |
| 5,290,191 A | 3/1994 | Foreman et al. |
| 5,294,751 A | 3/1994 | Kamada |
| 5,294,826 A | 3/1994 | Marcantonio et al. |
| 5,299,956 A | 4/1994 | Brownell et al. |
| 5,300,760 A | 4/1994 | Batliwalla et al. |
| 5,303,419 A | 4/1994 | Ittipiboon et al. |
| 5,309,024 A | 5/1994 | Hirano |
| 5,309,121 A | 5/1994 | Kobayashi et al. |
| 5,310,363 A | 5/1994 | Brownell et al. |
| 5,311,408 A | 5/1994 | Ferchau et al. |
| 5,313,176 A | 5/1994 | Upadhyay |
| 5,319,525 A | 6/1994 | Lightfoot |
| 5,321,373 A | 6/1994 | Shusterman et al. |
| 5,321,573 A | 6/1994 | Person et al. |
| 5,326,284 A | 7/1994 | Bohbot et al. |
| 5,331,505 A | 7/1994 | Wilheim |
| 5,333,095 A | 7/1994 | Stevenson et al. |
| 5,337,028 A | 8/1994 | White |
| 5,338,970 A | 8/1994 | Boyle et al. |
| 5,349,314 A | 9/1994 | Shimizu et al. |
| 5,353,189 A | 10/1994 | Tomlinson |
| 5,353,202 A | 10/1994 | Ansell et al. |
| 5,355,016 A | 10/1994 | Swirbel et al. |
| 5,357,568 A | 10/1994 | Pelegris |

(56) References Cited

U.S. PATENT DOCUMENTS

| | | |
|---|---|---|
| 5,362,249 A | 11/1994 | Carter |
| 5,362,254 A | 11/1994 | Siemon et al. |
| 5,365,203 A | 11/1994 | Nakamura et al. |
| 5,367,430 A | 11/1994 | DeVoe et al. |
| 5,369,379 A | 11/1994 | Fujiki |
| 5,369,390 A | 11/1994 | Lin et al. |
| 5,369,545 A | 11/1994 | Bhattacharyya et al. |
| 5,371,653 A | 12/1994 | Kametani et al. |
| 5,374,909 A | 12/1994 | Hirai et al. |
| 5,376,759 A | 12/1994 | Marx et al. |
| 5,378,407 A | 1/1995 | Chandler et al. |
| 5,382,928 A | 1/1995 | Davis et al. |
| 5,382,938 A | 1/1995 | Hansson et al. |
| 5,386,335 A | 1/1995 | Amano et al. |
| 5,386,627 A | 2/1995 | Booth et al. |
| 5,396,201 A | 3/1995 | Ishizaki et al. |
| 5,396,397 A | 3/1995 | McClanahan et al. |
| 5,399,898 A | 3/1995 | Rostoker |
| 5,401,952 A | 3/1995 | Sugawa |
| 5,402,318 A | 3/1995 | Otsuka et al. |
| 5,404,044 A | 4/1995 | Booth et al. |
| 5,405,466 A | 4/1995 | Naito et al. |
| 5,414,299 A | 5/1995 | Wang et al. |
| 5,414,393 A | 5/1995 | Rose et al. |
| 5,414,587 A | 5/1995 | Kiser et al. |
| 5,420,553 A | 5/1995 | Sakamoto et al. |
| 5,426,560 A | 6/1995 | Amaya et al. |
| 5,428,885 A | 7/1995 | Takaya et al. |
| 5,430,605 A | 7/1995 | deNeuf et al. |
| 5,432,484 A | 7/1995 | Klas et al. |
| 5,446,625 A | 8/1995 | Urbish et al. |
| 5,448,445 A | 9/1995 | Yamate et al. |
| 5,450,278 A | 9/1995 | Lee et al. |
| 5,451,919 A | 9/1995 | Chu et al. |
| RE35,064 E | 10/1995 | Hernandez |
| 5,455,734 A | 10/1995 | Foreman et al. |
| 5,457,340 A | 10/1995 | Templeton et al. |
| 5,461,351 A | 10/1995 | Shusterman |
| 5,463,232 A | 10/1995 | Yamashita et al. |
| 5,467,064 A | 11/1995 | Gu |
| 5,468,997 A | 11/1995 | Imai et al. |
| 5,471,027 A | 11/1995 | Call et al. |
| 5,471,035 A | 11/1995 | Holmes |
| 5,471,181 A | 11/1995 | Park |
| 5,473,813 A | 12/1995 | Chobot et al. |
| 5,474,458 A | 12/1995 | Vafi et al. |
| 5,475,262 A | 12/1995 | Wang et al. |
| 5,475,565 A | 12/1995 | Bhattacharyya et al. |
| 5,475,606 A | 12/1995 | Muyshondt et al. |
| 5,477,933 A | 12/1995 | Nguyen |
| 5,481,238 A | 1/1996 | Carsten et al. |
| 5,483,407 A | 1/1996 | Anastasio et al. |
| 5,483,413 A | 1/1996 | Babb |
| 5,488,540 A | 1/1996 | Hatta |
| 5,489,882 A | 2/1996 | Ueno |
| 5,491,299 A | 2/1996 | Naylor et al. |
| 5,491,301 A | 2/1996 | Akiba et al. |
| 5,493,259 A | 2/1996 | Blalock et al. |
| 5,493,260 A | 2/1996 | Park |
| 5,495,180 A | 2/1996 | Huang et al. |
| 5,499,445 A | 3/1996 | Boyle et al. |
| 5,500,629 A | 3/1996 | Meyer |
| 5,500,785 A | 3/1996 | Funada |
| 5,500,789 A | 3/1996 | Miller et al. |
| 5,506,755 A | 4/1996 | Miyagi et al. |
| 5,508,938 A | 4/1996 | Wheeler |
| 5,512,196 A | 4/1996 | Mantese et al. |
| 5,519,650 A | 5/1996 | Ichimura et al. |
| 5,528,083 A | 6/1996 | Malladi et al. |
| 5,530,288 A | 6/1996 | Stone |
| 5,531,003 A | 7/1996 | Seifried et al. |
| 5,534,837 A | 7/1996 | Brandt |
| 5,535,101 A | 7/1996 | Miles et al. |
| 5,536,978 A | 7/1996 | Cooper et al. |
| 5,541,482 A | 7/1996 | Siao |
| 5,544,002 A | 8/1996 | Iwaya et al. |
| 5,546,058 A | 8/1996 | Azuma et al. |
| 5,548,255 A | 8/1996 | Spielman |
| 5,555,150 A | 9/1996 | Newman, Jr. |
| 5,556,811 A | 9/1996 | Agatstein et al. |
| 5,557,142 A | 9/1996 | Gilmore et al. |
| 5,566,040 A | 10/1996 | Cosquer et al. |
| 5,568,348 A | 10/1996 | Foreman et al. |
| 5,570,278 A | 10/1996 | Cross |
| 5,574,630 A | 11/1996 | Kresge et al. |
| 5,583,359 A | 12/1996 | Ng et al. |
| 5,583,470 A | 12/1996 | Okubo |
| 5,583,738 A | 12/1996 | Kohno et al. |
| 5,583,739 A | 12/1996 | Vu et al. |
| 5,586,007 A | 12/1996 | Funada |
| 5,586,011 A | 12/1996 | Alexander |
| 5,587,333 A | 12/1996 | Johansson et al. |
| 5,587,920 A | 12/1996 | Muyshondt et al. |
| 5,590,016 A | 12/1996 | Fujishiro |
| 5,590,030 A | 12/1996 | Kametani et al. |
| 5,592,391 A | 1/1997 | Muyshondt et al. |
| 5,604,668 A | 2/1997 | Wohrstein et al. |
| 5,610,796 A | 3/1997 | Lavene |
| 5,612,657 A | 3/1997 | Kledzik |
| 5,614,111 A | 3/1997 | Lavene |
| 5,614,881 A | 3/1997 | Duggal et al. |
| 5,618,185 A | 4/1997 | Aekins |
| 5,619,079 A | 4/1997 | Wiggins et al. |
| 5,623,160 A | 4/1997 | Liberkowski |
| 5,624,592 A | 4/1997 | Paustian |
| 5,625,166 A | 4/1997 | Natarajan |
| 5,625,225 A | 4/1997 | Huang et al. |
| 5,633,479 A | 5/1997 | Hirano |
| 5,634,268 A | 6/1997 | Dalal et al. |
| 5,635,669 A | 6/1997 | Kubota et al. |
| 5,635,767 A | 6/1997 | Wenzel et al. |
| 5,635,775 A | 6/1997 | Colburn et al. |
| 5,640,048 A | 6/1997 | Selna |
| 5,641,988 A | 6/1997 | Huang et al. |
| 5,644,468 A | 7/1997 | Wink et al. |
| 5,645,746 A | 7/1997 | Walsh |
| 5,647,766 A | 7/1997 | Nguyen |
| 5,647,767 A | 7/1997 | Scheer et al. |
| 5,659,455 A | 8/1997 | Herbert |
| 5,668,511 A | 9/1997 | Furutani et al. |
| 5,672,911 A | 9/1997 | Patil et al. |
| 5,682,303 A | 10/1997 | Goad |
| 5,692,298 A | 12/1997 | Goetz et al. |
| 5,700,167 A | 12/1997 | Pharney et al. |
| 5,708,296 A | 1/1998 | Bhansali |
| 5,708,553 A | 1/1998 | Hung |
| 5,717,249 A | 2/1998 | Yoshikawa et al. |
| 5,719,440 A | 2/1998 | Moden |
| 5,719,450 A | 2/1998 | Vora |
| 5,719,477 A | 2/1998 | Tomihari |
| 5,719,750 A | 2/1998 | Iwane |
| 5,726,612 A | 3/1998 | Mandai et al. |
| 5,731,960 A | 3/1998 | Fung |
| 5,734,198 A | 3/1998 | Stave |
| 5,741,729 A | 4/1998 | Selna |
| 5,742,210 A | 4/1998 | Chaturvedi et al. |
| 5,742,470 A | 4/1998 | Raets |
| 5,745,333 A | 4/1998 | Frankeny et al. |
| 5,751,539 A | 5/1998 | Stevenson et al. |
| 5,756,380 A | 5/1998 | Berg et al. |
| 5,757,252 A | 5/1998 | Cho et al. |
| 5,761,049 A | 6/1998 | Yoshidome et al. |
| 5,764,489 A | 6/1998 | Leigh et al. |
| 5,767,446 A | 6/1998 | Ha et al. |
| 5,770,476 A | 6/1998 | Stone |
| 5,777,383 A | 7/1998 | Stager et al. |
| 5,786,238 A | 7/1998 | Pai et al. |
| 5,786,630 A | 7/1998 | Bhansali et al. |
| 5,789,999 A | 8/1998 | Barnett et al. |
| 5,790,368 A | 8/1998 | Naito et al. |
| 5,796,170 A | 8/1998 | Marcantonio |
| 5,796,568 A | 8/1998 | Baiatu |
| 5,796,595 A | 8/1998 | Cross |
| 5,797,770 A | 8/1998 | Davis et al. |

(56) References Cited

U.S. PATENT DOCUMENTS

| | | |
|---|---|---|
| 5,801,579 A | 9/1998 | Le et al. |
| 5,801,597 A | 9/1998 | Carter et al. |
| 5,808,873 A | 9/1998 | Celaya et al. |
| 5,812,380 A | 9/1998 | Frech et al. |
| 5,815,050 A | 9/1998 | Brooks et al. |
| 5,815,051 A | 9/1998 | Hamasaki et al. |
| 5,815,373 A | 9/1998 | Johnsen et al. |
| 5,817,130 A | 10/1998 | Cox et al. |
| 5,818,313 A | 10/1998 | Estes et al. |
| 5,822,174 A | 10/1998 | Yamate et al. |
| 5,825,084 A | 10/1998 | Lau et al. |
| 5,825,628 A | 10/1998 | Garbelli et al. |
| 5,827,382 A | 10/1998 | Ogawa et al. |
| 5,828,093 A | 10/1998 | Naito et al. |
| 5,828,272 A | 10/1998 | Romerein et al. |
| 5,828,555 A | 10/1998 | Itoh |
| 5,831,489 A | 11/1998 | Wire |
| 5,834,992 A | 11/1998 | Kato et al. |
| 5,835,338 A | 11/1998 | Suzuki et al. |
| 5,838,216 A | 11/1998 | White et al. |
| 5,838,551 A | 11/1998 | Chan |
| 5,847,936 A | 12/1998 | Forehand et al. |
| 5,854,534 A | 12/1998 | Beilin et al. |
| 5,864,089 A | 1/1999 | Rainal |
| 5,867,361 A | 2/1999 | Wolf et al. |
| 5,870,272 A | 2/1999 | Seifried et al. |
| 5,870,273 A | 2/1999 | Sogabe et al. |
| 5,872,695 A | 2/1999 | Fasano et al. |
| 5,875,099 A | 2/1999 | Maesaka et al. |
| 5,880,925 A | 3/1999 | DuPre et al. |
| 5,889,445 A | 3/1999 | Ritter et al. |
| 5,892,415 A | 4/1999 | Okamura |
| 5,894,252 A | 4/1999 | Oida |
| 5,895,990 A | 4/1999 | Lau |
| 5,898,403 A | 4/1999 | Saitoh et al. |
| 5,898,562 A | 4/1999 | Cain et al. |
| 5,898,576 A | 4/1999 | Lockwood et al. |
| 5,900,350 A | 5/1999 | Provost et al. |
| 5,905,627 A | 5/1999 | Brendel et al. |
| 5,907,265 A | 5/1999 | Sakuragawa et al. |
| 5,908,151 A | 6/1999 | Elias |
| 5,909,155 A | 6/1999 | Anderson et al. |
| 5,909,350 A | 6/1999 | Anthony |
| 5,910,755 A | 6/1999 | Mishiro et al. |
| 5,910,879 A | 6/1999 | Herbert |
| 5,912,809 A | 6/1999 | Steigerwald et al. |
| 5,917,388 A | 6/1999 | Tronche et al. |
| 5,923,523 A | 7/1999 | Herbert |
| 5,923,540 A | 7/1999 | Asada et al. |
| 5,925,925 A | 7/1999 | Dehaine et al. |
| 5,926,377 A | 7/1999 | Nakao et al. |
| 5,928,076 A | 7/1999 | Clements et al. |
| 5,929,729 A | 7/1999 | Swarup |
| 5,955,930 A | 9/1999 | Anderson et al. |
| 5,959,829 A | 9/1999 | Stevenson et al. |
| 5,959,846 A | 9/1999 | Noguchi et al. |
| 5,969,461 A | 10/1999 | Anderson et al. |
| 5,969,583 A | 10/1999 | Hutchison |
| 5,973,906 A | 10/1999 | Stevenson et al. |
| 5,973,928 A | 10/1999 | Blasi et al. |
| 5,977,845 A | 11/1999 | Kitahara |
| 5,978,231 A | 11/1999 | Tohya et al. |
| 5,980,718 A | 11/1999 | Van Konynenburg et al. |
| 5,982,018 A | 11/1999 | Wark et al. |
| 5,986,340 A | 11/1999 | Mostafazadeh et al. |
| 5,995,352 A | 11/1999 | Gumley |
| 5,995,591 A | 11/1999 | Halim |
| 5,999,067 A | 12/1999 | D'Ostilio |
| 5,999,398 A | 12/1999 | Makl et al. |
| 6,004,752 A | 12/1999 | Loewy et al. |
| 6,013,957 A | 1/2000 | Puzo et al. |
| 6,016,095 A | 1/2000 | Herbert |
| 6,018,448 A | 1/2000 | Anthony |
| 6,021,564 A | 2/2000 | Hanson |
| 6,023,210 A | 2/2000 | Tulintseff |
| 6,023,406 A | 2/2000 | Kinoshita et al. |
| 6,031,710 A | 2/2000 | Wolf et al. |
| 6,034,576 A | 3/2000 | Kuth |
| 6,034,864 A | 3/2000 | Naito et al. |
| 6,037,846 A | 3/2000 | Oberhammer |
| 6,038,121 A | 3/2000 | Naito et al. |
| 6,042,685 A | 3/2000 | Shinada et al. |
| 6,046,898 A | 4/2000 | Seymour et al. |
| 6,052,038 A | 4/2000 | Savicki |
| 6,052,272 A | 4/2000 | Kuroda et al. |
| 6,054,754 A | 4/2000 | Bissey |
| 6,054,758 A | 4/2000 | Lamson |
| 6,061,227 A | 5/2000 | Nogi |
| 6,061,228 A | 5/2000 | Palmer et al. |
| 6,064,286 A | 5/2000 | Ziegner et al. |
| 6,069,786 A | 5/2000 | Horie et al. |
| 6,072,687 A | 6/2000 | Naito et al. |
| 6,072,690 A | 6/2000 | Farooq et al. |
| 6,075,211 A | 6/2000 | Tohya et al. |
| 6,075,285 A | 6/2000 | Taylor et al. |
| 6,078,117 A | 6/2000 | Perrin et al. |
| 6,078,229 A | 6/2000 | Funada et al. |
| 6,084,779 A | 7/2000 | Fang |
| 6,088,235 A | 7/2000 | Chiao et al. |
| 6,091,310 A | 7/2000 | Utsumi et al. |
| 6,092,269 A | 7/2000 | Yializis et al. |
| 6,094,112 A | 7/2000 | Goldberger et al. |
| 6,094,339 A | 7/2000 | Evans |
| 6,097,260 A | 8/2000 | Whybrew et al. |
| 6,097,581 A | 8/2000 | Anthony |
| 6,104,258 A | 8/2000 | Novak |
| 6,104,599 A | 8/2000 | Ahiko et al. |
| 6,108,448 A | 8/2000 | Song et al. |
| 6,111,479 A | 8/2000 | Myohga et al. |
| 6,120,326 A | 9/2000 | Brooks |
| 6,121,761 A | 9/2000 | Herbert |
| 6,125,044 A | 9/2000 | Cherniski et al. |
| 6,130,585 A | 10/2000 | Whybrew et al. |
| 6,133,805 A | 10/2000 | Jain et al. |
| 6,137,161 A | 10/2000 | Gilliland et al. |
| 6,137,392 A | 10/2000 | Herbert |
| 6,142,831 A | 11/2000 | Ashman et al. |
| 6,144,547 A | 11/2000 | Retseptor |
| 6,147,587 A | 11/2000 | Hadano et al. |
| 6,150,895 A | 11/2000 | Steigerwald et al. |
| 6,157,528 A | 12/2000 | Anthony |
| 6,157,547 A | 12/2000 | Brown et al. |
| 6,160,705 A | 12/2000 | Stearns et al. |
| 6,163,454 A | 12/2000 | Strickler |
| 6,163,456 A | 12/2000 | Suzuki et al. |
| 6,165,814 A | 12/2000 | Wark et al. |
| 6,175,287 B1 | 1/2001 | Lampen et al. |
| 6,180,588 B1 | 1/2001 | Walters |
| 6,181,004 B1 | 1/2001 | Koontz et al. |
| 6,181,231 B1 | 1/2001 | Bartilson |
| 6,183,685 B1 | 2/2001 | Cowman et al. |
| 6,184,477 B1 | 2/2001 | Tanahashi |
| 6,184,769 B1 | 2/2001 | Nakamura et al. |
| 6,185,091 B1 | 2/2001 | Tanahashi et al. |
| 6,188,565 B1 | 2/2001 | Naito et al. |
| 6,191,472 B1 | 2/2001 | Mazumder |
| 6,191,475 B1 | 2/2001 | Skinner et al. |
| 6,191,479 B1 | 2/2001 | Herrell et al. |
| 6,191,669 B1 | 2/2001 | Shigemura |
| 6,191,932 B1 | 2/2001 | Kuroda et al. |
| 6,191,933 B1 | 2/2001 | Ishigaki et al. |
| 6,195,269 B1 | 2/2001 | Hino |
| 6,198,123 B1 | 3/2001 | Linder et al. |
| 6,198,362 B1 | 3/2001 | Harada et al. |
| 6,200,400 B1 | 3/2001 | Farooq et al. |
| 6,204,448 B1 | 3/2001 | Garland et al. |
| 6,205,014 B1 | 3/2001 | Inomata et al. |
| 6,207,081 B1 | 3/2001 | Sasaki et al. |
| 6,208,063 B1 | 3/2001 | Horikawa |
| 6,208,225 B1 | 3/2001 | Miller |
| 6,208,226 B1 | 3/2001 | Chen et al. |
| 6,208,494 B1 | 3/2001 | Nakura et al. |
| 6,208,495 B1 | 3/2001 | Wieloch et al. |
| 6,208,501 B1 | 3/2001 | Ingalls et al. |

(56) References Cited

U.S. PATENT DOCUMENTS

| | | |
|---|---|---|
| 6,208,502 B1 | 3/2001 | Hudis et al. |
| 6,208,503 B1 | 3/2001 | Shimada et al. |
| 6,208,521 B1 | 3/2001 | Nakatsuka |
| 6,208,525 B1 | 3/2001 | Imasu et al. |
| 6,211,754 B1 | 4/2001 | Nishida et al. |
| 6,212,060 B1 | 4/2001 | Liu |
| 6,212,078 B1 | 4/2001 | Hunt et al. |
| 6,215,373 B1 | 4/2001 | Novak et al. |
| 6,215,647 B1 | 4/2001 | Naito et al. |
| 6,215,649 B1 | 4/2001 | Appelt et al. |
| 6,218,631 B1 | 4/2001 | Hetzel et al. |
| 6,219,240 B1 | 4/2001 | Sasov |
| 6,222,427 B1 | 4/2001 | Kato et al. |
| 6,222,431 B1 | 4/2001 | Ishizaki et al. |
| 6,225,876 B1 | 5/2001 | Akino et al. |
| 6,226,169 B1 | 5/2001 | Naito et al. |
| 6,226,182 B1 | 5/2001 | Maehara |
| 6,229,226 B1 | 5/2001 | Kramer et al. |
| 6,236,572 B1 | 5/2001 | Teshome et al. |
| 6,240,621 B1 | 6/2001 | Nellissen et al. |
| 6,243,253 B1 | 6/2001 | DuPre et al. |
| 6,249,047 B1 | 6/2001 | Corisis |
| 6,249,439 B1 | 6/2001 | DeMore et al. |
| 6,252,161 B1 | 6/2001 | Hailey et al. |
| 6,252,761 B1 | 6/2001 | Branchevsky |
| 6,262,895 B1 | 7/2001 | Forthun |
| 6,266,228 B1 | 7/2001 | Naito et al. |
| 6,266,229 B1 | 7/2001 | Naito et al. |
| 6,272,003 B1 | 8/2001 | Schaper |
| 6,281,704 B2 | 8/2001 | Ngai et al. |
| 6,282,074 B1 | 8/2001 | Anthony |
| 6,282,079 B1 | 8/2001 | Nagakari et al. |
| 6,285,109 B1 | 9/2001 | Katagiri et al. |
| 6,285,542 B1 | 9/2001 | Kennedy, III et al. |
| 6,288,344 B1 | 9/2001 | Youker et al. |
| 6,288,906 B1 | 9/2001 | Sprietsma et al. |
| 6,292,350 B1 | 9/2001 | Naito et al. |
| 6,292,351 B1 | 9/2001 | Ahiko et al. |
| 6,300,846 B1 | 10/2001 | Brunker |
| 6,307,450 B2 | 10/2001 | Takahashi et al. |
| 6,309,245 B1 | 10/2001 | Sweeney |
| 6,310,286 B1 | 10/2001 | Troxel et al. |
| 6,310,759 B2 | 10/2001 | Ishigaki et al. |
| 6,313,584 B1 | 11/2001 | Johnson et al. |
| 6,320,547 B1 | 11/2001 | Fathy et al. |
| 6,323,116 B1 | 11/2001 | Lamson |
| 6,324,047 B1 | 11/2001 | Hayworth |
| 6,324,048 B1 | 11/2001 | Liu |
| 6,325,672 B1 | 12/2001 | Belopolsky et al. |
| 6,327,134 B1 | 12/2001 | Kuroda et al. |
| 6,327,137 B1 | 12/2001 | Yamamoto et al. |
| 6,331,808 B2 | 12/2001 | Mikami et al. |
| 6,331,926 B1 | 12/2001 | Anthony |
| 6,331,930 B1 | 12/2001 | Kuroda |
| 6,342,681 B1 | 1/2002 | Goldberger et al. |
| 6,344,961 B1 | 2/2002 | Naito et al. |
| 6,346,743 B1 | 2/2002 | Figueroa et al. |
| 6,351,120 B2 | 2/2002 | Goldfine |
| 6,351,194 B2 | 2/2002 | Takahashi et al. |
| 6,351,369 B1 | 2/2002 | Kuroda et al. |
| 6,352,914 B2 | 3/2002 | Ball et al. |
| 6,353,375 B2 | 3/2002 | Kurata |
| 6,353,540 B1 | 3/2002 | Akiba et al. |
| 6,365,828 B1 | 4/2002 | Kinoshita et al. |
| 6,367,133 B2 | 4/2002 | Ikada et al. |
| 6,370,010 B1 | 4/2002 | Kuroda et al. |
| 6,370,011 B1 | 4/2002 | Naito et al. |
| 6,370,937 B2 | 4/2002 | Hsu |
| 6,373,349 B2 | 4/2002 | Gilbert |
| 6,373,673 B1 | 4/2002 | Anthony |
| 6,373,711 B2 | 4/2002 | Yamauchi et al. |
| 6,377,439 B1 | 4/2002 | Sekidou et al. |
| 6,381,153 B1 | 4/2002 | Brussels |
| 6,388,207 B1 | 5/2002 | Figueroa et al. |
| 6,388,856 B1 | 5/2002 | Anthony |
| 6,388,865 B1 | 5/2002 | Honda et al. |
| 6,392,502 B2 | 5/2002 | Sweeney et al. |
| 6,392,868 B2 | 5/2002 | Ohya et al. |
| 6,395,996 B1 | 5/2002 | Tsai et al. |
| 6,396,088 B2 | 5/2002 | Kitsukawa et al. |
| 6,407,906 B1 | 6/2002 | Ahiko et al. |
| 6,414,572 B2 | 7/2002 | Satoh et al. |
| 6,420,941 B2 | 7/2002 | Okada et al. |
| 6,430,025 B2 | 8/2002 | Naito et al. |
| 6,430,030 B1 | 8/2002 | Farooq et al. |
| 6,437,240 B2 | 8/2002 | Smith |
| 6,437,409 B2 | 8/2002 | Fujii |
| 6,448,873 B1 | 9/2002 | Mostov |
| 6,449,828 B2 | 9/2002 | Pahl et al. |
| 6,456,481 B1 | 9/2002 | Stevenson |
| 6,462,628 B2 | 10/2002 | Kondo et al. |
| 6,462,932 B1 | 10/2002 | Naito et al. |
| 6,466,107 B2 | 10/2002 | Yamamoto |
| 6,469,595 B2 | 10/2002 | Anthony et al. |
| 6,473,292 B1 | 10/2002 | Yoshida et al. |
| 6,475,854 B2 | 11/2002 | Narwankar et al. |
| 6,477,034 B1 | 11/2002 | Chakravorty et al. |
| 6,480,425 B2 | 11/2002 | Yanagisawa et al. |
| 6,483,394 B2 | 11/2002 | Kim |
| 6,493,202 B2 | 12/2002 | Kappel et al. |
| 6,496,354 B2 | 12/2002 | Naito et al. |
| 6,498,710 B1 | 12/2002 | Anthony |
| 6,501,344 B2 | 12/2002 | Ikata et al. |
| 6,504,451 B1 | 1/2003 | Yamaguchi |
| 6,507,200 B2 | 1/2003 | Brandelik et al. |
| 6,509,640 B1 | 1/2003 | Li et al. |
| 6,509,807 B1 | 1/2003 | Anthony et al. |
| 6,510,038 B1 | 1/2003 | Satou et al. |
| 6,522,182 B2 | 2/2003 | Tomita et al. |
| 6,522,516 B2 | 2/2003 | Anthony |
| 6,525,628 B1 | 2/2003 | Ritter et al. |
| 6,525,635 B2 | 2/2003 | Murata et al. |
| 6,532,143 B2 | 3/2003 | Figueroa et al. |
| 6,534,787 B2 | 3/2003 | Hsu |
| 6,538,527 B2 | 3/2003 | Hidaka et al. |
| 6,549,389 B2 | 4/2003 | Anthony et al. |
| 6,549,395 B1 | 4/2003 | Naito et al. |
| 6,559,484 B1 | 5/2003 | Li et al. |
| 6,563,688 B2 | 5/2003 | Anthony et al. |
| 6,567,257 B2 | 5/2003 | Brown |
| 6,573,805 B2 | 6/2003 | Hidaka et al. |
| 6,577,493 B2 | 6/2003 | Honda et al. |
| 6,580,595 B2 | 6/2003 | Anthony et al. |
| 6,587,016 B2 | 7/2003 | Kadota |
| 6,587,327 B1 | 7/2003 | Devoe et al. |
| 6,594,128 B2 | 7/2003 | Anthony |
| 6,594,136 B2 | 7/2003 | Kuroda et al. |
| 6,603,372 B1 | 8/2003 | Ishizaki et al. |
| 6,603,646 B2 | 8/2003 | Anthony et al. |
| 6,606,011 B2 | 8/2003 | Anthony et al. |
| 6,606,237 B1 | 8/2003 | Naito et al. |
| 6,608,538 B2 | 8/2003 | Wang |
| 6,611,419 B1 | 8/2003 | Chakravorty |
| 6,618,268 B2 | 9/2003 | Dibene, II et al. |
| 6,618,943 B2 | 9/2003 | Ashe et al. |
| 6,624,692 B2 | 9/2003 | Suzuki et al. |
| 6,633,528 B2 | 10/2003 | Watanabe |
| 6,636,406 B1 | 10/2003 | Anthony |
| 6,638,686 B2 | 10/2003 | Sawada et al. |
| 6,643,903 B2 | 11/2003 | Stevenson et al. |
| 6,650,203 B2 | 11/2003 | Gerstenberg et al. |
| 6,650,525 B2 | 11/2003 | Anthony |
| 6,665,053 B2 | 12/2003 | Korenaga |
| 6,674,343 B2 | 1/2004 | Gould et al. |
| 6,687,108 B1 | 2/2004 | Anthony et al. |
| 6,696,952 B2 | 2/2004 | Zirbes |
| 6,700,181 B2 | 3/2004 | Coccioli |
| 6,704,190 B2 | 3/2004 | Honda et al. |
| 6,707,685 B2 | 3/2004 | Kabumoto et al. |
| 6,710,263 B2 | 3/2004 | Kobayashi et al. |
| 6,710,997 B2 | 3/2004 | Honda et al. |
| 6,717,301 B2 | 4/2004 | DeDaran et al. |
| 6,738,249 B1 | 5/2004 | Anthony et al. |
| 6,750,739 B2 | 6/2004 | Enokihara et al. |

(56) References Cited

U.S. PATENT DOCUMENTS

| | | |
|---|---|---|
| 6,767,787 B2 | 7/2004 | Koh et al. |
| 6,768,630 B2 | 7/2004 | Togashi |
| 6,794,961 B2 | 9/2004 | Nagaishi et al. |
| 6,801,422 B2 | 10/2004 | Mosley |
| 6,806,806 B2 | 10/2004 | Anthony |
| 6,812,411 B2 | 11/2004 | Belau et al. |
| 6,823,730 B2 | 11/2004 | Buck et al. |
| 6,828,666 B1 | 12/2004 | Herrell et al. |
| 6,849,945 B2 | 2/2005 | Horiuchi et al. |
| 6,873,513 B2 | 3/2005 | Anthony |
| 6,879,481 B2 | 4/2005 | Honda et al. |
| 6,894,884 B2 | 5/2005 | Anthony, Jr. et al. |
| 6,909,593 B2 | 6/2005 | Kuroda et al. |
| 6,942,469 B2 | 9/2005 | Seale et al. |
| 6,950,293 B2 | 9/2005 | Anthony |
| 6,954,346 B2 | 10/2005 | Anthony |
| 6,956,174 B2 | 10/2005 | Khandros et al. |
| 6,980,414 B1 | 12/2005 | Sutardja |
| 6,995,983 B1 | 2/2006 | Anthony et al. |
| 7,042,303 B2 | 5/2006 | Anthony et al. |
| 7,042,703 B2 | 5/2006 | Anthony et al. |
| 7,050,284 B2 | 5/2006 | Anthony |
| 7,106,570 B2 | 9/2006 | Anthony, Jr. et al. |
| 7,109,569 B2 | 9/2006 | Breisch et al. |
| 7,110,227 B2 | 9/2006 | Anthony et al. |
| 7,110,235 B2 | 9/2006 | Anthony, Jr. et al. |
| 7,113,383 B2 | 9/2006 | Anthony et al. |
| 7,141,899 B2 | 11/2006 | Anthony et al. |
| 7,180,718 B2 | 2/2007 | Anthony et al. |
| 7,193,831 B2 | 3/2007 | Anthony |
| 7,224,564 B2 | 5/2007 | Anthony |
| 7,262,949 B2 | 8/2007 | Anthony |
| 7,274,549 B2 | 9/2007 | Anthony |
| 7,301,748 B2 | 11/2007 | Anthony et al. |
| 7,321,485 B2 | 1/2008 | Anthony et al. |
| 7,336,467 B2 | 2/2008 | Anthony et al. |
| 7,336,468 B2 | 2/2008 | Anthony et al. |
| 7,423,860 B2 | 9/2008 | Anthony et al. |
| 7,428,134 B2 | 9/2008 | Anthony |
| 7,433,168 B2 | 10/2008 | Anthony |
| 7,440,252 B2 | 10/2008 | Anthony |
| 7,443,647 B2 | 10/2008 | Anthony |
| 7,586,728 B2 | 9/2009 | Anthony |
| 7,593,208 B2 | 9/2009 | Anthony et al. |
| 7,609,500 B2 | 10/2009 | Anthony et al. |
| 7,609,501 B2 | 10/2009 | Anthony et al. |
| 7,630,188 B2 | 12/2009 | Anthony |
| 7,675,729 B2 | 3/2010 | Anthony et al. |
| 7,688,565 B2 | 3/2010 | Anthony et al. |
| 7,733,621 B2 | 6/2010 | Anthony et al. |
| 7,768,763 B2 | 8/2010 | Anthony et al. |
| 7,782,587 B2 | 8/2010 | Anthony et al. |
| 7,817,397 B2 | 10/2010 | Anthony |
| 7,894,176 B1 | 2/2011 | Anthony |
| 7,916,444 B2 * | 3/2011 | Anthony et al. ............ 361/118 |
| 7,920,367 B2 | 4/2011 | Anthony et al. |
| 7,974,062 B2 | 7/2011 | Anthony et al. |
| 8,004,812 B2 | 8/2011 | Anthony et al. |
| 8,014,119 B2 | 9/2011 | Anthony |
| 8,018,706 B2 * | 9/2011 | Anthony et al. ............ 361/118 |
| 8,023,241 B2 | 9/2011 | Anthony et al. |
| 8,026,777 B2 | 9/2011 | Anthony |
| 2001/0001989 A1 | 5/2001 | Smith |
| 2001/0002105 A1 | 5/2001 | Brandelik et al. |
| 2001/0002624 A1 | 6/2001 | Khandros et al. |
| 2001/0008288 A1 | 7/2001 | Kimura et al. |
| 2001/0008302 A1 | 7/2001 | Murakami et al. |
| 2001/0008478 A1 | 7/2001 | McIntosh et al. |
| 2001/0008509 A1 | 7/2001 | Watanabe |
| 2001/0009496 A1 | 7/2001 | Kappel et al. |
| 2001/0010444 A1 | 8/2001 | Pahl et al. |
| 2001/0011763 A1 | 8/2001 | Ushijima et al. |
| 2001/0011934 A1 | 8/2001 | Yamamoto |
| 2001/0011937 A1 | 8/2001 | Satoh et al. |
| 2001/0013626 A1 | 8/2001 | Fujii |
| 2001/0015643 A1 | 8/2001 | Goldfine et al. |
| 2001/0015683 A1 | 8/2001 | Mikami et al. |
| 2001/0017576 A1 | 8/2001 | Kondo et al. |
| 2001/0017579 A1 | 8/2001 | Kurata |
| 2001/0019869 A1 | 9/2001 | Hsu |
| 2001/0020879 A1 | 9/2001 | Takahashi et al. |
| 2001/0021097 A1 | 9/2001 | Ohya et al. |
| 2001/0022547 A1 | 9/2001 | Murata et al. |
| 2001/0023983 A1 | 9/2001 | Kobayashi et al. |
| 2001/0024148 A1 | 9/2001 | Gerstenberg et al. |
| 2001/0028581 A1 | 10/2001 | Yanagisawa et al. |
| 2001/0029648 A1 | 10/2001 | Ikada et al. |
| 2001/0031191 A1 | 10/2001 | Korenaga |
| 2001/0033664 A1 | 10/2001 | Poux et al. |
| 2001/0035801 A1 | 11/2001 | Gilbert |
| 2001/0035802 A1 | 11/2001 | Kadota |
| 2001/0035805 A1 | 11/2001 | Suzuki et al. |
| 2001/0037680 A1 | 11/2001 | Buck et al. |
| 2001/0039834 A1 | 11/2001 | Hsu |
| 2001/0040484 A1 | 11/2001 | Kim |
| 2001/0040487 A1 | 11/2001 | Ikata et al. |
| 2001/0040488 A1 | 11/2001 | Gould et al. |
| 2001/0041305 A1 | 11/2001 | Sawada et al. |
| 2001/0043100 A1 | 11/2001 | Tomita et al. |
| 2001/0043129 A1 | 11/2001 | Hidaka et al. |
| 2001/0043450 A1 | 11/2001 | Seale et al. |
| 2001/0043453 A1 | 11/2001 | Narwankar et al. |
| 2001/0045810 A1 | 11/2001 | Poon et al. |
| 2001/0048581 A1 | 12/2001 | Anthony et al. |
| 2001/0048593 A1 | 12/2001 | Yamauchi et al. |
| 2001/0048906 A1 | 12/2001 | Lau et al. |
| 2001/0050550 A1 | 12/2001 | Yoshida et al. |
| 2001/0050600 A1 | 12/2001 | Anthony et al. |
| 2001/0050837 A1 | 12/2001 | Stevenson et al. |
| 2001/0052833 A1 | 12/2001 | Enokihara et al. |
| 2001/0054512 A1 | 12/2001 | Belau et al. |
| 2001/0054734 A1 | 12/2001 | Koh et al. |
| 2001/0054756 A1 | 12/2001 | Horiuchi et al. |
| 2001/0054936 A1 | 12/2001 | Okada et al. |
| 2002/0000521 A1 | 1/2002 | Brown |
| 2002/0000583 A1 | 1/2002 | Kitsukawa et al. |
| 2002/0000821 A1 | 1/2002 | Haga et al. |
| 2002/0000893 A1 | 1/2002 | Hidaka et al. |
| 2002/0000895 A1 | 1/2002 | Takahashi et al. |
| 2002/0003454 A1 | 1/2002 | Sweeney et al. |
| 2002/0005880 A1 | 1/2002 | Ashe et al. |
| 2002/0024787 A1 | 2/2002 | Anthony |
| 2002/0027263 A1 | 3/2002 | Anthony et al. |
| 2002/0027760 A1 | 3/2002 | Anthony |
| 2002/0044401 A1 | 4/2002 | Anthony et al. |
| 2002/0075096 A1 | 6/2002 | Anthony |
| 2002/0079116 A1 | 6/2002 | Anthony |
| 2002/0089812 A1 | 7/2002 | Anthony et al. |
| 2002/0113663 A1 | 8/2002 | Anthony et al. |
| 2002/0122286 A1 | 9/2002 | Anthony |
| 2002/0131231 A1 | 9/2002 | Anthony |
| 2002/0149900 A1 | 10/2002 | Anthony |
| 2002/0158515 A1 | 10/2002 | Anthony, Jr. et al. |
| 2002/0186100 A1 | 12/2002 | Anthony et al. |
| 2003/0029632 A1 | 2/2003 | Anthony, Jr. et al. |
| 2003/0029635 A1 | 2/2003 | Anthony, Jr. et al. |
| 2003/0048029 A1 | 3/2003 | DeDaran et al. |
| 2003/0067730 A1 | 4/2003 | Anthony et al. |
| 2003/0161086 A1 | 8/2003 | Anthony |
| 2003/0202312 A1 | 10/2003 | Anthony et al. |
| 2003/0206388 A9 | 11/2003 | Anthony et al. |
| 2003/0210125 A1 | 11/2003 | Anthony |
| 2003/0231451 A1 | 12/2003 | Anthony |
| 2003/0231456 A1 | 12/2003 | Anthony et al. |
| 2004/0004802 A1 | 1/2004 | Anthony et al. |
| 2004/0008466 A1 | 1/2004 | Anthony et al. |
| 2004/0027771 A1 | 2/2004 | Anthony |
| 2004/0032304 A1 | 2/2004 | Anthony et al. |
| 2004/0054426 A1 | 3/2004 | Anthony |
| 2004/0085699 A1 | 5/2004 | Anthony |
| 2004/0105205 A1 | 6/2004 | Anthony et al. |
| 2004/0124949 A1 | 7/2004 | Anthony et al. |
| 2004/0130840 A1 | 7/2004 | Anthony |
| 2004/0218332 A1 | 11/2004 | Anthony et al. |

(56) References Cited

U.S. PATENT DOCUMENTS

| | | |
|---|---|---|
| 2004/0226733 A1 | 11/2004 | Anthony et al. |
| 2005/0016761 A9 | 1/2005 | Anthony, Jr. et al. |
| 2005/0018374 A1 | 1/2005 | Anthony |
| 2005/0063127 A1 | 3/2005 | Anthony |
| 2005/0248900 A1 | 11/2005 | Anthony |
| 2005/0286198 A1 | 12/2005 | Anthony et al. |
| 2006/0023385 A9 | 2/2006 | Anthony et al. |
| 2006/0139836 A1 | 6/2006 | Anthony |
| 2006/0139837 A1 | 6/2006 | Anthony et al. |
| 2006/0193051 A1 | 8/2006 | Anthony et al. |
| 2006/0202414 A1 | 9/2006 | Chen |
| 2006/0203414 A1 | 9/2006 | Anthony |
| 2007/0019352 A1 | 1/2007 | Anthony |
| 2007/0047177 A1 | 3/2007 | Anthony |
| 2007/0057359 A1 | 3/2007 | Anthony et al. |
| 2007/0103839 A1 | 5/2007 | Anthony et al. |
| 2007/0109709 A1 | 5/2007 | Anthony et al. |
| 2008/0160681 A1 | 7/2008 | Anthony et al. |
| 2009/0321127 A1 | 12/2009 | Anthony et al. |
| 2010/0078199 A1 | 4/2010 | Anthony et al. |
| 2010/0180438 A1 | 7/2010 | Anthony et al. |
| 2010/0294555 A1 | 11/2010 | Anthony et al. |
| 2010/0307810 A1 | 12/2010 | Anthony et al. |
| 2010/0319978 A1 | 12/2010 | Anthony et al. |
| 2011/0032657 A1 | 2/2011 | Anthony |
| 2011/0141653 A1 | 6/2011 | Anthony |
| 2011/0174523 A1 | 7/2011 | Anthony et al. |
| 2011/0192642 A1 | 8/2011 | Anthony et al. |
| 2012/0000045 A1 | 1/2012 | Anthony et al. |
| 2012/0023741 A1 | 2/2012 | Anthony et al. |
| 2012/0023742 A1 | 2/2012 | Anthony et al. |
| 2012/0034774 A1 | 2/2012 | Anthony et al. |

FOREIGN PATENT DOCUMENTS

| | | |
|---|---|---|
| DE | 197 28 692 A1 | 1/1999 |
| DE | 198 57 043 C1 | 3/2000 |
| EP | 295948 | 12/1988 |
| EP | 563873 | 10/1993 |
| EP | 279769 | 9/1994 |
| EP | 0623363 | 11/1994 |
| EP | 98915364 | 11/1994 |
| EP | 763867 | 3/1997 |
| EP | 0776016 | 5/1997 |
| EP | 872888 | 10/1998 |
| EP | 0933871 | 8/1999 |
| EP | 1022751 | 7/2000 |
| EP | 1024507 | 8/2000 |
| EP | 1061535 | 12/2000 |
| EP | 1128434 | 8/2001 |
| EP | 735606 | 1/2002 |
| EP | 1873872 | 12/2008 |
| FR | 2496970 | 6/1982 |
| FR | 2606207 | 5/1988 |
| FR | 2765417 | 12/1998 |
| FR | 2808135 | 10/2001 |
| GB | 2217136 | 4/1988 |
| GB | 2310967 | 3/2000 |
| GB | 2341980 | 3/2000 |
| JP | 57-172130 | 10/1982 |
| JP | 63-269509 | 11/1988 |
| JP | 1-27251 | 1/1989 |
| JP | 01-120805 | 5/1989 |
| JP | 01-212415 | 8/1989 |
| JP | 02-267879 | 11/1990 |
| JP | 03-018112 | 1/1991 |
| JP | 03-071614 | 3/1991 |
| JP | 05-205966 | 8/1993 |
| JP | 5-283284 | 10/1993 |
| JP | 05-299292 | 11/1993 |
| JP | 06-020870 | 1/1994 |
| JP | 06-053048 | 2/1994 |
| JP | 06-053049 | 2/1994 |
| JP | 06-053075 | 2/1994 |
| JP | 06-053077 | 2/1994 |
| JP | 06-053078 | 2/1994 |
| JP | 06-084695 | 3/1994 |
| JP | 06-120704 | 4/1994 |
| JP | 06-151014 | 5/1994 |
| JP | 06-151244 | 5/1994 |
| JP | 06-151245 | 5/1994 |
| JP | 06-231995 | 8/1994 |
| JP | 06-251981 | 9/1994 |
| JP | 06-275463 | 9/1994 |
| JP | 6-302471 | 10/1994 |
| JP | 06-325977 | 11/1994 |
| JP | 11-214244 | 11/1994 |
| JP | 06-267790 | 12/1994 |
| JP | 07-022757 | 1/1995 |
| JP | 07-122757 | 5/1995 |
| JP | 07 161568 | 6/1995 |
| JP | 07 1615568 | 6/1995 |
| JP | 07-201651 | 8/1995 |
| JP | 07-202477 | 8/1995 |
| JP | 07-235406 | 9/1995 |
| JP | 07-235852 | 9/1995 |
| JP | 07-235862 | 9/1995 |
| JP | 07-240651 | 9/1995 |
| JP | 07-263871 | 10/1995 |
| JP | 07-263280 | 11/1995 |
| JP | 08-97328 | 1/1996 |
| JP | 08-124795 | 5/1996 |
| JP | 08-163122 | 6/1996 |
| JP | 08-172025 | 7/1996 |
| JP | 08-181035 | 7/1996 |
| JP | 8172025 | 7/1996 |
| JP | 08-273973 | 10/1996 |
| JP | 09-232185 | 9/1997 |
| JP | 9-266130 | 10/1997 |
| JP | 09-275145 | 10/1997 |
| JP | 09-284076 | 10/1997 |
| JP | 09-284077 | 10/1997 |
| JP | 09-284078 | 10/1997 |
| JP | 09-293987 | 11/1997 |
| JP | 9-294041 | 11/1997 |
| JP | 10-12490 | 1/1998 |
| JP | 10-41637 | 2/1998 |
| JP | 10-41677 | 2/1998 |
| JP | 10-223470 | 8/1998 |
| JP | 11-21456 | 4/1999 |
| JP | 11-97291 | 4/1999 |
| JP | 11-102839 | 4/1999 |
| JP | 11-21456 | 8/1999 |
| JP | 11-214256 | 8/1999 |
| JP | 11-223396 | 8/1999 |
| JP | 11-219824 | 10/1999 |
| JP | 11-294908 | 10/1999 |
| JP | 11-305302 | 11/1999 |
| JP | 11-319222 | 11/1999 |
| JP | 11-345273 | 12/1999 |
| JP | 2000-188218 | 4/2000 |
| JP | 00-188218 | 7/2000 |
| JP | 2000-243646 | 8/2000 |
| JP | 00-261235 | 9/2000 |
| JP | 00-299249 | 10/2000 |
| JP | 2000-286665 | 10/2000 |
| WO | WO9007785 | 7/1990 |
| WO | WO 91/15046 | 10/1991 |
| WO | WO9622008 | 7/1996 |
| WO | WO9641376 | 12/1996 |
| WO | wo 97/20332 | 6/1997 |
| WO | WO 97/43786 | 11/1997 |
| WO | WO 98/45921 | 10/1998 |
| WO | WO 99/04457 | 1/1999 |
| WO | WO 99/19982 | 4/1999 |
| WO | WO 99/37008 | 7/1999 |
| WO | WO 99/52210 | 10/1999 |
| WO | WO 00/16446 | 3/2000 |
| WO | WO 00/65740 | 11/2000 |
| WO | WO 00/74197 | 12/2000 |
| WO | WO 00/77907 | 12/2000 |
| WO | 01/06631 | 1/2001 |
| WO | WO 01/10000 | 2/2001 |

(56) References Cited

FOREIGN PATENT DOCUMENTS

| WO | WO 01/41232 | 6/2001 |
|---|---|---|
| WO | WO 01/41233 | 6/2001 |
| WO | WO 01/45119 | 6/2001 |
| WO | WO 01/71908 | 9/2001 |
| WO | WO 01/75916 | 10/2001 |
| WO | WO 01/84581 | 11/2001 |
| WO | WO 01/86774 | 11/2001 |
| WO | WO 02/59401 | 1/2002 |
| WO | WO 02/11160 | 2/2002 |
| WO | WO 02/15360 | 2/2002 |
| WO | WO 02/27794 | 4/2002 |
| WO | WO 02/33798 | 4/2002 |
| WO | WO 02/45233 | 6/2002 |
| WO | WO 02/006566 | 8/2002 |
| WO | WO 02/080330 | 10/2002 |
| WO | WO 03/005541 | 1/2003 |
| WO | WO 2004/070905 | 8/2004 |
| WO | WO 2005/002018 | 1/2005 |
| WO | WO 2005/015719 | 2/2005 |
| WO | WO 2005/065097 | 7/2005 |
| WO | WO 2006/093830 | 9/2006 |
| WO | WO 2006/093831 | 9/2006 |
| WO | WO 2006/099297 | 9/2006 |
| WO | WO 2006/104613 | 10/2006 |
| WO | WO 2007/103965 | 9/2007 |

OTHER PUBLICATIONS

Jan. 2, 2003, PCT International Search Report for PCT/US01/44681.
Greb, "An Intuitive Approach to EM Fields," EMC Test & Design, Jan. 1, 1994, pp. 30-33.
Greb, "An Intuitive to EM Coupling," EMC Test & Design, Dec. 1, 1993, pp. 20-25.
Sakamoto, "Noiseproof Power Supplies: What's Important in EMI Removal Filters?" JEE, Jun. 1, 1986, pp. 80-85.
Montrose, "Analysis on Loop Area Trace Radiated Emissions from Decoupling Capacitor Placement on Printed Circuit Boards," IEEE, Jan, 1, 1999, pp. 423-428.
Miyoshi, "Surface Mounted Distributed Constant Type Noise Filter," IEEE, Jan. 1, 1999, pp. 157-160.
Shigeta et al., "Improved EMI Performance by Use of a Three-Terminal-Capacitor Applied to an IC Power Line," IEEE, Jan. 1, 1999, pp. 161-164.
Jul. 19, 1999, PCT International Search Report for PCT/US99/07653.
Oct. 13, 1999, IPER for PCT/US99/07653.
U.S. Appl. No. 10/479,506, Claims 1-46 from Preliminary Amendment filed Dec. 10, 2003.
U.S. Appl. No. 10/189,339, Claims 1-41 from Preliminary Amendment filed Oct. 28, 2003.
U.S. Appl. No. 10/443,792, Claims 1-41 from Preliminary Amendment filed Oct. 28, 2003.
Aug. 19, 1998, PCT International Search Report for PCT/US98/06962.
Apr. 19, 1999, PCT International Search Report for PCT/US99/01040.
Sep. 18, 2000, PCT International Search Report for PCT/US00/11409.
Sep. 13, 2000, PCT International Search Report for PCT/US00/14626.
Nov. 8, 2000, PCT International Search Report for PCT/US00/16518.
Dec. 28, 2000, PCT International Search Report for PCT/US00/21178.
Carpenter, Jr. et al., "A New Approach to TVSS Design," Power Quality Assurance, Sep./Oct. 1996 p. 60-63.
Raychem "Polyswitch Resettable Fuses," Circuit Protection Databook, Jan. 1, 1996, pp. 11-18.
Dec. 28, 2001, PCT International Search Report for PCT/US01/41720.
Jun. 13, 2001, PCT International Search Report for PCT/US01/09185.
Polka et al., "Package-Level Interconnect Design for Optimum Electrical Performance," Intel Technology Journal Q3, Jul. 1, 2000, pp. 1-17.
May 10, 2002, PCT International Search Report for PCT/US01/43418.
Mar. 13, 2002, PCT International Search Report for PCT/US01/32480.
Aug. 19, 2002, PCT International Search Report for PCT/US02/10302.
Feb. 28, 2003, PCT International Search Report for PCT/US02/21238.
Mar. 18, 2002, PCT International Search Report for PCT/US01/13911.
Jul. 16, 1991, PCT International Search Report for PCT/US91/02150.
Jun. 28, 2001, PCT International Search Report for PCT/US01/03792.
"Johanson Dielectrics, Inc. Licenses X2Y Circuit Conditioning Technology," Press Release, Dec. 16, 1998, 1 page.
Beyne et al., "PSGA—an innovative IC package for single and multichip designs," Components, Mar. 1, 1997, pp. 6-9.
"EMC Design for Brush Commutated DC Electric Motors," Sep. 15, 1997, pp. 1-2.
"Tomorrow's Capacitors," Components, Apr. 1, 1996, No. 4, p. 3.
Mason, "Valor—Understanding Common Mode Noise," Mar. 30, 1998, pp. 1-7.
Anthony Anthony et al., Pending specification, claims, figures for U.S. Appl. No. 10/237,079, Claims 21-81; filed Sep. 9, 2002.
David Anthony et al., Pending specification, claims, figures for U.S. Appl. No. 10/766,000, Claims 1-63; filed Jan. 29, 2004.
William Anthony, Pending specification, claims, figures for U.S. Appl. No. 10/399,630, Claims 1-35; filed Aug. 27, 2003.
Anthony Anthony et al., Pending specification, claims, figures for U.S. Appl. No. 10/432,840, Claims 1-39; filed May 28, 2003.
William Anthony, Pending specification, claims, figures for U.S. Appl. No. 10/443,482, Claims 1-25; filed Jun. 12, 2003.
Anthony Anthony et al., Pending specification, claims, figures for U.S. Appl. No. 10/435,199, Claims 1-32; filed May 12, 2003.
Anthony Anthony et al., Pending specification, claims, figures for U.S. Appl. No. 10/115,159, Claims 1-31; filed Apr. 2, 2002.
Anthony Anthony et al., Pending specification, claims, figures for U.S. Appl. No. 10/189,338, Claims 1-69; filed Jul. 2, 2002.
Anthony Anthony et al., Pending specification, claims, figures for U.S. Appl. No. 10/189,339, Claims 1-41; filed Jul. 2, 2002.
Anthony Anthony et al., Pending specification, claims, figures for U.S. Appl. No. 10/479,506, Claims 1-46; filed Dec. 10, 2003.
Anthony Anthony, Pending specification, claims, figures for U.S. Appl. No. 10/443,764, Claims 26-40; filed Sep. 16, 2003.
Anthony Anthony, Pending specification, claims, figures for U.S. Appl. No. 10/443,792, Claims 1-41; May 23, 2003.
Anthony Anthony, Pending specification, claims, figures for U.S. Appl. No. 10/443,788, Claims 1-20; filed May 23, 2003.
Anthony Anthony et al., Pending specification, claims, figures for U.S. Appl. No. 10/443,778, Claims 1; 21-59; filed May 23, 2003.
Anthony Anthony et al., Pending specification, claims, figures for U.S. Appl. No. 10/460,361, Claims 1-16; filed Jun. 13, 2003.
Anthony Anthony et al., Pending specification, claims, figures for U.S. Appl. No. 10/705,962, Claims 19-33; filed May 25, 2005.
Anthony Anthony, Pending specification, claims, figures for U.S. Appl. No. 10/369,335, Claims 1-20; Feb. 18, 2003.
Anthony Anthony et al., Pending specification, claims, figures for U.S. Appl. No. 09/647,648, Claims 1-48; filed Nov. 17, 2000.
Anthony Anthony, Pending specification, claims, figures for U.S. Appl. No. 10/328,942, Claims 1-20; filed Dec. 23, 2002.
Anthony Anthony et al., Pending specification, claims, figures for U.S. Appl. No. 09/632,048, Claims 1-20; filed Aug. 3, 2000.
Anthony Anthony et al., Pending specification, claims, figures for U.S. Appl. No. 09/996,355, Claims 1-73; filed Nov. 29, 2001.
Willian Anthony, Pending specification, claims, figures for U.S. Appl. No. 10/023,467, Claims 1/20; filed Dec. 17, 2001.

(56) References Cited

OTHER PUBLICATIONS

Jan. 1, 2005. Weir, et al., "DesignCon 2005, High Performance FPGA Bypass Networks".
Apr. 25, 2002, Pending claims 1-40 and figures (3 pages) for U.S. Appl. No. 10/399,590; the specification is contained in WO 02/33798, filed Oct. 17, 2001, which is the published version of PCT/US01/32480.
Feb. 11, 2005, PCT International Search Report for PCT/US04/00218.
Feb. 18, 2005, PCT International Search Report for PCT/US04/14539.
Mar. 24, 2005, Australian Patent Office Examination Report for SG 200303041-8.
Apr. 11, 2005, PCT International Search Report for PCT/US04/18938.
Nov. 2000, Muccioli, "EMC Society Seattle and Oregon Chapters—New X2Y Filter Technology Emerges as Singles Component Solution for Noise Suppression".
Sep. 27, 2005, PCT Corrected IPER for PCT/US04/00218.
Nov. 8, 2005, Supplementary Partial European Search Report EP 99916477.
Oct. 27, 2005, Supplementary European Search Report EP 98915364.
Dec. 9, 2005, PCT ISR for PCT/US04/39777.
May 8, 2006, EP Examination Report for 99916477.5-2215.
PCT Written Opinion of the International Search Authority, PCT/US2007/063463.
PCT International Search Report, PCT/US2007/063463.
Oct. 31, 2007, PCT International Search Report PCT/US06/06609.
Oct. 31, 2007, PCT Written Opinion of the International Search Authority PCT/US06/06609.
Jun. 12, 2008, PCT International Search Report PCT/US06/06608.
Jun. 12, 2008, PCT Written Opinion of the International Search Authority PCT/US06/06608.
Jun. 12, 2008, PCT International Search Report PCT/US06/06607.
Jun. 12, 2008, PCT Written Opinion of the International Search Authority PCT/US06/06607.
Jun. 17, 2008, PCT International Search Report PCT/US06/08901.
Jun. 17, 2008, PCT Written Opinion of the International Search Authority PCT/US06/08901.
Jun. 6, 2008, European Search Report EP 07 01 9451.
Sep. 25, 2008, European Search Report EP 01 99 4116.
Sep. 25, 2008, European Search Report EP 01 99 9170.
Sep. 25, 2008, European Search Report EP 01 99 0677.
Sep. 18, 2008, PCT Written Opinion of the International Search Authority PCT/US07/063463.
Sep. 25, 2008, European Search Report EP 01 90 8876.
Sep. 25, 2008, European Search Report EP 01 92 2559.
Sep. 25, 2008, European Search Report EP 01 98 1731.
Jan. 24, 1995, Patent Abstracts of Japan, English translation of abstract for JP 07-022757.
Oct. 13, 2000, Patent Abstracts of Japan, English translation of abstract for JP 2000-28665.
Nov. 1, 1960, Cohn, "Characteristic Impedances of Broadside-Coupled Strip Transmission Lines", IRE Transactions on Microwave Theory and Techniques, vol. 8.6, 633-637.
May 1, 1969, Goldmann, "Geometric Optimization of Controlled Collapse Interconnections", IBM Journal of Research and Development, vol. 13.3, pp. 251-265.
Jan. 1, 1974, Howe, Stripline Circuit Design, pp. 1-308.
May 1, 1971, Hines, "Reciprocal and Nonreciprocal Modes of Propagation in Ferrite Stripline and Microstrip Devices", IEEE Transactions on Mircowave Theory and Techniques, vol. MTT-19.5, pp. 442-451.
Sep. 1, 1976, Coda et al., "Design Considerations for High-Frequency Ceramic Chip Capacitors", IEEE, vol. PHP-12.3, pp. 206-212.
Apr. 1, 1985, King, Texas Instruments Design Group Electromagnetic Compatibility Design Guide, pp. 1-98.
Sep. 1, 1987, Robinson et al. "A Midrange VLSI Hewlett-Packard Precision Architecture Computer", Hewlett-Packard Journal, vol. 38.9, pp. 26-37.
Jan. 1, 1988, Chao et al., "Multilayer Thin-Film Substrate for Multichip Packaging", Electronic Components Conference, Proceedings of the $38^{th}$, pp. 276-281.
Jan. 1, 1989, Quint et al., "Electrical Design Methodology of a 407 Pin Multi-Layer Ceramic Package", Electronic Components Conference, Proceedings of the $39^{th}$, pp. 392-397.
Jan. 1, 1989, Bhat et al., Stripline-Like Transmission Lines for Microwave Integrated Circuits, pp. 1-695.
May 1, 1989, Paul, "A Comparison of the Contributions of Common-mode and Differential Mode Currents in Radiated Emissions", IEEE Transactions on Electromagnetic Compatability, vol. 31.2, pp. 189-193.
Aug. 1, 1989, King et al., Michael King Lecture Notes, pp. 1-14.
May 1, 1982, Bonner et al., "Advanced Printed-Circuit Board Design for High Performance Computer Applications", IBM Journal of Research and Development, vol. 26.3, pp. 297-305.
Jan. 1, 1989, Hnatek et al., "Quality Issues of High Pin Count Fine Pitch VLSI Packages", IEEE International Test Conference, pp. 397-421.
May 1, 1989, Jayaraj et al., "Performance of Low Loss, High Speed Interconnects For Multi-GHz Digital Systems", IEEE Proceedings of the Aerospace and Electronics Conference, vol. 4, pp. 1674-1681.
Jan. 1, 1989, Liang et al., "High-Performance VLSI Through Package-Level Interconnects", IEEE Proceedings $39^{th}$ Electronic Components Conference, pp. 518-523.
Jun. 1, 1987, Palusinski et al., "Electrical Modeling of Interconnections in Multilayer Packaging Structures", IEEE Transactions on Components, Hybrids, and Manufacturing Technology, vol. 10.2, pp. 217-223.
Sep. 1, 1987, Kwon et al., "Closely Packed Microstrip Lines as Very High-Speed Chip-to-Chip Interconnects", IEEE Transactions on Components, Hybrids, and Manufacturing Technology, vol. 10.3, pp. 314-320.
Dec. 1, 1985, Watari et al., "Packaging Technology for the NEC SX Supercomputer", IEEE Transactions on Components, Packaging, and Manufacturing Technology, vol. 8.4 pp. 462-467.
Jan. 1, 1989, Seraphim et al., "Principles of Electronic Packaging", McGraw-Hill series in electrical engineering.
Nov. 1, 1989, Gisin, "Minimizing Electromagnetic Interference Through Proper Printed Circuit Board Layout Techniques", Wescon/89 Conference Record, pp. 352-354.
Jan. 1, 1983, Wilson et al., "Theoretical and Experimental Analysis of Coupling Characteristics of Dual TEM Cells", IEEE 1983 International Symposium on Electromagnetic Compatability, pp. 513-517.
Jan. 1, 1985, Keenan, Decoupling and Layout of Digital Printed Circuits, 1.0 to A4-4.
Jan. 1, 1989, AMS International, Electronic Materials Handbook: Packaging, vol. 1, pp. 18-34; 76-88; 127-141; 597-610.
Sep. 1, 1987, Mangelsdorf et al., "A VLSI Processor for HP Precision Architecture", Hewlett-Packard Journal, vol. 38.9, pp. 4-11.
Apr. 1, 1989, Jessen, "VXIbus Product Development Tools", Hewlett-Packard Journal, vol. 40.2, 96-97.
Apr. 1, 1989, Jessen, "VXIbus: A New Interconnection Standard for Modular Instruments", Hewlett-Packard Journal, vol. 40.2, pp. 91-95.
Jan. 1, 1990, Akihiro et al., "Packaging Technology for the NEC SX-3/SX Supercomputer", IEEE Electronic Components and Technology Conference, pp. 525-533.
Jan. 1, 1990, Smith and Savara, "High-Speed Characteristics of Multilayer Ceramic Packages and Test Fixtures", Gallium Arsenide Integrated Circuit (GaAs IC) Symposium, 1990. Technical Digest 1990, 12th Annual, pp. 203-206.
Shimada et al., "Large Scale Multilayer Glass-Ceramic Substrate for Supercomputer", IEEE 40th Electronic Components and Technology Conference, Jan. 1, 1990, vol. 1, pp. 76-83.
Jan. 1, 1990, Mielke et al., "High-Speed Fixture Interconnects for Mixed-Signal IC Testing", IEEE International Test Conference, pp. 891-895.
Jan. 1, 1990, Walker, Capacitance, Inductance, and Crosstalk Analysis, pp. 1-231.

(56) References Cited

OTHER PUBLICATIONS

May 1, 1990, Prymak, "Advanced Decoupling Using Ceramic MLC Capacitors", 40th Electronic Components and Technology Conference, pp. 1014-1023.
Sep. 1, 1990, Moresco, "Electronic System Packaging: The Search for Manufacturing the Optimum in a Sea of Constraints", IEEE Transactions on Components, Hybrids, and Manufacturing Technology, vol. 13.3, pp. 494-508.
Oct. 1, 1990, Quint et al., "Measurement of R, L, and C Parameters in VLSI Packages", Hewlett-Packard Journal, vol. 41.5, pp. 73-77.
Feb. 1, 1991, Henke et al., "A Checklist for EMC-Controlled Printed Circuit Board Designs", Printed Circuit Design, vol. 8.2.
Feb. 1, 1991, Tomlinson, "Bringing Board Layout Up to Speed", Printed Circuit Design, vol. 8.2, pp. 6-10.
Montrose, "Overview on Design Techniques for Printed Circuit Board Layout Used in High Technology Products", IEEE International Symposium on Electromagnetic Compatability, Aug. 1, 1991, pp. 61-66.
Sep. 1, 1991, Nghiem et al., "A General Analysis of Propagation Along Multi-Layer Superconducting Sripline and Microstrip Transmission Lines", IEEE Transactions on Microwave Theory and Techniques, vol. 39.9, pp. 1553-1565.
Jan. 1, 1991, Tummala et al., "Packaging Technology for IBM's Latest Mainframe Computers (S/390/ES9000)", IEEE, pp. 682-688.
Jan. 1, 1991, Institute for Interconnecting and Packaging Electronic Circuits, IPC-D-275: Design Standard for Rigid Printed Boards and Rigid Printed Board Assemblies, pp. 1-97.
Jan. 1, 1991, Fluke, Controlling Conducted Emissions by Design, pp. 1-334.
Becker et al., "Time Domain Electromagnetic Analysis of a Via in a Multilayer Computer Chip Package", Microwave Symposium Digest, Jan. 1, 1992, IEEE MTT-S International, pp. 1229-1232.
Papsioannou et al., "Generic Desing Rules for High-Speed MCM's", IEMT 12th International Electronic Manufacturing Technology Symposium, Jan. 1, 1992, pp. 237-244.
Jan. 1, 1992, Wu, "Resistance Computations for Multilayer Packaging Structures by Applying the Boundary Element Method", IEEE Transactions on Components, Packaging, and Manufacturing Technology, vol. 15.1, pp. 87-96.
Feb. 1, 1992, Teener, "A Bus on a Diet—The Serial Bus Alternative—An Introduction to the P1394 High Performance Serial Bus", IEEE Digest of Papers of 37th Computer Society International Conference, Compcon Spring 1992, pp. 316-321.
Feb. 1, 1992, Wyatt, "EMC Design of the HP 54600 Series Oscilloscopes", Hewlett-Packard Journal, vol. 43.1, pp. 41-45.
Apr. 1, 1992, Carey, "Trends in Low Cost, High-Performance Substrate Technology", IEEE Micro, pp. 19-27.
Apr. 1, 1992, DesJardin, "VXIbus: A Standard for Test and Measurement System Architecture", Hewlett-Packard Journal, vol. 43.2, pp. 6-14.
May 1, 1992, Gravelle et al., "EMI/EMC in Printed Circuit Boards—a Literature Review", IEEE Transactions on Electromagnetic Compatibility, vol. 34.2, pp. 109-116.
Jul. 1, 1992, de Vreede, et al., "A High Frequency Model Based on the Physical Structure of the Ceramic Multilayer Capacitor", IEEE Transactions on Microwave Theory and Techniques, vol. 40.7, pp. 1584-1587.
Jan. 1, 1992, Murano et al., "Packaging Technology for the NEC SX-3 Supercomputer", IEEE Transaction on Components, Hybrids, and Manufacturing Technology, pp. 411-417.
Aug. 1, 1992, Pan et al., "The Simulation of High-Speed, High-Density Digital Interconnects in Single Chip Packages and Multichip Modules", IEEE Transactions on Components, Hybrids, and Manufacturing Technology, vol. 15, No. 4, pp. 465-477.
Aug. 1, 1992, Daijavad et al., "Methodology for Evaluating Practical EMI Design Guidelines Using EM Analysis Programs", IEEE International Symposium on Electromagnetic Compatibility, pp. 30-34.
Aug. 1, 1992, Frink et al., "High-Performance Designs for the Low-Cost PA-RISC Desktop", Hewlett-Packard Journal, vol. 43.4, pp. 55-63.
Aug. 1, 1992, Gleason et al., "VLSI Circuits for Low-End and Midrange PA-RISC Computers", Hewlett-Packard Journal, vol. 43.4, pp. 12-22.
Aug. 1, 1992, Lettang, "ECL Clocks for High-Performance RISC Workstations", Hewlett-Packard Journal, vol. 43.4, pp. 23-25.
Sep. 1, 1992, Davidson et al., "Physical and electrical design features of the IBM Enterprise System/9000 circuit Module", IBM J. Res. Develop. vol. 36, No. 5, pp. 877-888.
Oct. 1, 1992, Foss et al., "Fast Interfaces for DRAMs", IEEE Spectrum, vol. 29.10.
Nov. 1, 1992, Bussmann, "Active Compensation of Interconnection Losses for Multi-GHz Clock Distribution Networks", IEEE Transactions on Circuits and Systems II: Analog and Digital Signal Processing, vol. 39.11, pp. 790-798.
Dec. 1, 1992, Matta, "Advances in Integrated Circuit Packaging: Demountable TAB", Hewlett-Packard Journal, vol. 43.6, pp. 62-77.
Dec. 1, 1992, Thomas et al., "Software for the HP EISA SCSI Card", Hewlett-Packard Journal, vol. 43.6, pp. 97-108.
Jan. 1, 1993, Rao et al., "Manufacture of Advanced Cu—Pl Multi Chip Modules", IEEE Proceedings 43rd Electronic Components and Technology Conference, pp. 920-934.
Jan. 1, 1993, "Finite-Difference Time-Domain Modeling of Noise in Computer Packages" IEEE, pp. 123-127.
Jouppi et al., "300MHz 115W 32b Bipolar ECL Microprocessor with On-Chip Caches", IEEE 40th International Solid-State Circuits Conference, Feb. 1, 1993. Digest of Papers, pp. 84-85.
Iqbal et al., "Design Tradeoffs Among MCM-C, MCM-D and MCM-D/C Technologies", Multi-Chip Module Conference, 1993. MCMC-93, Proceedings, Jan. 1, 1993. IEEE, pp. 12-18.
Becker et al., "Power Distribution Modelling of High Performance First Level Computer Packages", IEEE Electrical Performance of Electronic Packaging, Jan, 1, 1993, pp. 202-205.
Aug. 1, 1993, Downing et al., "Decoupling Capacitor Effect on Switching Noise", IEEE Transactions on Components, Hybrids, and Manufacturing Technology, vol. 16.5, pp. 484-489.
Nov. 1, 1993, Blennemann et al., "High Aspect Ratio Lines as Low Distortion High Frequency Off-Chip Interconnects", IEEE Transactions on Components, Hybrids, and Manufacturing Technology, vol. 16.7, pp. 692-698.
Becker et al., "Finite-Difference Time-Domain Modeling of Currents in Multi-Layered Computer Chip Packages", IEEE Electrical Performance of Electronic Packaging, Oct. 1, 1993, pp. 181-184.
Yamaguchi et al., "Packaging Technology for High-Speed Multichip Module Using Copper-Polyimide Thin Film Multilayer Substrate [for B-ISDN]", Electronic Manufacturing Technology Symposium, Oct. 1, 1993, Fifteenth IEEE/CHMT International, pp. 406-410.
Dec. 1, 1993, Intel, "AP-125: Designing Microcontroller Systems for Electrically Noisy Environments", pp. 1-21.
Jan. 1, 1993, Institute for Interconnecting and Packaging Electronic Circuits, IPC-T-50: Terms and Definitions Interconnecting and Packaging Electronic Circuits, pp. 1-71.
Feb. 1, 1993, IEEE, IEEE Std 1155-1992: IEEE Standard for VMEbus Extensions for Instrumentations: VXIbus, pp. 1-199.
Jun. 1, 1993, Asprey et al., "Performance Features of the PA7100 Microprocessor", IEEE Micro, vol. 13.3, pp. 22-35.
Jun. 1, 1993, McLellan, "The Alpha AXP Architecture and 21064 Processor", IEEE Micro, vol. 13.3, pp. 36-47.
Jan. 1, 1994, Kambe et al., "MCM Substrate with High Capacitance", Proceedings of the 1994 International Conference on Multichip Modules, pp. 136-141.
Center for Electronic Packaging Research, "Simultaneous Switching Noise: Influence of Plane-Plane and Plane-Signal Trace Coupling", Electronic Components and Technology Conference, Jan. 1, 1994. Proceedings, 44th, pp. 957-961.
Dimos et al., "Thin-Film Decoupling Capacitors for Multichip Modules", Electronic Components and Technology Conference, Jan. 1, 1994. Proceedings, 44th, pp. 894-899.
Jan. 1, 1994, Ida et al., "An L-Band Power Amplifier Multi-Chip-Module Using Multi-Layered Planar Circuits", IEEE MTT-S International Microwave Symposium Digest 1994, vol. 3, pp. 1649-1652.

(56) References Cited

OTHER PUBLICATIONS

Schaper et al., "Electrical Characterization of the Interconnected Mesh Power System (IMPS) MCM Topology", IEEE Proceedings 44th Electronic Components and Technology Conference, Jan. 1, 1994, pp. 791-795.
Hirano et al., "Characterization and Reduction of Simultaneous Switching Noise for a Multilayer Package", IEEE Proceedings of 44th Electronic Components and Technology Conference, Jan. 1, 1994, pp. 949-956.
Huang et al., "CBGA Package Design for C4 PowerPC Microprocessor Chips: Trade-off Between Substrate Routability and Performance", Electronic Components and Technology Conference, Jan. 1, 1994, Proceedings, 44th, pp. 88-93.
Jan. 1, 1994, AT&T, Carrierless AM/PM (CAP) Host-DSL Transceiver Layout Guide, pp. 1-24.
May 1, 1994, Yamanak et al., "320 Gb/s High-Speed ATM Switching System Hardware Technologies Based on Copper-Polymide MCM", IEEE 44th Electronic Components and Technology Conference, pp. 776-785.
Jan. 1, 1994, Iqbal et al., "Design Tradeoffs Among MCM-C, MCM-D and MCM-D/C Technologies", IEEE Transactions on Components, Packaging, and Manufacturing Technology—Part B: Advanced Packaging, pp. 22-29.
Jul. 1, 1994, Schwab et al., "Multilayer Suspended Stripline and Coplanar Line Filters", IEEE Transactions on Microwave Theory and Techniques, vol. 42.7, pp. 1403-1407.
Oct. 1, 1994, Garg et al., "Thermal Design of an Advanced Multichip Module for a RISC Processor", IEEE International Conference on Computer Design: LVSI in Computers and Processors, pp. 608-611.
Light et al., "Process Considerations in the Fabrication of Teflon Printed Circuit Boards", IEEE Proceedings of the Electronic Components and Technology Conference, May 1, 1994, pp. 542-549.
Jan. 1, 1994, Swaminathan et al., "Electrical Design of an MCM for a Multiprocessor System", MCM '94 Proceedings, pp. 480-486.
Wu et al., "Modeling and Simulation of Integral Decoupling Capacitors in Single and Multichip Module Electronics Packaging", IEEE Proceedings 44th Electronic Components and Technology Conference, May 1, 1994, pp. 945-948.
Panicker et al., "Low-Cost Ceramic Thin-Film Ball Grid Arrays", IEEE Proceedings 44th Electronic Components and Technology Conference, May 1, 1994, pp. 29-31.
Sudo, "Present and Future Directions for Multichip Module Technologies", IEEE Symposium on VLSI Circuits, Jun. 1, 1994. Digest of Technical Papers, pp. 51-54.
DeHaven and Dietz, "Controlled Collapse Chip Connection (C4)—an Enabling Technology", IEEE Proceedings of 44th Electronic Components and Technology Conference, May 1, 1994, pp. 1-6.
Jan. 1, 1994, Fang et al., "Effects of Losses in Power Planes in the Simulation of Simultaneous Switching Noise", Proceedings of the 3rd Topical Meeting on Electrical Performance of Electronic Packaging, pp. 110-112.
Apr. 1, 1994, Light et al., "Integrated Flex: Rigid-Flex Capability in a High Performance MCM", MCM '94 Proceedings, pp. 430-442.
Jan. 1, 1994, Jastech, Advanced EMC Printed Circuit Board Design, pp. 1 to 8-15.
Jan. 1, 1994, Hannemann et al., Semiconductor Packaging A Multidisciplinary Approach, pp. 1-886.
Feb. 23, 2009, Intel Corp, Intel Corp Form 10-K for period ending Dec. 17, 2008.
Feb. 20, 2008, Intel Corp, Intel Corp Form 10-K for period ending Dec. 29, 2007.
Ogasawara et al., "High Isolation Analog 4×4 Matrix Switch LSI for Centralized Control Microcell Radio Systems", 5th IEEE International Symposium on Personal, Indoor and Mobile Radio Communications, Sep. 1, 1994. Wireless Networks—Catching the Mobile Future, vol. 1, pp. 369-371.
Dec. 1, 1994, IEEE Standard Board, IEEE Standard for Medical Device Communications—Physical Layer Interface—Cable Connected.
Jan. 1, 1995, Vaidyanath et al., "Simultaneous Switching Noise: Influence of Plane-Plane and Plane-Signal Trace Coupling", IEEE Transactions on Components, Packaging, and Manufacturing Technology—Part B, vol. 18.3, pp. 496-502.
Jan. 1, 1995, Lester et al., "Low Cost Miniaturized EHF Satcom Transceiver Featuring HEMT MMICS and LTCC Multilayer Packaging", IEEE 1995 Microwave and Millimeter-Wave Monolithic Circuits Symposium, pp. 35-38.
Jan. 1, 1995, Liaw, "Simulation and Modeling of Mode Conversion at Vias in Multilayer Interconnections", IEEE Proceedings of the 45th Electronic Components and Technology Conference, pp. 361-367.
Jan. 1, 1996, Montrose, Printed Circuit Board Design Techniques for EMC Compliance, pp. 1-238.
Feb. 1, 1995, Yamanaka et al., "320 Gb/s High-speed ATM Switching System Hardware Technologies Based on Copper-Polyimide MCM", IEEE Transactions on Components, Packaging, and Manufacturing Technology—Part B: Advanced Packaging, vol. 18.1, pp. 83-91.
Apr. 1, 1995, Pearson, "A Low-Cost, High-Performance PA-RISC Workstation with Built-in Graphics Multimedia, and Networking Capabilities", Hewlett-Packard Journal, vol. 46.2, pp. 6-11.
Feb. 1, 1995, Kambe, et al., "MCM Substrate with High Capacitance", IEEE Transactions on Components, Packaging, and Manufacturing Technology—Part B, vol. 18.1, pp. 23-27.
Oct. 1, 1995, Cohn, "Shielded Coupled-Strip Transmission Line", IRE Transactions on Microwave Theory and Techniques, vol. 3.5, pp. 29-38.
Sep. 1, 1995, Murphy et al., "High Frequency Performance of Multilayer Capacitors", IEEE Transactions on Microwave Theory and Techniques, vol. 43, No. 9, 2007-2015.
Mar. 1, 1995, Dimos et al., "Thin-Film Decoupling Capacitors for Multichip Modules", IEEE Transactions on Components, Packaging, and Manufacturing Technology, Part A, vol. 18.1, pp. 174-179.
Feb. 1, 1995, Sarfaraz et al., "Electrical Design of an MCM Package for a Multi-Processor Digital System", IEEE Transactions on Components, Packaging, and Manufacturing Technology, Part B. vol. 18, No. 1, pp. 127-143.
Nov. 1, 1995, Lee et al., "Modeling and Analysis of Multichip Module Power Supply Planes", IEEE Transactions on Components, Packaging, and Manufacturing Technology, Part B: Advanced Packaging, vol. 18.4, pp. 628-639.
May 1, 1995, Hussein, "FDTD Applications to Electromagnetic Interference and Shielding, WESCANEX 95. Communications, Power, and Computing", Conference Proceedings. IEEE, pp. 478-482.
Feb. 1, 1995, Light et al., "Integrated Flex: Rigid-Flex Capability in a High Performance MCM", IEEE Transactions on Components, Packaging, and Manufacturing Technology, Part B, vol. 18.1, pp. 47-52.
Dec. 1, 1995, Huang et al., "A Packaging System for Built-in Microcircuits in Multilayer Substrates", 1995 Japan IEMT Symposium: Proceedings of 1995 International Electronic Manufacturing Technology Symposium, pp. 460-463.
Jan. 1, 1995, Institute for Interconnecting and Packaging Electronic Circuits, IPC-D-317A: Design Guidelines for Electronic Packaging Utilizing High-Speed Techniques, pp. 1-70.
Nov. 6, 1995, Miskell, "Avoid EMI Woes in Power-Bus Layouts", Electronic Design, vol. 43.23, pp. 147-150.
Jan. 1, 1995, Wu et al., "Precise CMOS Current Sample/Hold Circuits Using Differential Clock Feedthrough Attenuation Techniques", IEEE Journal of Solid-State Circuitry, vol. 30.1, pp. 76-80.
Apr. 1, 1995, Lee, "Accelerating Multimedia with Enhanced Microprocessors", IEEE Micro, vol. 15.2, p. 22-32.
mar. 1, 1995, Hunt, "Advanced Performance Features of the 64-bit PA-8000", Compcon '95, 'Technologies for the Information Superhighway', Digest of Papers, pp. 123-128.
Dec. 1, 1995, IEEE Standards Board, IEEE Standard for a High Performance Serial Bus.
Apr. 1, 1995, Edmondson et al., "Superscalar Instruction Execution in the 21164 Alpha Microprocessor", IEEE Micro, vol. 15.2, 33-43.
Apr. 1, 1995, Bass et al., "The PA 7100LC Microprocessor: A Case Study of 1C Design Decisions in a Competitive Environment", Hewlett-Packard Journal, vol. 46.2, 12-22.

(56) References Cited

OTHER PUBLICATIONS

Feb. 1, 1996, Fessler et al., "The Effectiveness of an Image Plane in Reducing Radiated Emissions", IEEE Transactions on Electromagnetic Compatibility, vol. 38.1, pp. 51-61.
Feb. 1, 1996, Kromann et al., "A Hi-Density C4/CBGA Interconnect Technology for a CMOS Microprocessor", IEEE Transactions on Components, Packaging, and Manufacturing Technology, Part B: Advanced Packaging, vol. 19.1, pp. 166-173.
Feb. 1, 1996, Intel, AP-711: EMI Design Techniques for Microcontrollers in Automotive Applications, pp. 1-21.
Wu et al., "1.2V CMOS Switched-Capacitor Circuits", IEEE 42nd International Solid-State Circuits Conference, Feb. 1, 1996, pp. 388-389, 479.
Feb. 1, 1996, Bryg et al., "A High-Performance, Low-Cost Multiprocessor Bus for Workstations and Midrange Servers", Hewlett-Packard Journal, vol. 47.1, pp. 18-24.
Feb. 1, 1996, Chan et al., "Design of the HP PA 7200 CPU", Hewlett-Packard Journal, vol. 47.1, pp. 25-33.
Feb. 1, 1996, Harline et al., "Symmetric Multiprocessing Workstations and Servers System—Designed for High Performance and Low Cost", Hewlett- Packard Journal, vol. 47.1, pp. 8-17.
Feb. 1, 1996, HOtchkiss et al., "A New Memory System Design for Commercial and Technical Computing Products", Hewlett-Packard Journal, vol. 47.1, pp. 44-51.
Mar. 1, 1996, Intel, AP-524: Pentium® Pro Processor GTL+Guidelines, pp. 1-26.
Mar. 21, 1996, IEEE Standards Board, IEEE Standard for Low-Voltage Differential Signals (LVDS) for Scalable Coherent Interface (SCI), pp. 1-29.
Apr. 26, 1996, Bauer, "BGA and Flip-Chip Technologies: A to Z", SEMICON/Test, Assembly & Packaging 96.
Aguirre et al., "Numerical Investigation of Radiated Emissions Mechanisms in Single-Chip Packages", IEEE Proceedings of 46th Electronic Components and Technology Conference, May 1, 1996, pp. 996-1001.
May 1, 1996, Madhavan et al., "A Novel High Speed Low Skew Clock Distribution Scheme in 0.8 Micron CMOS", 1996 IEEE International Symposium on Circuits and Systems, ISCAS '96., Connecting the World, vol. 4, pp. 149-152.
Jul. 1, 1996, Ommodt et al., "Vertical Interconnects for Phased Array Packaging", IEEE Antennas and Propagation Society International Symposium, vol. 2, pp. 1334-1337.
Fang et al., "Reduction of Power and Ground Noise Coupling in Mixed Signal Modules", IEEE $5^{th}$ Topical Meeting on Electrical Performance of Electronic Packaging, Oct. 1, 1996, pp. 90-92.
Oct. 1, 1996, Lei et al., "Power Distribution Noise Suppression Using Transmission Line Termination Techniques", Proceedings of the 5th Topical Meeting on the Electrical Performance of Electrical Packaging, pp. 100-102.
Jan. 1, 1996, Libous et al., "Measurement, Modeling and Simulation of Flip-Chip CMOS ASIC Simultaneous Switching Noise on a Multi-Layer Ceramic BGA", IEEE, pp. 120-122.
Jan. 1, 1996, Institute for Interconnecting and Packaging Electronic Circuits, IPC-T-50: Terms and Definitions Interconnecting and Packaging Electronic Circuits, pp. 1-101.
Dec. 1, 1996, Slater, "The Microprocessor Today", IEEE Micro, vol. 16.6, pp. 32-44.
Dec. 1, 1996, Yu, The Future of Microprocessors, IEEE Micro, vol. 16.6, pp. 46-53.
Jan. 1, 1997, Konsowski et al., Electronic Packaging of High Speed Circuitry, pp. 1-417.
Jan. 1, 1997, Allan et al., "A Low-Cost Workstation with Enhanced Performance and I/O Capabilities", Hewlett-Packard Journal, vol. 48.3, pp. 82-88.
Oct. 1, 1997, Pillai, "Coax Via—A Technique to Reduce Crosstalk and Enhanced Impedance Match at Vias in High-Frequency Multilayer Packages Verified by FDTD and MoM Modeling", IEEE Transactions on Microwave Theory and Techniques, vol. 45, No. 10, pp. 1981-1985.
Nov. 1, 1997, Koike et al., "High-Speed Signal Transmission at the Front of a Bookshelf Packaging System", IEEE Transactions on Components, Packaging, and Manufacturing Technology, Part B. vol. 20, No. 4, pp. 353-360.
Jan. 1, 1998, Petefish et al., "High Density Organic Flip Chip Package Substrate Technology", IEEE 1998 Electronic Components and Technology Conference, pp. 1089-1097.
Feb. 1, 1998, Deutsch, "Electrical Characteristics of Interconnections for High-Performance Systems", Proceedings of the IEEE, vol. 86.2, pp. 315-355.
Feb. 1, 1998, Vichot et al., "Numerical Modeling of a Clock Distribution Network for a Superconducting Multichip Module", IEEE Transactions on Components, Packaging, and Manufacturing Technology—Part B, vol. 21, No. 1, pp. 98-104.
Feb. 1, 1998, Institute for Interconnecting and Packaging Electronic Circuits, IPC-2221: Generic Standard on Printed Board Design, pp. 1-97.
Aug. 1, 1998, Kaires, "Radiated Emissions from Printed Circuit Board Traces Including the Effect of Vias, as a Function of Source, Termination and Board Characteristics", IEEE International Symposium on Electromagnetic Compatibility 1998, vol. 2, pp. 872-877.
Oct. 1, 1998, Brown, Advanced Electronic Packaging with Emphasis on Multichip Modules, pp. 1-791.
Jan. 1, 1998, Low et al., "Via Design Optimisation for High Speed Device Packaging", IEEE/CPMT Electronics Packaging Technology Conference, pp. 112-118.
Jan. 1, 1998, Lau et al., Electronic Packaging Design, Materials, Process, and Reliability, pp. 1-482.
Jan. 1, 1998, Martens, High-Frequency Characterization of Electronic Packaging, pp. 1-155.
Jan. 1, 1999, Shigeta et al., "Improved EMI Performance by Use of a Three-Terminal-Capacitor Applied to an IC Power Line", IEEE International Symposium on Electromagnetic Compatibility, 1999, vol. 1, pp. 161-164.
Feb. 1, 1999, Intel Corporatio, AP-589: Design for EMI, pp. 1-14.
Erdin et al., "Mixed Circuit/Electromagnetic Analysis of Field Coupling to High Speed Interconnects in Inhomogenous Medium", IEEE International Symposium on Electromagnetic Compatibility, Aug. 1, 1999, vol. 1, pp. 446-449.
Aug. 1, 1999, Armstrong, "PCB Design Techniques for Lowest-Cost EMC Compliance: Part 1", Electronics & Communication Engineering Journal, pp. 218-226.
Oct. 1, 1999, Armstrong, "PCB Design Techniques for Lowest-Cost EMC Compliance: Part 2", Electronics & Communication Engineering Journal, pp. 185-194.
Jan. 1, 1999, Li et al., "Validation of Integrated Capacitor-Via-Planes Model", IEEE, pp. 121-124.
Jan. 1, 1999, Yew et al., "Design and Performance Evaluation of Chip Capacitors on Microprocessor Packaging", IEEE 8th Topical Meeting on Electrical Performance of Electronic Packaging, pp. 175-178.
Jan. 1, 2000, Chen, "Effects of 20-H Rule and Shielding Vias on Electromagnetic Radiation From Printed Circuit Boards", IEEE, pp. 193-196.
Jan. 1, 2000, Ilavarasan et al., "Current and Future EMI Challenges at Intel and How to Manage Them", IEEE, pp. 281-283.
Jan. 1, 2000, Tadayon, "Thermal Challenges During Microprocessor Testing", Intel Technology Journal.
Jan. 1, 2000, Dory et al., "Simultaneous Chip-Join and Underfill Assembly Technology for Flip-Chip Packaging", Intel Technology Journal.
Jan. 1, 2000, Grayeli, "Microprocessor Packaging: Evolution and Future Challenges", Intel Technology Journal.
Jan. 1, 2000, Viswanath et al., "Thermal Performance Challenges From Silicon to Systems", Intel Technology Journal.
Jul. 1, 2000, Benedict, "PCB Design for EMI/EMC Compliance", WEMPEC Seminar.
Aug. 1, 2000, Li et al., "Design and Performance Evaluation of Microprocessor Packaging Capcitors Using Integrated Capcitor-Via-Plane Model", IEEE Transactions on Advanced Packaging, vol. 23.3, pp. 361-367.
Aug. 1, 2000, Mahajan et al., "The Evolution of Microprocessor Packaging", Intel Technology Journal, vol. 4.3, pp. 1-10.

(56) References Cited

OTHER PUBLICATIONS

Aug. 1, 2000, Lii et al., "Flip-Chip Technology on Organic Pin Grid Array Packages", Intel Technology Journal, vol. 4.3, pp. 1-9.

Aug. 1, 2000, Mencinger, "A Mechanism-Based Methodology for Processor Package Reliability Assessments", Intel Technology Journal, vol. 4.3, pp. 1-8.

Jan. 1, 2001, Ye et al., "EMI Mitigation with Multilayer Power-Bus Stacks and Via Stitching of Reference Planes", IEEE Transactions on Electromagnetic Compatibility, vol. 43.4, pp. 538-548.

Jan. 1, 2001, zilog.com, Product Update for Z86C02/E02/L02, Z86C04/E04/L04, Z86C08/E08/L08 to Clarify the Output Drive in Low-EMI Mode.

Aug. 1, 2001, Shim et al., "20-H Rule Modeling and Measurements", IEEE International Symposium on Electromagnetic Compatibility 2001, vol. 2, pp. 939-942.

Sep. 1, 2001, Gisin et al., "Minimizing EMI Caused by Radially Propagating Waves Inside High Speed Digital Logic PCBs", TELSIKS 2001, pp. 624-631.

Jan. 1, 2002, He et al., "Study of Package EMI Reduction for GHz Microprocessors", IEEE, pp. 271-274.

Jan. 1, 2003, Muccioli et al., "A Microwave Test Fixture for Measuring Four-Terminal Passive Components from DC to 10 GHz", Interference Technology.

Jan. 1, 2004, Sanders et al., "Comparsion of MLCC and X2Y Technology for Use in Decoupling Circuits", CARTS 2004: 24th Annual Capacitor and Resistor Technology Symposium, Mar. 29-Apr. 1.

Aug. 1, 2004, Sanders, A Better Approach to DC Power Filtering.

Mar. 21, 2005, Sanders et al., "The Quantitative Measurement of the Effectiveness of Decoupling Capacitors in Controlling Switching Transients from Microprocessors", 25th Annual Passive Components Conference CARTS 2005, pp. 1-16.

May 1, 2005, Montrose et al., "Analysis on the Effectiveness of the 20-H Rule for Printed-Circuit-Board Layout to Reduce Edge-Radiated Coupling", IEEE Transactions on Electromagnetic Compatibility, vol. 47.2, pp. 227-233.

Nov. 9, 2005, Various, Various, Intel Technology Journal.

May 1, 2008, Ikami et al., "Practical analysis on 20H Rule for PCB", 2008 Asia-Pacific Symposium on Electromagnetic Compatibility, pp. 180-183.

Apr. 26, 2012, Swigget of Prismark Partners LLC, "Product Teardown Report", filed in ITC Investigation No. 337-TA-781.

Jan. 1, 1999, Montrose, EMC and the Printed Circuit Board—Design, Theory, and Layout Made Simple, pp. 1-325.

U.S. Appl. No. 60/033,673, filed Dec. 18, 1996, Lamson.

Greb, "An Intuitive Approach to EM Coupling," EMC Test & Design, Dec. 1, 1993, pp. 20-25.

Montrose, "Analysis on Loop Area Trace Radiated Emissions from Decoupling Capacitor Placement on Printed Circuit Boards," IEEE, Jan. 1, 1999, pp. 423-428.

Raychem, "Polyswitch Resettable Fuses," Circuit Protection Databook, Jan. 1, 1996, pp. 11-18.

Mason, "Valor-Understanding Common Mode Noise," Mar. 30, 1998, pp. 1-7.

David Anthony et al., Pending specification, claims figures for U.S. Appl. No. 10/766,000, Claims 1-63; filed Jan. 29, 2004.

Anthony Anthony, Pending specification, claims, figures for U.S. Appl. No. 10/443,788, Claims 1; 21-45; filed 5/23/03.

Willian Anthony, Pending specification, claims, figures for U.S. Appl. No. 10/023,467, Claims 1-20; filed Dec. 17, 2001.

Jan. 1, 2005, Weir, et al., "DesignCon 2005, High Performance FPGA Bypass Networks".

Nov. 8, 2005, Supplementay Partial European Search Report EP 99916477.

PCT Written Opinion of the International Search Authority.

Oct. 31, 2007, PCT Written Opinion of the International Search.

\* cited by examiner

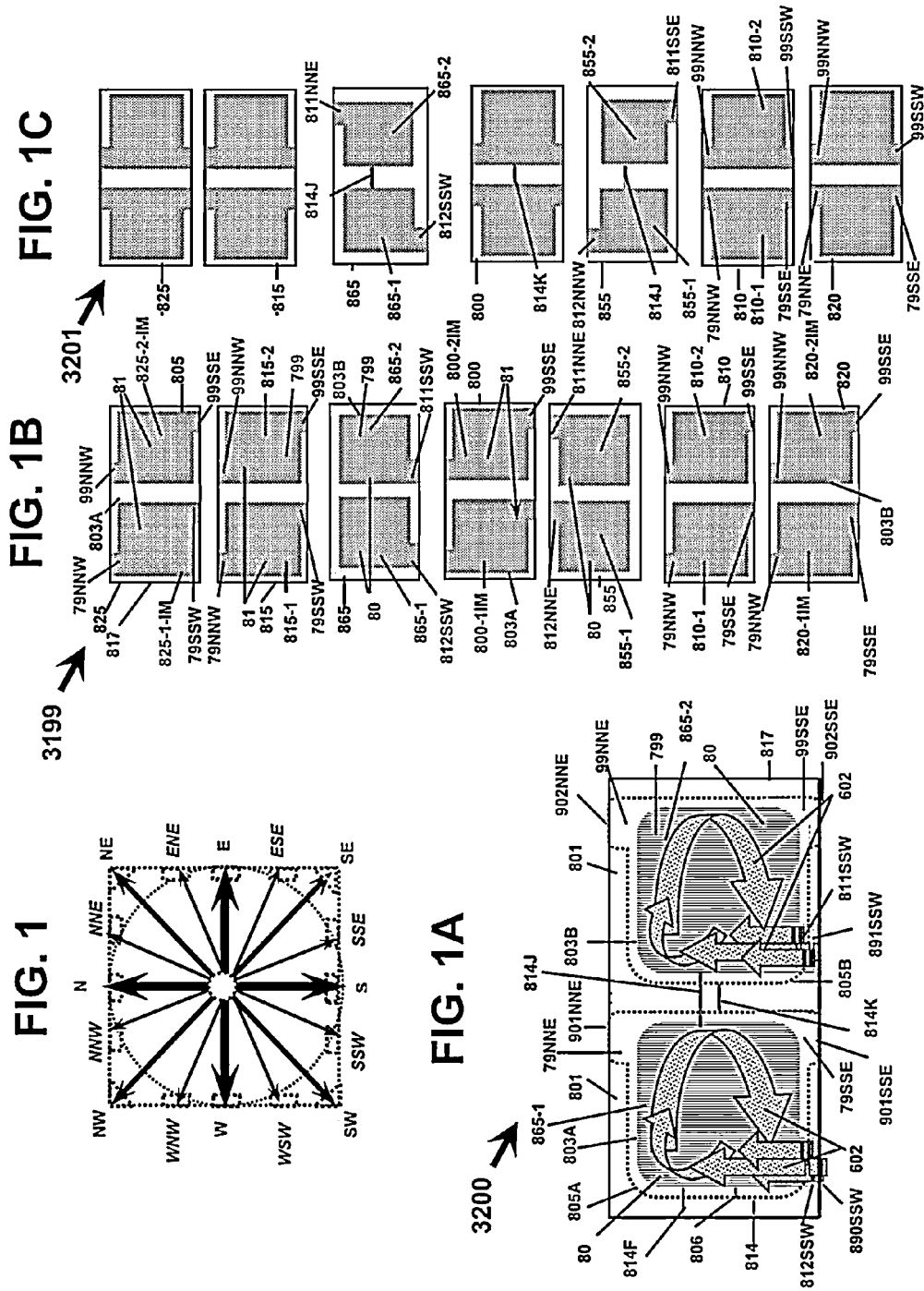

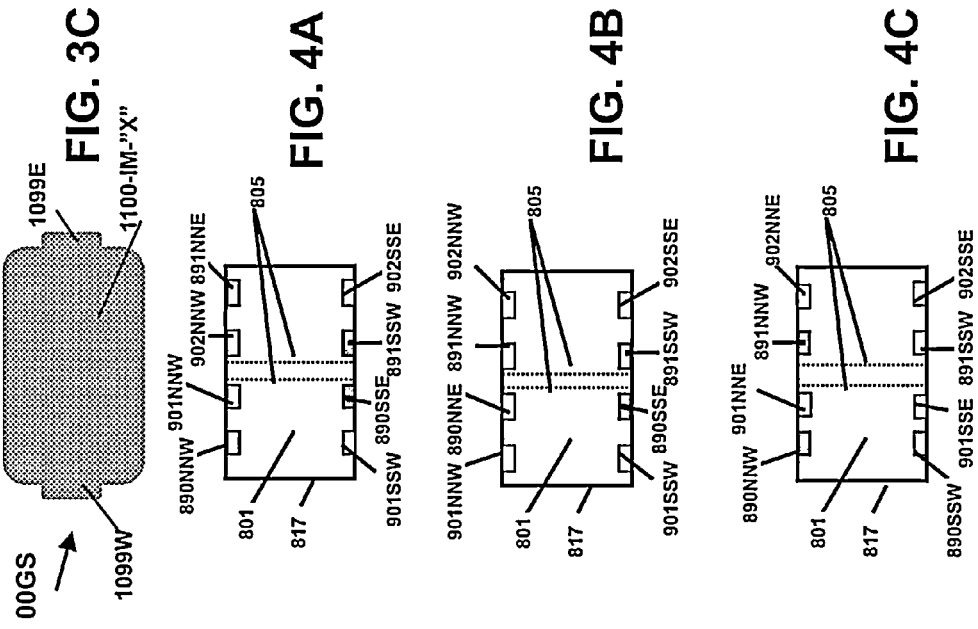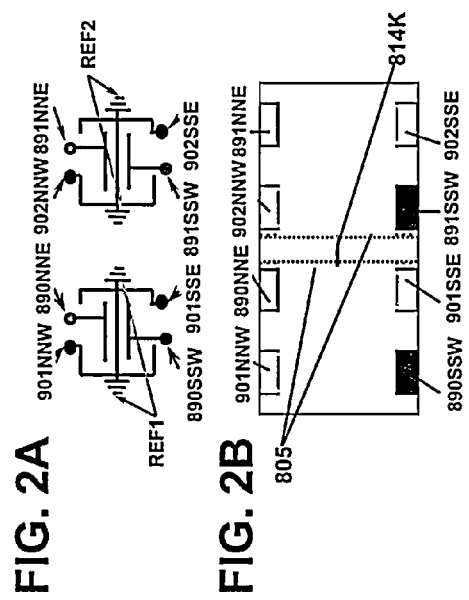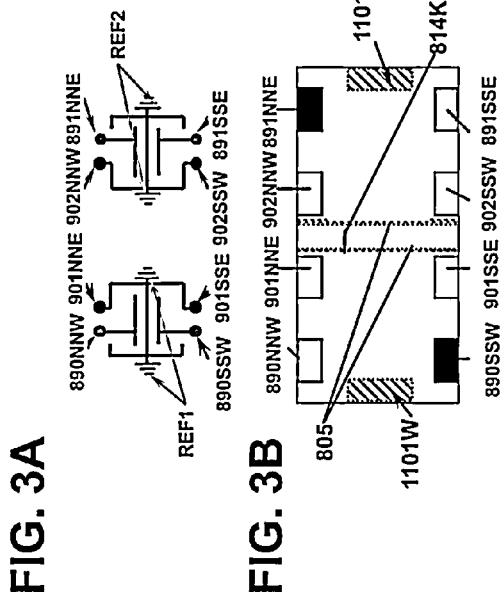

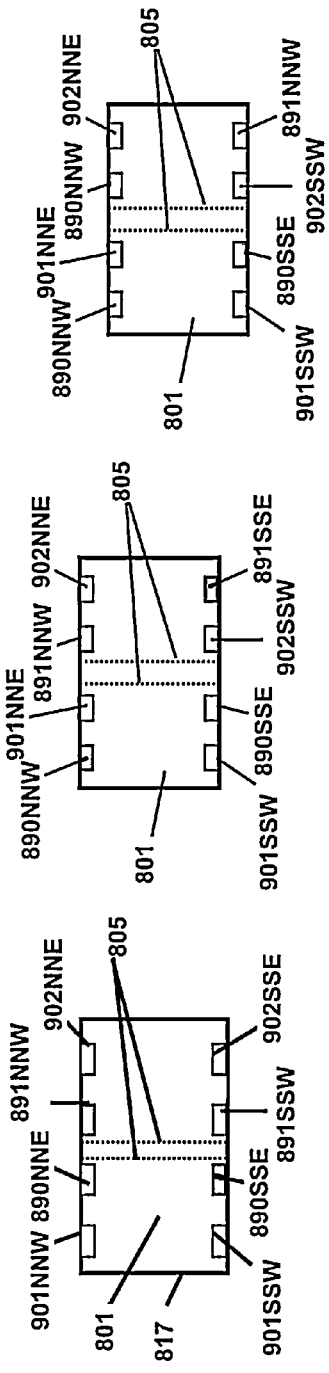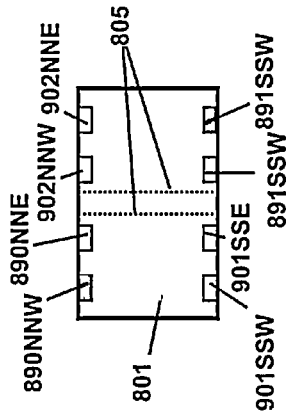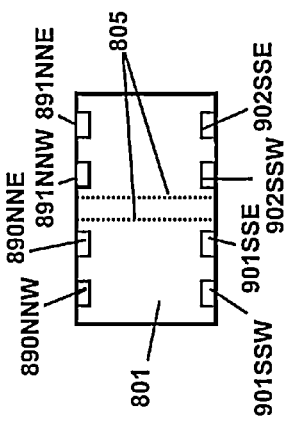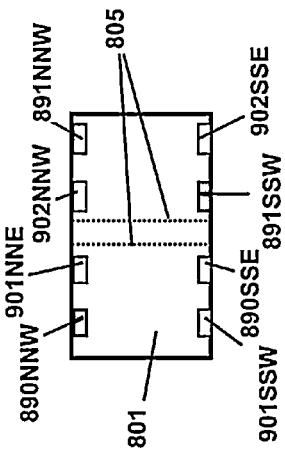

ARRANGEMENT FOR ENERGY CONDITIONING

CROSS REFERENCE TO RELATED APPLICATIONS

This application is a continuation of application Ser. No. 13/073,967, filed Mar. 28, 2011 now U.S. Pat. No. 8,018,706, which is a continuation of application Ser. No. 12/848,676, filed Aug. 2, 2010, now issued as U.S. Pat. No. 7,916,444, which is a continuation of application Ser. No. 12/554,976, filed Sep. 7, 2009, now issued as U.S. Pat. No. 7,768,763, which is a continuation of application Ser. No. 11/866,437, filed Oct. 3, 2007, now abandoned, which is a continuation of application Ser. No. 11/296,391, filed Dec. 8, 2005, now issued as U.S. Pat. No. 7,321,485, which is a continuation of application Ser. No. 10/189,339, filed Jul. 2, 2002, now issued as U.S. Pat. No. 7,110,235, which is a continuation-in-part of application Ser. No. 10/115,159, filed Apr. 2, 2002, now issued as U.S. Pat. No. 6,894,884, which is a continuation-in-part of application Ser. No. 09/845,680, filed Apr. 30, 2001, now issued as U.S. Pat. No. 6,580,595, which is a continuation-in-part of application Ser. No. 09/777,021, filed Feb. 5, 2001, now issued as U.S. Pat. No. 6,687,108, which is a continuation-in-part of application Ser. No. 09/632,048, filed Aug. 3, 2000, now issued as U.S. Pat. No. 6,738,249, which is a continuation-in-part of application Ser. No. 09/594,447, filed Jun. 15, 2000, now issued as U.S. Pat. No. 6,636,406, which is a continuation-in-part of application Ser. No. 09/579,606, filed May 26, 2000, now issued as U.S. Pat. No. 6,373,673, which is a continuation-in-part of application Ser. No. 09/460,218, filed Dec. 13, 1999, now issued as U.S. Pat. No. 6,331,926, which is a continuation of application Ser. No. 09/056,379, filed Apr. 7, 1998, now issued as U.S. Pat. No. 6,018,448, which is a continuation-in-part of application Ser. No. 09/008,769, filed Jan. 19, 1998, now issued as U.S. Pat. No. 6,097,581, which is a continuation-in-part of application Ser. No. 08/841,940, filed Apr. 8, 1997, now issued as U.S. Pat. No. 5,909,350;

and application Ser. No. 10/115,159, filed Apr. 2, 2002, now issued as U.S. Pat. No. 6,894,884, also claims the benefit of provisional Application No. 60/280,819, filed Apr. 2, 2001, and provisional Application No. 60/302,429, filed Jul. 2, 2001 and provisional Application No. 60/310,962, filed Aug. 8, 2001;

and application Ser. No. 10/189,339, filed Jul. 2, 2002, now issued as U.S. Pat. No. 7,110,235, also claims the benefit of provisional Application No. 60/302,429, filed Jul. 2, 2001, and provisional Application No. 60/310,962, filed Aug. 8, 2001, and provisional Application No. 60/349,954, filed Jan. 18, 2002, and provisional Application No. 60/388,388 filed Jun. 12, 2002.

Ser. No. 13/073,967, filed Mar. 28, 2011, Ser. No. 12/848,676, filed Aug. 2, 2010, now issued as U.S. Pat. No. 7,916,444, Ser. No. 12/554,976, filed Sep. 7, 2009, now issued as U.S. Pat. No. 7,768,763, Ser. No. 11/866,437, filed Oct. 3, 2007, now abandoned, Ser. No. 11/296,391, filed Dec. 8, 2005, now issued as U.S. Pat. No. 7,321,485, Ser. No. 10/115,159, filed Apr. 2, 2002, now issued as U.S. Pat. No. 6,894,884, Ser. No. 09/845,680, filed Apr. 30, 2001, now issued as U.S. Pat. No. 6,580,595, Ser. No. 09/777,021, filed Feb. 5, 2001, now issued as U.S. Pat. No. 6,687,108, Ser. No. 09/632,048 filed Aug. 3, 2000, now issued as U.S. Pat. No. 6,738,249, Ser. No. 09/594,447 filed Jun. 15, 2000, now issued as U.S. Pat. No. 6,636,406, Ser. No. 09/579,606 filed May 26, 2000, now issued as U.S. Pat. No. 6,373,673, Ser. No. 09/460,218 filed Dec. 13, 1999, now issued as U.S. Pat. No. 6,331,926, Ser. No. 09/056,379 filed Apr. 7, 1998, now issued as U.S. Pat. No. 6,018,448, Ser. No. 09/008,769 filed Jan. 19, 1998, now issued as U.S. Pat. No. 6,097,581, and Ser. No. 08/841,940 filed Apr. 8, 1997, now issued as U.S. Pat. No. 5,909,350, are each incorporated by reference herein.

In addition, U.S. Provisional Application No. 60/302,429, filed Jul. 2, 2001, U.S. Provisional Application No. 60/310,962, filed Aug. 8, 2001, U.S. Provisional Application No. 60/349,954, filed Jan. 18, 2002, and U.S. Provisional Application No. 60/388,388, filed Jun. 12, 2002, are each incorporated by reference herein.

TECHNICAL FIELD

This application relates to balanced shielding arrangements that use complementary relative groupings of energy pathways, such as pathways for various energy propagations for multiple energy conditioning functions. These shielding arrangements may be operable as discrete or non-discrete embodiments that can sustain and condition electrically complementary energy confluences.

BACKGROUND

Today, as the density of electronics within applications increases, unwanted noise byproducts of the increased density may limit the performance electronic circuitry. Consequently, the avoidance of the effects of unwanted noise byproducts, such as by isolation or immunization of circuits against the effects of the undesirable noise is an important consideration for circuit arrangements and circuit design.

Differential and common mode noise energy may be generated by, and may propagate along or around, energy pathways, cables, circuit board tracks or traces, high-speed transmission lines, and/or bus line pathways. These energy conductors may act as, for example, an antenna that radiates energy fields. This antenna-analogous performance may exacerbate the noise problem in that, at higher frequencies, propagating energy utilizing prior art passive devices may experience increased levels of energy parasitic interference, such as various capacitive and/or inductive parasitics.

These increases may be due, in part, to the combination of constraints resulting from functionally or structurally limitations of prior art solutions, coupled with the inherent manufacturing or design imbalances and performance deficiencies of the prior art. These deficiencies inherently create, or induce, unwanted and unbalanced interference energy that may couple into associated electrical circuitry, thereby making at least partial shielding from these parasitics and electromagnetic interference desirable. Consequently, for broad frequency operating environments, solving these problems necessitates at least a combination of simultaneous filtration, careful systems layout having various grounding or anti-noise arrangements, as well as extensive isolating in combination with at least partial electrostatic and electromagnetic shielding.

Thus, a need exists for a self-contained, energy-conditioning arrangement utilizing simplified energy pathway arrangements, which may additionally include other elements, amalgamated into a discrete or non-discrete component, which may be utilized in almost any circuit application for providing effective, symmetrically balanced, and sustainable, simultaneous energy conditioning functions selected from at least a decoupling function, transient suppression function, noise cancellation function, energy blocking function, and energy suppression functions.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts and in which:

FIG. 1 is a relative location compass operable for determining relative locations of the various pathway extensions disclosed;

FIGS. 1A-1C show relative locations of the various pathway extensions disclosed according to an aspect of the present invention;

FIG. 2A shows a circuit schematic of the plan view of an embodiment of 2B according to an aspect of the present invention;

FIG. 2B is a plan view of an embodiment according to an aspect of the present invention;

FIG. 3A shows a circuit schematic of the plan view of an embodiment of 3B according to an aspect of the present invention;

FIG. 3B is a plan view of an embodiment according to an aspect of the present invention;

FIG. 3C shows a plan view of a shield according to an aspect of the present invention;

FIG. 4A shows a relative plan view of an embodiment according to an aspect of the present invention;

FIG. 4B shows a relative plan view of an embodiment according to an aspect of the present invention;

FIG. 4C shows a relative plan view of an embodiment according to an aspect of the present invention;

FIG. 4D shows a relative plan view of an embodiment according to an aspect of the present invention;

FIG. 4E shows a relative plan view of an embodiment according to an aspect of the present invention;

FIG. 4F shows a relative plan view of an embodiment according to an aspect of the present invention;

FIG. 4G shows a relative plan view of an embodiment according to an aspect of the present invention;

FIG. 4H shows a relative plan view of an embodiment according to an aspect of the present invention;

FIG. 4I shows a relative plan view of an embodiment according to an aspect of the present invention;

DETAILED DESCRIPTION

Figure 5B:
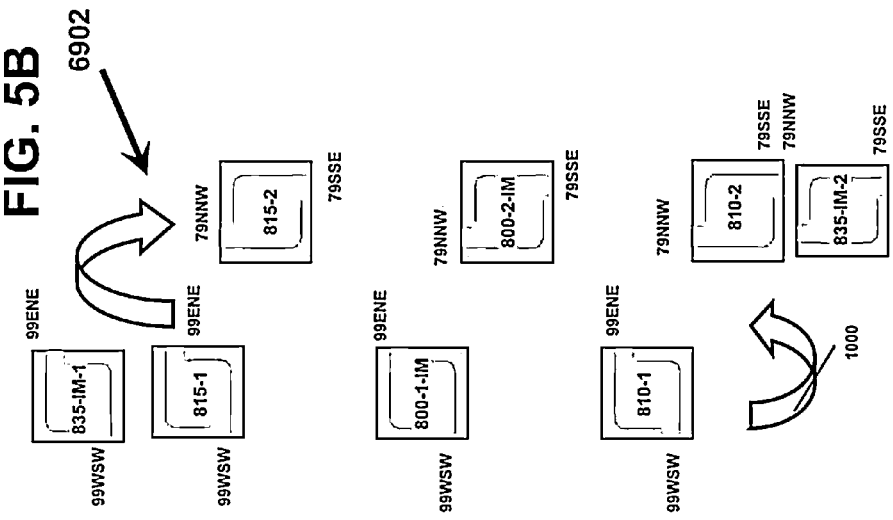
FIG. 5B shows a stacked shield according to an aspect of the present invention.

It is to be understood that the figures and descriptions of the present invention have been simplified to illustrate elements that are relevant for a clear understanding of the present invention, while eliminating, for the purpose of clarity, many other elements found in typical energy conditioning systems and methods. Those of ordinary skill in the art will recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art. Additionally, it will be apparent to those skilled in the art that terms used herein that may include a whole, or a portion of a whole, such as "energy", "system", circuit, and the like, are contemplated to include both the portions of the whole, and the entire of the whole, as used, unless otherwise noted.

As used herein, an "energy pathway" or "pathway" may be at least one, or a number, of conductive materials, each one operable for sustained propagation of energy. Pathways may be conductive, thereby better propagating various electrical energies as compared to non-conductive or semi-conductive materials directly or indirectly coupled to, or adjacent to, the pathways. An energy pathway may facilitate propagation of a first energy by allowing for various energy conditioning functions, such as conditioning functions arising due to any one or a number of aspects, such as, but not limited to, the shielding, the orientation and/or the positioning of the energy pathways within the energy pathway arrangement, which various arrangements having an orientation and/or positioning thereby allow for interaction of the first energy with propagating energies that are complementary to at least the first energy. An energy pathway may include an energy pathway portion, an entire energy pathway, a conductor, an energy conductor, an electrode, at least one process-created conductor, and/or a shield. A plurality of energy pathways may include a plurality of each device or element discussed hereinabove with respect to energy pathway. Further, as used generally herein, a conductor may include, for example, an individual conductive material portion, a conductive plane, a conductive pathway, a pathway, an electrical wire, a via, an aperture, a conductive portion such as a resistive lead, a conductive material portion, or an electrical plate, such as plates separated by at least one medium 801, for example.

A shield may include a shielding electrode, a shielding pathway portion, a shielded pathway, a shielded conductor, a shielded energy conductor, a shielded electrode, and/or at least one process-created shielded pathway portion. A plurality of shields may include a plurality of the devices discussed hereinabove with respect to a shield.

As used generally herein, a pathway may be complementary positioned, or complementary orientated, with respect to a main-body 80, 81, having various pathway extensions, designated 79"X", 81"X", 811"X" and 99"X". Main-bodies 80, 81 may be in three-dimensional physical relationships individually, in pairs, groups, and/or pluralities as to distance, orientation, position, superposition, non-superposition, alignment, partial alignment, lapping, non-lapping, and partial lapping. Superposed main-body pathway 80, may, for example include a pairing of physically opposing and oppositely orientated main-body pathways 80 that are any one of, or any combination of, electrically null, electrically complementary, electrically differential, or electrically opposite.

A pathway arrangement may include at least a shield at least partially shielding at least one energy pathway, or a group of shields forming a shield structure that at least partially shielding, via a conductive shielding, at least a conductively isolated pairing of at least two energy pathways, such as vias, apertures or complementary paired pathways.

An exemplary embodiment may allow energy propagation on a conductively isolated pairing, such as complementary paired pathways, causing energy propagation on common shields, or at least one grouping of shields, serving an isolated circuit. This embodiment may allow a low inductance pathway to form among at least a single pair of isolated and separate parallel pathways serving at least one separate and distinct isolated circuit system. An exemplary embodiment may allow for the development of at least a low inductance pathway for utilization of energy propagating on at least one parallel pathway of at least two sets of isolated and separate parallel pathways and the development along at least one parallel pathway of at least one other low inductance pathway for utilization of energy propagating along at least one other separate and distinct isolated circuit system.

An exemplary embodiment utilized as part of a circuit assembly may have at least one pathway of relatively lower inductance, while other pathways may be electrically coupled to an energy source or an energy load. A pathway of a second plurality of pathways may have a lower impedance operable for portions of energy to be taken away from either of the same at least one energy source or at least one energy load of the circuit assembly. This same pathway of low impedance may not be electrically directly coupled to either the same at least one energy source or at least one energy load of the circuit assembly as the one pathway of lower inductance. A system may have both a pathway of least inductance and a pathway of least impedance which are not the same pathway.

In contrast to capacitors found in the industry wherein an equivalent series inductance (ESL) of a capacitor device is normally size dependant, in the present invention the pathway of least impedance and the pathway of least inductance for a circuit for energy conditioning may be achieved independent of the physical size of the device. These aspects depend on a predetermined capacitance developed by a predetermined layers in the present invention.

Arranging the pathways allows the resistance of the conductive material of the pathways to primarily determine the energy delivery, or relative efficiency or effect between at least one source of energy and one energy utilizing load of an integrated circuit, for example. The ESL may be a negligible factor, rather than a primary factor for delivery outcome or decoupling void of debilitating inductances.

In an illustrative pathway arrangement illustrated in FIGS. 1A, 1B, 1C, 5A and 5B, wherein the various propagating energies may be complementary, the pathway arrangement, upon placement into a circuit arrangement, may allow for energy propagation within or along certain energy pathways of the pathway arrangement, thereby allowing for the mutual interaction of opposite portions of pathway-sourced magnetic fields produced by the propagation of energy field currents emanating outwardly from each set of the complementary conductors. This mutual interaction may be a mutual cancellation in embodiments wherein certain pathways may be partially or totally physically shielded from other complementary pathways, and may be placed within an influencing distance of those other complementary pathways. Further, a substantial similarity in size and shape of the respective complementary pathways, including the spaced-apart relationship and the interpositioning of a shielding between pathways, and the conductively isolated relationship of the pathways, may contribute to this mutual cancellation effect. Additionally, the shielding operations may be predicated on a relative positioning of a mating of the paired pathways relative to the conductive electrostatic shielding. At least the complementary energy conditioning functions and electrostatic shielding dynamics discussed herein may operate on various energy propagating in various directions along various predetermined pathways, and may operate on circuits having dynamic operation utilizing the pathway arrangement.

A sub-combination of electromagnetically/electrostatically actuated impedance states may develop along or within a pathway arrangement, or along or within a closely coupled external conductive portion conductively coupled to separate or multiple groupings of shields, to thereby form an energy conditioning circuit. These electromagnetically/electrostatically actuated impedance states may develop, for example, because of the energization of one paired set of pathways of one circuit portion, but not necessarily develop on another paired set of pathways from another circuit portion, for example.

According to an aspect of the present invention, each shield may include a main-body 81. Main-bodies 81 may collectively and conductively couple to one another and at the same time may substantially immure and shield the main-body 80 of the energy pathways. In other embodiments of the present invention, the collective shielding main-body 81 may only partially immure or shield the pathway main-body 80s in at least one portion of the shielding.

According to an aspect of the present invention, a balanced, symmetrical, pathway arrangement may result from the symmetry of certain superposed shields, from complementary pathway sizing and shaping, and/or from reciprocal positioning and pairing of the complementary pathways. Manufacturable balanced or symmetrical physical arrangements of pathways, wherein dynamic energy propagation, interactions, pairings or match-ups of various dynamic quantities occur, may operate at less than a fundamental limit of accuracy of testing equipment. Thus, when portions of these complementary energy quantities interact simultaneously, the energy may be beyond the quantifiable range of the typical testing equipment. Thus, the extent to which the measurement may be obtained may employ increased controllability, and thereby the electrical characteristics and the effect on electrical characteristics may be controlled, such as by predetermining the desired measurability, behavior or enhancement to be provided, and by a correspondent arrangement of the elements, such as specifically by an arrangement of the elements to provide the desired measurability or effect. For example, a desired electrical characteristic may be predetermined for a desired enhancement by varying at least a portion of the complementary balance, size, shape, and symmetry of at least one pathway pairing, as set forth herein below and as illustrated in FIGS. 1A, 1B, 1C, 5A and 5B, for example.

Thus, the extent of energy interactions, mutual energy propagation timings and interferences, for example, may be controlled by tolerances within the pathway arrangement. A manufacturing process, or computer tolerance control, such as semiconductor process control, may control these tolerances, for example. Thus, the pathways of an embodiment may be formed using manufacturing processes, such as passive device processes, apparent to those skilled in the art. Mutual energy propagation measurements may thereby be cancelled or suppressed by the formation, and process of formation, of the pathway arrangement.

A pathway arrangement may, as set forth hereinabove, include a sequentially positioned grouping of pathways in an amalgamated electronic structure having balanced groupings of pathways. The balanced grouping may include a predetermined pathway architecture having a stacked hierarchy of pathways that are symmetrical and complementary in number, and that are positioned complementary to one another, thereby forming pairs, each of which pair is substantially equidistant from each side of a centrally positioned shield, wherein each shield may provide a symmetrical balancing point for both each pair pathway and the overall pathway hierarchy as depicted in FIGS. 1A to 4I, for example. Thus, predetermined identically sized, shaped and complementary positioned pathways may be present on either side of a centrally positioned shield for each separate circuit portion. A total circuit may have its complementary portions symmetrically divided into a complementary physical format including a reverse-mirror image positioning of paired shielded, complementary sized and shaped pathways, sandwiching at least one interposing shield.

According to an aspect of the present invention, each pathway may be, for example, a first interconnect substrate wrapping around, or holding, an integrated circuit wafer, a deposit, an etching, or a resultant of a doping process, and the shield may be, for example, a pathway substrate, an energy conditioning embodiment or energy conditioning substrate, a deposit, an etching, a resultant of a doping process, and may have, for example, resistive properties. Additional elements may be utilized, including conductive and nonconductive elements, between the various pathways. These additional elements may take the form of ferromagnetic materials or ferromagnetic-like dielectric layers, and/or inductive-ferrite dielectric derivative materials. Additional pathway structural elements may be utilized, including conductive and nonconductive multiple pathways of different conductive material compositions, conductive magnetic field-influencing material hybrids and conductive polymer sheets, various processed conductive and nonconductive laminates, straight conductive deposits, multiple shielding pathways utilizing various types of magnetic material shields and selective shielding, and conductively doped and conductively deposited on the materials and termination solder, for example, in addition to various combinations of material and structural elements, to provide a host of energy conditioning options.

Non-conductor materials may also provide structural support of the various pathways, and these non-conductor materials may aid the overall energized circuit in maintaining the simultaneous, constant and uninterrupted energy propagation moving along the pathways. Dielectric materials for example, may include one or more layers of material elements compatible with available processing technology. These dielectric materials may be a semiconductor material such as silicon, germanium, gallium arsenide, or a semi-insulating and insulating material such as, but not limited to any K, high K and low K dielectrics.

Pathway and conductor materials may be selected from a group consisting of Ag, Ag/Pd, Cu, Ni, Pt, Au, Pd and other such conductive materials and metals. Combinations of these metal materials are suitable for the purposes discussed herein, and may include appropriate metal oxides, such as ruthenium oxide, which, depending on the exigencies of a particular application, may be diluted with a suitable metal. Other pathways may be formed of a substantially non-resistive conductive material. Any substances and processes that may create pathways from conductive, non-conductive, semi-conductive material, and/or Mylar films printed circuit board materials, or any substances or processes that may create conductive areas such as doped polysilicons, sintered polycrystallines, metals, polysilicon silicates, or polysilicon silicide may be used within or with the pathway arrangement.

An exemplary embodiment of the present invention may utilize an internal shield structural architecture to insure energy balancing configurations within the various arrangements, rather than a specific external circuit balance. This balancing configuration is dependent upon the relative positioning of all the shields in relationship to the shared and centrally positioned shield, and the actual paired shields positioned in specific quantities, to simultaneously provide shielding for the electrically opposing shielded paired pathways utilized by propagating energy. This allows these electrically opposing complementary pathways to be located both electrically and physically on the opposite sides of the centrally positioned and shared common conductive shield. This interposition of the central and shared shields may create a voltage divider that divides various circuit voltages in half and that provides, to each of the oppositely paired shielded conductors, one half of the voltage energy normally expected. The energized circuitry, including shielded conductors, may be balanced electrically or in a charge-opposing manner and with respect to a centrally positioned shield, to a common and shared pathway, or to each respective, isolated circuit system portion. Each common circuit member of an isolated circuit system may be attached or coupled to a common area or common pathway, thereby providing an external common zero voltage. Thus, the embodiment may have multiple sets of shields electrically or physically located between at least one of the various electrically or charge opposing, shielded pairs or grouped complementary pairs of pathways in an interposed shielding relationship, supported with additional outer sandwiching shields, designated herein as—IM that are additionally coupled and, in part, form the shielding structure.

An exemplary embodiment may also be placed into one or more energy circuits that utilize different energy sources and that may supply one or more separate and distinct energy-utilizing loads. When energized for multiple energy conditioning operations and for providing simultaneous and effective energy conditioning functions, such as electromagnetic interference filtering, suppression, energy decoupling and energy surge protection, each separate and distinct circuit is utilizing the multiple commonly shared universal shield structure and circuit reference image, or node.

According to an aspect of the present invention, energy-conditioning functions may maintain an apparent balanced energy voltage reference and energy supply for each respective energy-utilizing load within a circuit. This energized arrangement may allow for specific energy propagation utilizing a single, or multiple, isolated pathway arrangement, and may not require balancing on a single, centralized shield. A shield may be physically and electrically located between one or multiple energy sources and one or multiple energy utilizing loads, depending upon the number of separate and isolated pathways. Thus shielding relative, centralized pathways may be in both co-planar and stacked variants of exemplary embodiment.

When the internally positioned paired shielded pathways are subsequently attached, or conductively coupled, to externally manufactured pathways, the internally positioned paired shields may be substantially enveloped within the cage-like shield structure, thereby minimizing internally generated energy strays and parasitics that may normally escape or couple to an adjacent shielded pathway. These shielding modes utilize propagating energy to the various pathways and may be separate of the electrostatic shield effect created by the energization of the shield structure. The propagating energy propagating in a complementary manner provides energy fields of mutually opposed, mutually cancelled fields as a result of the close proximity of opposite propagation. The complementary and paired pathways may provide an internally balanced opposing resistance load function.

A device according to an aspect of the present invention may mimic the functionality of at least one electrostatically shielded transformer. Transformers may be widely used to provide common mode isolation dependent upon a differential mode transfer across the inputs in order to magnetically link the primary windings to the secondary windings to transfer energy. As a result, common mode voltage across the primary winding is rejected. One flaw inherent in the manufacturing of transformers is the propagating energy source capacitance between the primary and secondary windings. As the frequency of the circuit increases, so does capacitive coupling, until circuit isolation may be compromised. If enough parasitic capacitance exists, high frequency RF energy may pass through the transformer and cause an upset in the circuits on the other side of the isolation gap subjected to the transient event. A shield may be provided between the primary and secondary windings by coupling to a common pathway reference source designed to prevent capacitive coupling between the multiple sets of windings. A device according to an aspect of the present invention improves upon, and reduces the need for, transformers in circuits. The device may use a physical and relative, common pathway shield to suppress parasitics and also may use relative positioning of common pathway shields, a complementary paired pathway layering, the various couplings of the pathway layering, and an external conductive coupling to a conductive area per isolated circuit system, in combination with the various external circuitry, to effectively function as a transformer. If an isolated circuit system is upset by transients, the electrostatically shielded, transformer function of the device discussed herein may be effective for transient suppression and protection, and may simultaneously operate as a combined differential mode and common mode filter. Each set of relative shields and relative conductors may be conductively coupled to at least the same external pathway to provide a transformer functionality for example.

Propagated electromagnetic interference may be the product of both electric and magnetic fields. A device according to an aspect of the present invention may be capable of conditioning energy that uses DC, AC, and AC/DC hybrid-type propagation, including conditioning energy in systems that may contain different types of energy propagation formats and in systems that may contain more than one circuit propagation characteristic.

In an exemplary embodiment, perimeter conductive coupling material for coupling or connecting, by conductive joining, of external portions of a typical embodiment into an assembly may be accomplished by conductive or non-conductive attachments to various types of angled, parallel or perpendicular, as those terms apply relative to at least another pathway, conductors known as apertures or blind or non-blind VIAs, passing through, or almost through, portions respectively of an exemplary embodiment. Couplings to at least one or more load(s), such as a portion of an integrated circuit, for one aspect of the invention may involve a selective coupling, or not, to these various types of conductors, such as apertures and VIAs.

Fabricating a pathway may include forming one or more plated through hole (PTH) via(s) through one or more levels of a pathway. Electronic packages commonly include multiple interconnect levels. In such a package, the invention may include layerings of patterned conductive material on one interconnect level that may be electrically insulated from patterned conductive material on another interconnect level, such as by dielectric material layers.

Connections or couplings between the conductive material at the various interconnect levels may be made by forming openings, referred to herein as vias or apertures, in the insulating portions or layers, that in turn can provide an electrically conductive structure such that the patterned or shaped conductive material portions or pathways from different levels are brought into electrical contact with each other. These structures can extend through one or more of the interconnect levels. Use of conductive, non-conductive or conductively-filled apertures and VIAs allows propagating energy to transverse an exemplary embodiment as if utilizing a by-pass or feed-through pathway configuration of an embodiment. An embodiment may serve as a support, a system or a subsystem platform that may contain both or either active and passive components layered to provide the benefits described for conditioning propagated energy between at least one source and at least one load.

An aspect of the present invention may provide a conductive architecture or structure suitable for inclusion in a packaging or an integrated circuit package having other elements. Other elements may be directly coupled to the device for simultaneous physical and electrical shielding by allowing simultaneous energy interactions to take place between grouped and energized complementary conductors that are fed by other pathways. Typical capacitive balances found between at least one shielding pathway may be found when measuring opposite sides of the shared shield structure per isolated circuit, and may be maintained at measured capacitive levels within this isolated circuit portion, even with the use of common non-specialized dielectrics or pathway conductive materials. Thus, complementary capacitive balancing, or tolerance balancing characteristics, of this type of electrical circuit due to element positioning, size, separations and attachment positioning allow an exemplary embodiment having an isolated circuit system manufactured at 3% capacitive tolerance, internally, to pass to a conductively coupled and energized isolated circuit system a maintained and correlated 3% capacitive tolerance between electrically opposing and paired complementary pathways of each respective isolated circuit system, with respect to the dividing shield structures placed into the isolated circuit system.

An exemplary embodiment may allow utilization of relatively inexpensive dielectrics, conductive materials and various other material elements in a wide variety of ways. Due to the nature of the architecture, the physical and electrical dividing structure created may allow the voltage dividing and balancing among the grouped, adjacent elements, and may allow for the minimization of the effect of material hysteresis and piezoelectric phenomenon to such a degree that propagating energy normally disrupted or lost to these effects may be essentially retained in the form of active component switching response time, as well as instantaneous ability to appear to the various energy-utilizing loads as an apparent open energy flow simultaneously on both electrical sides of a pathway connecting or coupling from an energy source to a respective load, and from the load back to the source.

A structured layer may be shaped, buried within, enveloped by, or inserted into various electrical systems and subsystems to perform line conditioning or decoupling, for example, and to aid in or to allow for a modifying of an electrical transmission of energy to a desired or predetermined electrical characteristic. Expensive, specialized, dielectric materials that attempt to maintain specific or narrow energy conditioning or voltage balancing may no longer be needed for bypass, feed through, or energy decoupling operations for a circuit.

A device according to an aspect of the present invention may, as set forth hereinabove, be placed between each isolated circuit and a paired plurality of pathways or differential pathways. This exemplary device may operate effectively across a broad frequency range, as compared to a single discrete capacitor or inductor component, and may continue to perform effectively within an isolated circuit system operating beyond, for example, a GHz.

As set forth hereinabove, the exemplary device may perform shielding functions in this broad frequency range. A physical shielding of paired, electrically opposing and adjacent complementary pathways may result from the size of the common pathways in relationship to the size of the complementary pathways, and from the energized, electrostatic suppression or minimization of parasitics originating from the sandwiched complementary conductors and preventing external parasitics. Further, the positioning of the shielding, relative to shielding that is more conductive, may be used to protect against inductive energy and "H-Field" coupling. This technique is known as mutual inductive cancellation.

Parasitic coupling is known as electric field coupling. The shielding function discussed hereinabove provides primary shielding of the various shielded pathways electrostatically against electric field parasitics. Parasitic coupling involving the passage of interfering propagating energy because of mutual or stray parasitic energy originating from the complementary conductor pathways may be thereby suppressed. A device according to an aspect of the present invention may, for example, block capacitive coupling by enveloping oppositely phased conductors in the universal shield architecture with stacked conductive hierarchical progression, thereby providing an electrostatic or Faraday shield effect with respect to the pathway positioning as to the respective layering and position, both vertically and horizontally, of the pathways. The shielding pathway architecture may be used to suppress and prevent internal and external parasitic coupling between potentially noisy conductors and victim conductors, such as by an imposition of a number of common pathway layers that are larger than the smaller paired complementary pathways, but that are positioned between each of the complementary pathway conductor pairs to suppress and to contain the stray parasitics.

Further, as set forth hereinabove, positioning of the shielding, relative to shielding that is more conductive, may be used against inductive energy and "H-Field" coupling. This cancellation is accomplished by physically shielding energy, while simultaneously using a complementary and paired pathway positioned to allow for the insetting of the contained and paired complementary pathways within an area size correspondent to the shield size. A device according to an aspect of the present invention is adapted to use shields separately as internal shields or groupings, thereby substantially isolating and sandwiching pairs of electrically opposing complementary pathways, and thereby providing a physically tight or minimized energy and circuit loop propagation path between each shield and the active load. Close proximity of shields and non-shields may allow energy along shields even if a direct electrical isolation exists because of 801 material type or the spacing.

Flux cancellation of propagating energy along paired and electrically opposing or differential pathways may result from spacing of pathways apart by a very small distance for oppositely phased electrically complementary operations, thereby resulting in a simultaneous stray parasitic suppression and containment function attributable to tandem shielding, and thereby enhancing energy conditioning.

In attaining minimum areas for various current loops in an isolated circuit system, additional shielding energy currents may be distributed around component shielding architectures. A plurality of shields as described hereinabove may be electrically coupled as either an isolated circuit's reference node, or chassis ground, and may be relied on as a commonly used reference pathway for a circuit. Thus, the various groups of internally paired, complementary pathways may include propagating energy originating from one or more energy sources propagating along external pathways coupled to the circuit by a conductive material. Energy may thus enter the device, undergo conditioning, and continue to each respective load.

The shielding structure may allow for a portion of a shield to operate as the pathway of low impedance for dumping and suppressing, as well as at least partially blocking return of unwanted electromagnetic interference noise and energy into each of the respective energized circuits. In an embodiment, internally located shields may be conductively coupled to a conductive area, thereby adaptively utilizing shielding structure for low impedance dumping and suppressing and at least partially blocking return blocking of unwanted electromagnetic interference noise and energy. Additionally, another set of internally located shields may be conductively coupled to a second conductive area, thereby utilizing shields for low impedance dumping, suppressing and at least partially blocking the return of unwanted electromagnetic interference noise and energy. The conductive areas may be electrically or conductively isolated from one another.

Simultaneous suppression of energy parasitics may be attributed to the enveloping shielding pathway structure, in combination with the cancellation of mutually opposing energy fields, and may be further attributed to the electrically opposing shielded pathways and propagating energy along the various circuit pathways interacting within the various isolated circuits to undergo a conditioning effect taking place upon the propagating energy. This conditioning may include minimizing effects of H-field energy and E-field energy through simultaneous functions, such as through isolated circuits that contain and maintain a defined electrical area adjacent to dynamic simultaneous low and high impedance pathways of shielding in which various paired pathways have their respective potentials respectively switching as a result of a given potential located on a shielding and used instantaneously and oppositely by these pairings with respect to the utilization by energy found along paired routings of the low and high impedance shields.

The various distance relationships created by the positional overlapping of energy routings within the isolated circuits combine with the various dynamic energy movements to enhance and cancel the various degrees of detrimental energy disruptions normally occurring within active components or loads. The efficient energy conditioning functions occurring within the passive layering architecture allow for development of a dynamic "0" impedance energy "black hole", or energy drain, along a third pathway coupled common to both complementary pathways and adapted to allow energy to be contained and dissipated upon the shielding, within the various isolated circuits and attached or conductively coupled circuits. Thus, electrically opposing energies may be separated by dielectric material and/or by an interposition shield structure, thereby allowing dynamic and close distance relationship within a specific circuit architecture, and thereby taking advantage of propagating energy and relative distances to allow for exploitation of mutual enhancing cancellation phenomenon and an electrostatic suppression phenomenon to exponentially allow layered conductive and dielectric elements to become highly efficient in energy handling ability.

According to an aspect of the present invention, a device may utilize a single low impedance pathway or a common low impedance pathway as a voltage reference, while utilizing a circuit maintained and balanced within a relative electrical reference point, thereby maintaining minimal parasitic contribution and disruptive energy parasitics in the isolated circuit system. The various attachment schemes described herein may allow a "0" voltage reference, as discussed hereinabove, to develop with respect to each pair or plurality of paired complementary conductors located on opposite sides of the shared central shield, thereby allowing a voltage to be maintained and balanced, even with multiple Simultaneous Switching Operations states among transistor gates located within an active integrated circuit, with minimal disruptive energy parasitics in an isolated circuit.

Shields may be joined using principals of a cage-like conductive shield structure to create one or more shieldings. The conductive coupling of shields together with a larger external conductive area may suppress radiated electromagnetic emissions and as a larger area provides a greater conductive area in which dissipation of voltages and surges may occur. One or more of a plurality of conductive or dielectric materials having different electrical characteristics may be maintained between shields. A specific complementary pathway may include a plurality of commonly conductive structures performing differentially phased conditioning with respect to a "mate", or paired, plurality of oppositely phased or charged structures forming half of the total sum of manufactured complementary pathways, wherein one half of the complementary pathways forms a first plurality of pathways, and wherein the second half forms a second plurality of pathways. The sum of the complementary pathways of the first and the second plurality of pathways may be evenly separated electrically, with an equal number of pathways used simultaneously, but with half the total sum of the individual complementary pathways operating from, for example, a range of 1 degree to approximately 180 degrees electrically out of phase from the oppositely positioned groupings Small amounts of dielectric material, such as microns or less, may be used as the conductive material separation between pathways, in addition to the interposing shield, which dielectric may not directly physically or conductively couple to any of the complementarily operating shielded pathways.

An external ground area may couple or conductively connect as an alternative common pathway. Additional numbers of paired external pathways may be attached to lower the circuit impedance. This low impedance phenomenon may occur using alternative or auxiliary circuit return pathways.

A shield architecture may allow shields to be joined together, thereby facilitating energy propagation along a newly developed low impedance pathway, and thereby allowing unwanted electromagnetic interference or noise to move to this created low impedance pathway.

Figure 5A:
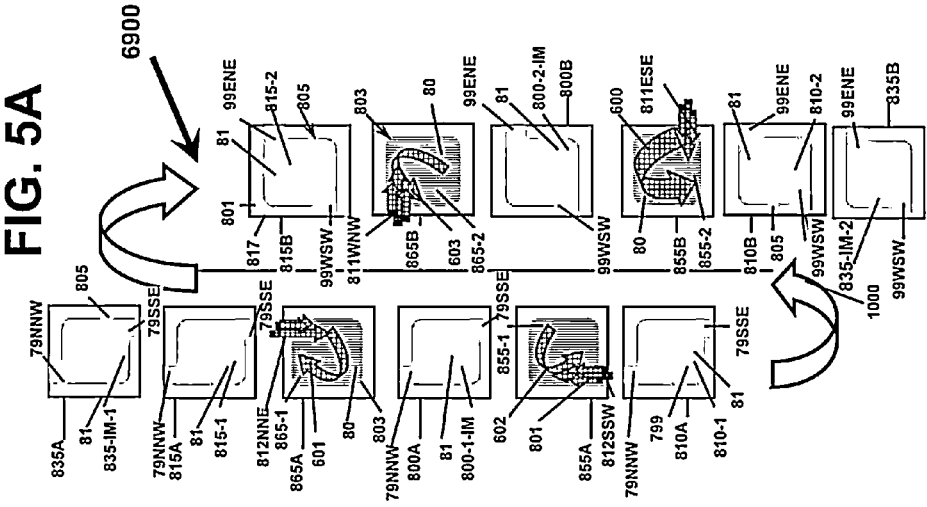
FIG. 5A shows a stacked multiple, circuit network including groups of pathways according to an aspect of the present invention.

Referring now to FIG. 1A through FIG. 5B, which generally show various common principals of both common and individual variants of an exemplary embodiment configured in a co-planar variant (FIGS. 1A-4I) and a stacked variant (FIGS. 5A and 5B).

In FIG. 1A, there are shown relative locations of the various pathway extensions disclosed according to an aspect of the present invention. A portion of a relative balanced and complementary-symmetrical arrangement utilizing a center shielding pathway designated 8"XX"-"X"M is adapted in the arrangement as the fulcrum of balanced conductive portions in a co-planar variant. A pathway arrangement including at least a first and a second plurality of pathways, wherein the first plurality has at least one pair of pathways arranged electrically isolated from each other and orientated in a first complementary relationship, is illustrated. Additionally, at least a first half of the second plurality is arranged electrically isolated from a second half of the second plurality, wherein at least two pathways of the second plurality are electrically isolated from the pathways of first plurality. The pathway arrangement may also include a material having properties, such as dielectric, ferromagnetic, or varistor for example, spacing apart pathways of the pathway arrangement. The pathways of the first half of the second plurality are electrically coupled to one another, and the pathways of the second half of the second plurality are electrically coupled to one another. A total number of pathways of the first half of the second plurality may be an odd number greater than one, and a total number of pathways of a second half of the second plurality may also be an odd number greater than one. According to an aspect of the present invention, the pathways of the first half of the second plurality are positioned in a first superposed alignment, while the pathways of the second half of the second plurality are positioned in a second superposed alignment, with the first and second superposed alignments in a mutual superposed alignment herein defined as a co-planar arrangement.

In a non co-planar arrangement, the pathways of the first half of the second plurality may be positioned in a first superposed alignment, and the pathways of the second half of the second plurality may be positioned in a second superposed alignment, with the first and second superposed alignments in arrangement one atop the other. In one arrangement, at least four pathways are electrically isolated.

An illustrative embodiment of the present invention may include at least three pluralities of pathways, including a first plurality of pathways and a second plurality of pathways. The first and second pluralities of pathways may include pathway members of the first plurality having an equal and opposite pathway member found in the second plurality of pathways. Members of the first and second pluralities of pathways may be substantially the same size and shape, and may be positioned complementary, and may also operate in an electrically complementary manner. Thus, the pairings of the first and second pluralities of pathways may result in identical numbers of members of the first and second pluralities of pathways. An exemplary embodiment may provide at least a first and a second shield allowing for development of individual isolated low circuit impedance pathways. Structurally, the shields may be accomplished by a third plurality of pathways and a fourth plurality of pathways. Each shielding plurality may include shields of equal size and shape. Each of the third and fourth plurality of pathways may be conductively coupled. Conductive coupling may be accomplished by a variety of methods and materials known to those possessing an ordinary skill in the pertinent arts. Thus, when the third and a fourth plurality are grouped as two sets of shields utilizing the first and second plurality receiving shielding, the third and fourth pluralities may be coupled to a common pathway to develop a low circuit impedance pathway for energy propagation for conditioning of the circuit energy.

Pathways may additionally be arranged in a bypass arrangement, such that when placed face to face, main-body pathways 80 may be aligned superposed, with the exception of any pathway extensions such as 812NNE, 811NNE, 812SSW and 811SSW of the lower sub-circuit portion, for example, shown as mirror images depicted in FIG. 5A and FIG. 5B, for example.

Within the pluralities, individual pathway members may be of substantially the same size and shape and may be conductively coupled. However, individual pathway members of one plurality may not be conductively coupled to members of a different plurality of pathways. There may be situations wherein members of one plurality may be connected to members of a different plurality, such as wherein a first plurality of shields and a second plurality of shields are externally coupled to the same conductor.

Common elements may include energy flow in accordance with conceptual energy indicators 600, 601, 602, 603 depicting the dynamic energy movements in co-planar shielded by-pass pathways, such as those shown in FIG. 1A-1C. An embodiment may provide for at least multiple shields for development of multiple isolated low circuit impedance pathways for multiple circuits.

Referring still to FIG. 1A, pathways may be shielded by the relative, common pathways, and may include a main-body pathway 80 with at least one pathway extension 812"X". The shields shown include a main-body shield pathway 81 with at least one pathway extension designated 99"X"/79"X'. The shields may sandwich and envelope the main-body 799, including a conductive inner pathway formed of conductive materials from the family of noble or base metals traditionally used in co-fired electronic components or conductive material, such as Ag, Ag/Pd, Cu, Ni, Pt, Au, Pd, or combination materials such as metal oxide and glass frit. A capacitance and a resistance value may be achieved in one family of pathways, as described hereinabove, such as by use of ruthenium oxide as the resistive material and Ag/Pd as the conductive material. Further, variations in pathway geometry may yield different resistance and capacitance values. Variations may be achieved by altering the materials from which the pathways are made. For example, a conductive metal, such as silver, may be selectively added to the metal oxide/glass frit material to lower the resistance of the material.

A plurality of pathways, 865-1 and 865-2, are shown positioned co-planar and spaced apart on a same portion of material 801. Each pathway of the co-planar pathways 865-1 and 865-2, may be formed of conductive material 799, or a hybrid of conductive material and another material, herein designated as 799"x". Each co planar pathway 865-1 and 865-2 may also be formed as a bypass pathway, wherein each pathway includes a main-body pathway 80 having a corresponding main-body edge and perimeter, 803A and 803B, respectively and at least one pathway contiguous extension 812"X". Each co-planar pathway 865-1 and 865-2, may include at least one pathway contiguous extension 812SSW and 811SSW with a portion of the main-body edge 803A and 803B extending therefrom. Extension 812"X" is a portion of the pathway material formed in conjunction with a main-body pathway 80 from which it extends. Main-body pathway 80, an 812"X" may be found as an extension of material 799 or 799"x" extending beyond an accepted average perimeter edge 803"X". Extensions 812"X" and 79"X" may be found respectively positioned as a contiguous portion of the pathway from which it is formed. Each main-body pathway may have edge 803A, 803B positioned relative and spaced apart a distance 814F from the embodiment edge 817. Embodiment edge 817 may include a material 801. Co-planar main-body pathway's edge 803"x" may be positioned and spaced apart a distance 814J. Pathway extensions 812SSW and 811SSW may conductively couple a respective pathway main-body 80 to an outer pathway 890SSW and 891SSW, which may be positioned at edge 817. The co-planar arranged, main-body pathway 80 may be positioned "sandwiched" between the area of registered coverage of two layering of co-planar, main-body pathway 81s.

Combining mutually opposing fields causes a cancellation or minimization effect. The closer the complementary, symmetrically oriented shields, the better the resulting mutually opposing cancellation effect on opposing energy propagation. The more superposed the orientation of the complementary, symmetrically oriented shields is, the better the resulting suppression of parasitics and cancellation effect.

Referring still to FIG. 1A, the edges of the plurality of co-planar shields may be represented by dotted lines 805A and 805B. Main-body pathways 81 of each of the plurality of shields are larger than a sandwiching main-body pathway 80 of any corresponding sandwiched pathway. This may create an inset area 806 relative to the positions of the shields and remaining pathways. The size of main-bodies 80 and 81 may be substantially similar, and thus the insetting positioning relationships may be minimal in certain embodiments. Increased parasitic suppression may be obtained by insetting pathways, including a main-body 80, to be shielded by larger pathway main-body 81s. For example, an inset of a main-body 80 of pathways 865-1 inset may be separated a distance of 1 to 20+ times the spacing provided by the thickness of the material 801 separating pathway 865-1 and adjacent center co-planar pathway 800-1-IM, as illustrated in FIG. 1B. Plurality of co-planar shield edges 805A and 805B may be positioned and spaced apart a distance 814K, and may be a distance 814 relative to edges 805A and 805B and the edge 817. Other distances 814J relative from either edges 803A and 803B may be provided. Further, distance 814F may be present between one 803"X" and an edge 817. Each co-planar shield may include a plurality of contiguous pathway extension portions, such as, for example, portions 79NNE, 79SSE, 99NNE and 99SSE, extending from the plurality of co-planar shield edges 805A and 805B. Plurality of co-planar shields may include a plurality of outer pathway material 901NNE, 901SSE, 902NNE and 902SSE positioned at the edge 817. Conceptual energy indicators 602 represent the various dynamic energy movements within the co-planar pathways 865-1 and 865-2. Unwanted energy may be transferred to the co-planar shields in accordance with the provision by the shields providing for a low impedance pathway, which shields may additionally be electrically coupled to another pathway or conductive area.

Referring now to FIGS. 1B and 1C, layer sequences are illustrated for a first plurality of co-planar pathways 865-1, 865-2, a second plurality of co-planar pathways 855-1, 855-2, and a third plurality of co-planar pathways 825-1-IM, 825-2-IM, 815-1, 815-2, 800-1-IM, 800-2-IM, 810-1, 810-2, and 820-1-IM, 820-2-IM. The first, second, and third pluralities may be stacked to form an embodiment 3199, 3200, 3201. The third plurality of co-planar pathways may provide shielding. Main-bodies 81 of the plurality of co-planer shields 825-1-IM, 825-2-IM; 815-1, 815-2; 800-1-IM, 800-2-IM; 810-1, 810-2; and 820-1-IM, 820-2-IM may be substantially similar in size and shape, and may be spaced apart in co-planar locations on different layers of material 801. The first plurality of co-planar pathways 865-1 and 865-2 may have at least the corresponding, opposing, and complementary second plurality of co-planar pathways 855-1 and 855-2. These first and second pluralities of co-planar pathways, when oriented face to face, may have main-body pathways 80s co-registered and aligned except for the various contiguous pathway extensions 81"X", 811"X". As shown in FIGS. 1B and 1C, a pair of outer co-planar pathways 820-1-IM, 825-1-IM may serve as pathway shields, thereby improving the shielding effectiveness of the other conductively coupled pluralities of pathways with a main-body 81s.

As illustrated in the varied embodiments 3199, 3200, 3201, the location of extensions 79NNE, 79SSE, of shields 825-1-IM, 815-1, 800-1-IM, 810-1, and 820-1-IM and extensions 99NNE, 99SSE of the shields 825-2-IM, 815-2, 800-2-IM, 810-2, and 820-2-IM, may be varied. In FIG. 1B, for example, extensions 79NNE and 99NNE may be arranged spaced apart, diagonally from extensions 79SSE and 99SSE and on opposite sides of shield main-body 81. In FIG. 1C, for example, extensions 79NNE and 99NNE may be arranged spaced apart in line with extensions 79SSE and 99SSE on opposite sides of shield main-body 81. In FIG. 1B, extensions 812NNE and 811 NNE may be arranged spaced apart, extending toward the same edge 812 of layer of material 801, and extensions 812SSW and 811 SSW may be arranged spaced apart, each extending toward the opposite edge 812 of layer of material 801. In FIG. 1C, pathways 865-1 and 865-2 may be mirror images, as discussed hereinabove. Comparably to FIG. 1B, extensions 812NNE and 811NNE may be arranged spaced apart, extending toward opposite edges 817 of layer of material 801. Extensions 812SSW and 811SSW may be arranged spaced apart, extending toward the opposite edge of layer of material 801, such that extensions 812NNE and 811SSW extend toward opposite edges 812"X" of the respective layer of material 801.

Referring now to FIGS. 2A and 2B, FIG. 2A illustrates a schematic plan view of an embodiment of FIG. 2B according to an aspect of the present invention.

FIG. 2B depicts a pathway arrangement including a layout of a first, a second, a third, a fourth, a fifth, a sixth, a seventh, a eighth, a ninth and a tenth pathway, wherein at least the third and the fourth pathway, for example, may be co-planar and arranged spaced apart from each other. FIG. 2B illustrates the first and the second pathway arranged below the third and the fourth pathway, and the fifth and the sixth pathway arranged above the third and the fourth pathway, and the seventh and the eighth pathway arranged above the fifth and the sixth pathway, and the ninth and the tenth pathway, arranged above the seventh and the eighth pathway. These pathways have various respective internal contiguous pathway extensions 812"X", 811"X", 79"X" and 99"X", and may be discrete components having the same minimal numbers of layering. Internal contiguous pathway extensions 812"X", 811"X", 79"X" and 99"X", and conductively coupled external pathways 890"X", 891"X" 802"X" and 902"X", may be coupled to the inner pathway of the plurality of co-planar pathways of the main-body pathway 80 and 81.

Referring now to FIGS. 3A and 3B, in FIG. 3A there is shown a schematic plan view of an embodiment of FIG. 3B, wherein outer pathways may be selectively conductively coupled in at least two isolated circuit portions. FIG. 3B depicts an pathway arrangement including a minimal layout of a first, a second, a third, a fourth, a fifth, a sixth, a seventh, a eighth, a ninth and a tenth pathway, wherein at least the third and the fourth pathway, for example, are co-planar and arranged spaced apart from each other. The device shown in FIG. 3B may have the first and the second pathway arranged below the third and the fourth pathway, and the fifth and the sixth pathway arranged above the third and the fourth pathway, and the seventh and the eighth pathway arranged above the fifth and the sixth pathway, and the ninth and the tenth pathway arranged above the seventh and the eighth pathway. These pathways have various respective internal contiguous pathway extensions 812"X", 811"X", 79"X" and 99"X", and may be discrete components having the same minimal number of layering.

Referring now to FIG. 3C, a plan view of a shield according to an aspect of the present invention is illustrated. The embodiment depicted in FIG. 3C includes at least one additional pathway, as compared to the device of FIG. 3B. This additional pathway 1100-IM"X" may be one of at least a plurality of shields in the stack of pathways, which shields may span across the two circuit portions. Pathway 1100-IM"X" may be one of at least two outer sandwiching shields in the stack of pathways. Shields may span across the two circuits by adding a centrally arranged 1100-IM"X" pathway electrically coupled to the outer 1100-IM"X" shields. Pathways 1100-IM"X" may have at least one extension, and are illustrated with two extensions 1099E AND 1099W, and may allow for sandwiching shields for all of the pathways within the present invention. At least three shields may be coupled together and may include a centering shield dividing an energy load or energy source of an isolated circuit or dividing two isolated circuits.

A shield 00GS may be electrically isolated from other shields and may be arranged to effect an energy propagation of an isolated circuit. An isolated circuit may be sandwiched by a shield. A shield may be electrically coupled to a conductive area that is isolated from any other conductive areas thereby effecting an energy propagation.

FIGS. 4A-4I depict assembled components of various embodiments according to aspects of the present invention. The arrangements of FIG. 4A to FIG. 4I may include minimal layouts of a first, a second, a third, a fourth, a fifth, a sixth, a seventh, a eighth, a ninth and a tenth pathway, wherein at least the third and the fourth pathway, for example, are co-planar and arranged spaced apart from each other. The first and the second pathway may be arranged below the third and the fourth pathway, and the fifth and the sixth pathway may be arranged above the third and the fourth pathway, and the seventh and the eighth pathway may be arranged above the fifth and the sixth pathway, and the ninth and the tenth pathway may be arranged above the seventh and the eighth pathway. These pathways have various respective internal contiguous pathway extensions 812"X", 811"X", 79"X" and 99"X", and may be an assembled final discrete component, for example.

Referring to FIG. 5A, there is shown a stacking of multiple, non-shared circuits including groups of pathways according to an aspect of the present invention. Included in FIG. 5A is a marker 1000 showing a continuation of the stacking arrangement to the next column of FIG. 5A. Conceptual energy indicators 600, 601, 602, 603 indicate energy flow. Material 799 may be deposited on material 801 for component 6900 shields designated 815-1, 800-1-IM, 810-1, 815-2, 800-2-IM, and 810-2. Shields 810-A and 810-B are separated shields of at least part of an isolated circuit system. Shields 815-A and 815-B are separated shields of at least part of an isolated circuit system. Shields 800-A and 800-B are separated shields of at least part of an isolated circuit system. Shields 835-A and 835-B are separated shields of at least part of an isolated circuit system.

Conductors 855-1 and 855-2 are separated and shielded pathways in bypass configuration. Conductors 865-1 and 865-2 are separated and shielded pathways in bypass configuration. In FIG. 5A, a pathway arrangement is depicted including at least six orientations of pathways of two types of pathways, wherein each orientation of the pathways of the at least six orientations of pathways provides conductive isolation from the remaining orientations of pathways.

Referring to FIG. 5B, there is shown a stacked shield structure according to an aspect of the present invention. FIG. 5B depicts an embodiment similar to that of FIG. 5A, wherein two sets of 855"X" and 865"X" pathways are omitted for purposes of clarity, and wherein the shields of FIG. 5A are oriented in flip-flop for each relative set of 855"X" and 865"X" pathways. The 79"X" pathway extensions may be rotated 90 degrees relative to the various pathway extensions 811"x" and 812"X". A dynamic result of this configuration, as illustrated by the conceptual energy indicators, may be enhanced by nulling the extensions of the two sets of 855"X" and 865"X" pathways of the two isolated circuits, and by relatively positioning the shield of each isolated circuit pairing 855A and 865A approximately 90 degrees null to the various pathway extensions of 855B and 865B.

Referring to FIG. 5B, there is shown a stacked shield structure according to an aspect of the present invention. FIG. 5B depicts an embodiment similar to that of FIG. 5A, wherein two sets of 855"X" and 865"X" pathways are omitted for purposes of clarity, and wherein the shields of. FIG. 5A are oriented in flip-flop for each relative set of 855"X" and 865"X" pathways. The 79"X" pathway extensions may be rotated 90 degrees relative to the various pathway extensions 811"x" and 812"X". A dynamic result of this configuration, as illustrated by the conceptual energy indicators, may be enhanced by nulling the extensions of the two sets of 855"X" and 865"X" pathways of the two isolated circuits, and by relatively positioning the shield of each isolated circuit pairing 865B and 865A approximately 90 degrees null to the various pathway extensions of 865B and 865A.

As discussed hereinabove, in an embodiment of the present invention, multiple complementary or paired shielded pathways may include the first and second pluralities of pathways. Energy may utilize the various paired, feed-through or bypass pathway layers in a generally parallel and even manner, for example. Pathway elements may include non-insulated and conductive apertures, and conductive through-VIAs, to provide propagating energy and maintain a generally non-parallel or perpendicular relationship, and additionally maintain a separate electrical relationship with an adjoining circuit. These pathways may maintain balance internally, and may facilitate an electrical opposition along opposing complementary pairings. This relationship among complementary pairs of pathways may occur while the pathways and the energy are undergoing an opposite operational usage within the shielding structure attached externally.

Figure 5C:
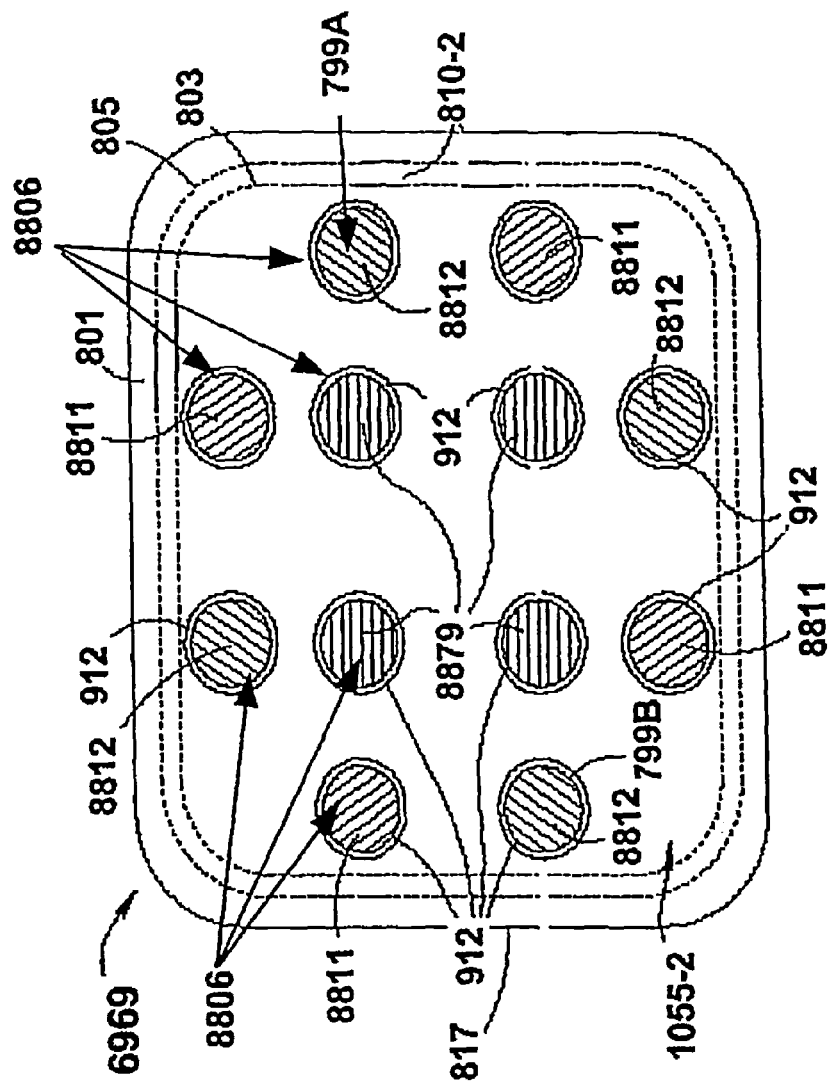
FIG. 5C shows a relative plan view of a stacked multiple, non-shared circuit network having VIAs including groups of pathways according to an aspect of the present invention.

Referring now to FIG. 5C, there is shown a relative plan view of a stacked multiple, non-shared circuit network having VIAs and including groups of pathways according to an aspect of the present invention. The device according to an aspect of the present invention depicted in FIG. 5C includes a hole-through energy conditioner. Hole-through energy conditioners may be formed such that many of the energy propagation principals disclosed herein are retained, including the use of multiple sets of shields for energy conditioning possessing. FIG. 5C, further depicts null pathway sets with pathway arrangement 6969. Pathway arrangement 6969 is similar to FIG. 5B, with the absence of pathway extensions 79"X", 811"x" and 812"X", and with the substitution of 8879"X", 8811"X" and 8812"X" VIAs functioning from a different direction relative to the main-body 80 and 81.

Referring still to FIG. 5C, during the manufacturing process, conductive holes 912, VIAS or conductive apertures may be used to interconnect 8806 an integrated circuit, and may be formed through one or more pathway layers using mechanical drilling, laser drilling, etching, punching, or other hole formation techniques. Each specific interconnection 8806 may enable various pathways to be electrically connected or insulated. Each specific interconnection 8806 may extend through all layers of pathway arrangement 6969, or may be bounded above or below by one or more layers. Pathway arrangement 6969 may include an organic substrate, such as an epoxy material, or patterned conductive material. If an organic substrate is used, for example, standard printed circuit board materials such as FR-4 epoxy-glass, polymide-glass, benzocyclobutene, Teflon, other epoxy resins, or the like could be used in various embodiments. In alternate embodiments, a pathway arrangement could include an inorganic substance, such as ceramic, for example. In various embodiments, the thickness of the levels may be approximately 10-1000 microns. Interconnections 8806 between the various conductive layers may also be formed by selectively removing dielectric and conductive materials, thereby exposing the conductive material of the lower conductive layers 904 (not shown), and by filling the holes so formed by the removal with a conductive paste 799A or electrolytic plating 799B, for example.

Interconnections 8806 may couple exposed conductive layers to a relative side of the pathway arrangement 6969. Interconnections 8806 may take the form of pads or lands to which an integrated circuit may be attached, for example. Interconnections 8806 may be formed using known techniques, such as by filling the selectively removed portions of dielectric with conductive paste, electrolytic plating, photolithography, or screen printing, for example. The resulting pathway arrangement 6969 includes one or more layers of patterned conductive material 799, separated by non-conducting layers, and interconnected by interconnects 8806. Different techniques may be used to interconnect and isolate the various layers of patterned conductive material 799. For example, rather than forming and selectively removing portions of the various conducting 799 and non-conducting layers 801, openings between the various layers may be included by selectively adding the desired portions of the conducting 799 and non-conducting layers 801. Removal techniques, such as chemical mechanical planarization, may be used to physically abrade away multiple layers of different types of conducting and non-conducting materials, resulting in the desired openings for various interconnects.

Pathway arrangement 6969 may be configured using a multi-aperture, multilayer energy conditioning pathway set, with a substrate format adapted to condition propagating energy. Pathway arrangement 6969 may condition propagating energy by utilizing a combined energy conditioning methodology of conductively filled apertures, known in the art as VIAs 8879"X", 8811"X" and 8812"X", in combination with a multi-layer common conductive Faraday cage-like shielding technology with immured propagational pathways. Interconnecting pathway arrangement and an IC may be achieved with wire bonding interconnection, flip-chip ball-grid array interconnections, microB all-grid interconnections, combinations thereof, or any other standard industry accepted methodologies. For example a "flip chip" type of integrated circuit, meaning that the input/output terminations as well as any other pathways on the chip may occur at any point on its surface. After the IC chip is prepared for attachment to pathway arrangement 6969, the chip may be flipped over and attached, by solder bumps or balls to matching pads on the top surface of pathway arrangement 6969. Alternatively, an integrated circuit may be wire bonded by connecting input/output terminations to pathway arrangement 6969 using bond wires to pads on the top surface of pathway arrangement 6969.

The circuits within pathway arrangement 6969 may act as a source to load pathway arrangement requiring capacitance, noise suppression, and/or voltage dampening. This capacitance may be provided by formation of the capacitance developed and embedded within pathway arrangement 6969. This capacitance may be coupled to the integrated circuit loads using a paired pathway and the shield, as described above. Additional capacitance may be provided to a circuit electrically coupled to an integrated circuit to provide voltage dampening and noise suppression. Close proximity of off-chip energy sources may provide a capacitance each along the low inductance path to the load. Common shielding pathways may be utilized as the "0" voltage circuit reference node for both off-chip energy sources the common conductive interposer energy pathway configurations.

Pathway arrangement 6969 may be connected to an integrated circuit by commonly accepted industry connection methods and couplings 799A and 799B, including Bumpless Build-Up Layer (BBUL) packaging. This technology enables higher performance, thinner and lighter packages, and lowers power consumption. In a BBUL package, the silicon die or IC is embedded in a package with a pathway arrangement operable as a first level interconnect. Thus, the BBUL package as a whole is not just attached to one surface of the IC. For example, electrical connections between the die and one or more of the various shields and the package may be made with copper lines, not necessarily C4 solder bumps. These features combine to make the package thinner and lighter than other IC packages, while delivering higher performance and reducing power consumption. BBUL may enhance the ability of a manufacturer to couple multiple silicon components to pathway arrangement 6969. Shielded pathways 8811, 8812, and 8879 may be electrically connected between respective energy sources and respective load of the IC by common industry methodologies, thereby allowing for conditioning of propagating energy. Shields 8879 may conductively coupled to a shield including 1055-2. A shield and its other conductive portions including 8811 and 8812 may be electrically coupled to a respective complementary pathway which poses no polarity charge of significance before hook-up, thereby preventing each layer 8811 and 8812 from changing energy propagation direction functions, such preventing layer 8811 and 8812 from changing from input and output to output and input, respectively, as is understood by those possessing an ordinary skill in the pertinent arts.

For stacked variants depicted in FIGS. 5A, 5B and 5C, adding three pathways 1100-IM-"X", including one between 810-1 and 815-2, designated as 1100-IM-"C", may bisect a balanced symmetry of the total number of pathways located into equal numbers on opposite sides of 1100-IM-"C". The addition of 1100-IM-1 and 1100-IM-2, electrically coupled to 1100-IM-C, creates a common or a shield structure (not all shown). Shields of a shield structure may be of substantially the same size or not. Shields may or may not be physically isolated from any other shields for any one or more embodiments of the present invention. Thus, shields may or may not be electrically or conductively isolated from any other shields for any one or more embodiments of the present invention.

An odd number of shields may be coupled together thereby allowing formation of a common reference or node utilizing all other shields. The number of shields 1100-IM-"X" is not confined to using extensions 1099E and 1099W such as shield DOGS, as any number of extensions in almost any direction may be used to facilitate a coupling. A relative balanced and complementary-symmetrical arrangement may be formed with respect to a center shield 8"XX" or shield 800/800-IM for a arrangement fulcrum of balanced conductive portions. At least a partial flux field cancellation of energy propagating along or between paired and electrically opposing complementary pathways occurs in this balanced but shifted embodiment. Further, simultaneous stray energy parasitics, complementary charged suppression, physical and electrical shielding containment and a faraday effect may also occur. This result is achieved because the magnetic flux energies travel at least partially along the shield wherein the RF return path is parallel and adjacent to a corresponding pathway. Thus, the magnetic flux energy may be measured or observed relative to a return. Shifted pathways may be in relative balance and complementarily and symmetrically positioned with respect to center shields, such as shields 800/800-"X"-IM, and may include a relatively shifted, balanced, complementary, and symmetrical arrangement of predetermined shields and pathways complementarily sandwiched around a centrally positioned shield, such as 800/800-IM, for example.

The exemplary embodiments of FIGS. 1A, 1B, 1C, through FIG. 4I, for example may include these 'shifted' embodiments. These shifted embodiments may include a multiplicity of layers having a shielding, a pathway, a shielding, a pathway, and a shielding. Each of these multiplicity of layers may be centered and complementary about a center shield 800/800-"X"-IM, such as for co-planar variants, and the entire multiplicity of layers may be centered about a main center shield. Complementarity and balance may be maintained about the center shield, and the main center shield, although individual shields may be shifted to create discrete imbalances as between a given matched pathway pair, for example. Shifting may expose a portion of at least one pathway outside the perimeter of the superposed shielding, thereby allowing for parasitics and thereby varying, for example, impedance characteristics.

For example, a given pathway may be shifted 5 points to the left. This shifting may be accounted for in the matched pairs about a center shield, and, consequently, either an adjacent matched pair pathway of opposing polarity may be shifted 5 points, or 5 adjacent pathways of opposite polarity may each shift 1 point, thereby maintaining complementarity and balance. Further, pathways may remain within the perimeter of the superposed shielding, and nonetheless be shifted thereunder. Such a shifting under the shielding may, nonetheless, make desirable a balancing. However, certain exemplary embodiments not shown may include situations wherein pathways are pulled toward the center of a shield, and remain under the shield evidencing differing electrical characteristics, such as inductive behavior, in a balanced or unbalanced state.

Figure 6:
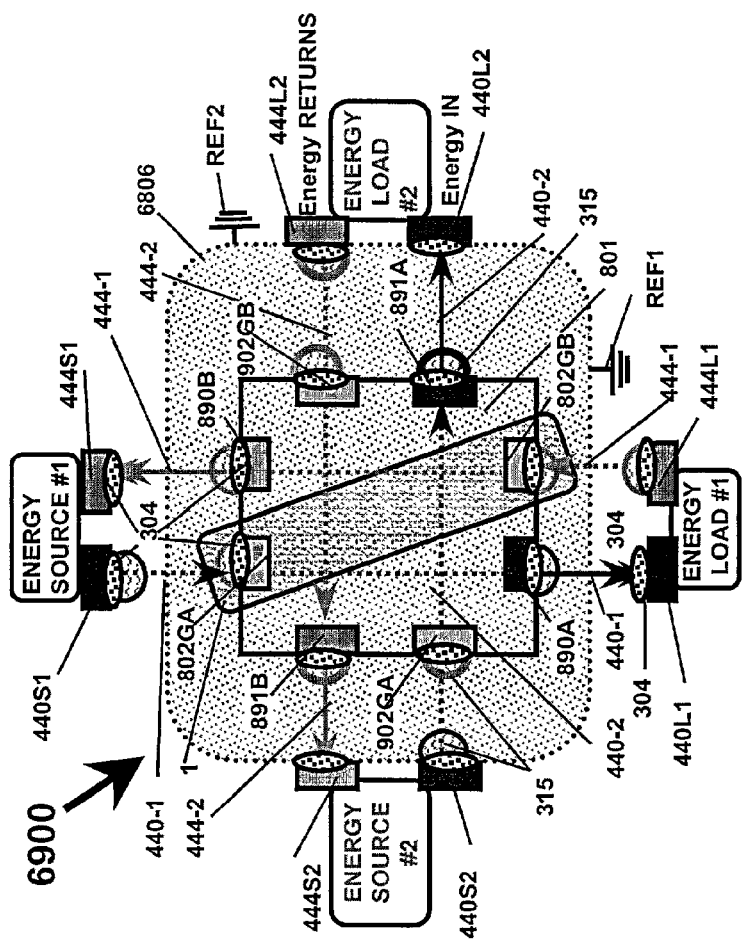
FIG. 6 shows a relative plan view of circuit arrangement variant according to an aspect of the present invention; and, FIG. 7 shows a relative plan view of circuit arrangement variant according to an aspect of the present invention.

Referring now to FIG. 6, there is shown a stacked multiple circuit including embodiment 6900, conductive energy pathways, isolated energy sources, isolated energy-utilizing loads, and isolated common conductive pathways. The conductive energy pathways may be conductively coupled to embodiment 6900 by a conductive coupling material, such as, for example, by a solder or industry equivalent. Vias 315, conductive pathways continuing below the surface of the substrate, may couple to the conductive pathways, and may include conductive material that serves as a contiguous conductive pathway for propagating energies. The isolated common conductive pathways may not be directly coupled to the isolated energy sources or the isolated energy-utilizing loads. As discussed hereinabove, embodiment 6900 may include four pluralities of pathways including electrodes and shields, with each plurality electrically isolated. The shields may be conductively coupled. The conductively coupled shields may be externally coupled to an isolated common conductive pathway, which is not directly conductively coupled to the electrodes, using a conductive coupling material. As shown in FIG. 6 an electrode, 815-1, 800-1-IM and 810-1, may be conductively coupled to 802GA, 802 GB. A shield, 815-2, 800-2-IM, and 810-2, may be conductively coupled to 902GA and 902 GB. These couplings may not be conductively coupled to the first plurality of electrodes or the second plurality of electrodes. In this configuration, both isolated circuits may be utilizing the isolated and separate voltage references and an isolated common impedance path such as REF 1 and REF 2 in FIG. 6.

Figure 7:
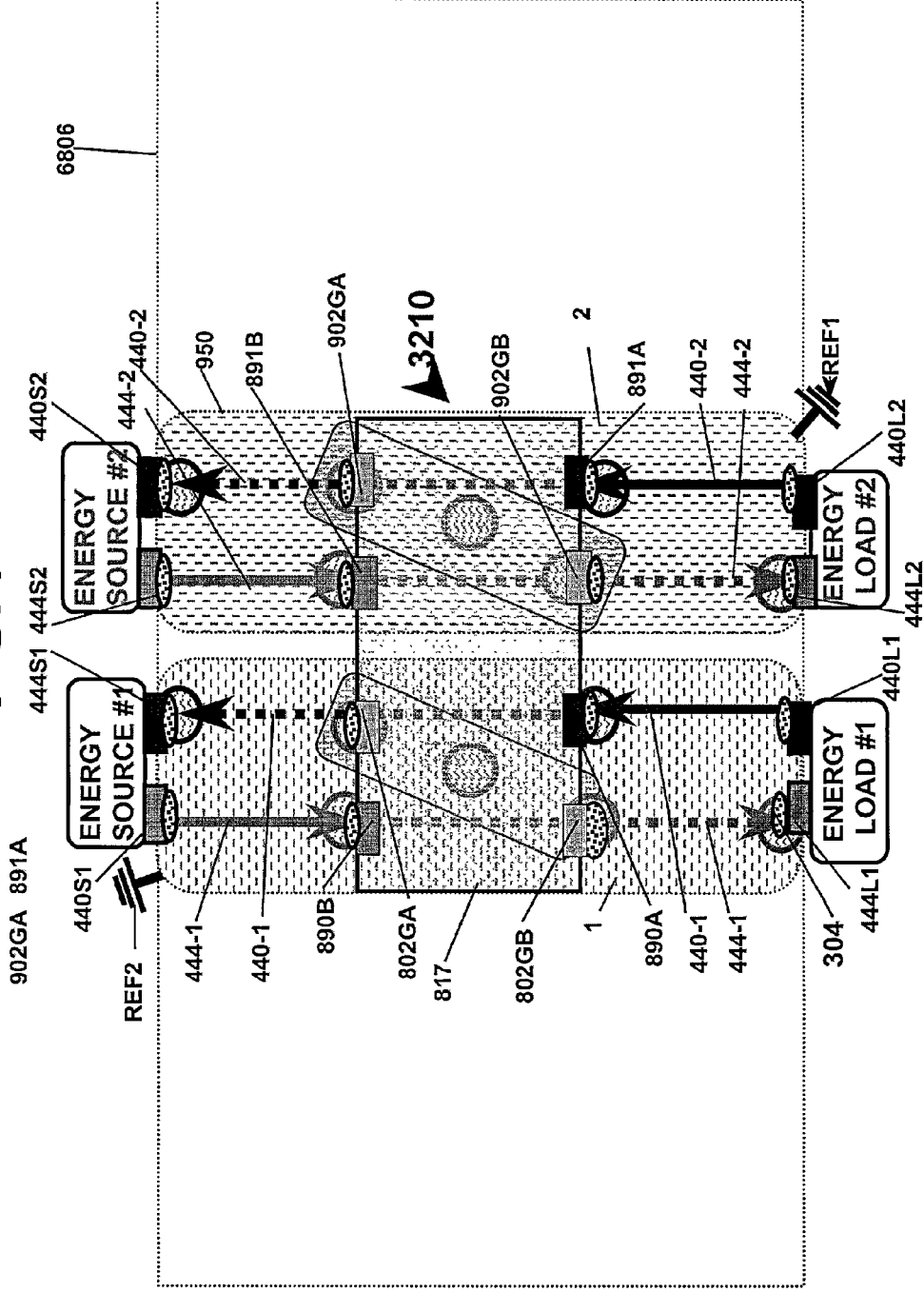

Referring now to FIG. 7, there is shown a stacked co-planar multiple circuit including embodiment 3210, conductive energy pathways, isolated energy sources, isolated energy-utilizing loads, and isolated common conductive pathways. The conductive energy pathways may be conductively coupled to embodiment 3210 by a conductive coupling material. Vias 315, conductive pathways continuing below the surface of the substrate, may couple to the conductive pathways and may include conductive material that serves as a contiguous conductive pathway for propagating energies. The isolated common conductive pathways may not be directly coupled to the isolated energy sources or the isolated energy-utilizing loads. As discussed hereinabove, embodiment 3210 may include four pluralities of pathways including electrodes and shields, with each plurality electrically isolated. The conductively coupled shields may be externally coupled to an isolated common energy pathway, which is not directly conductively coupled to the first or the second plurality of electrodes in this co-planar arrangement. A third plurality of electrodes, 815-1, 800-1-IM and 810-1 may be conductively coupled to 802GA, 802 GB, 815-2 and 800-2-IM, and also, may be conductively coupled to 902GA, 902 GB, and may not be conductively coupled to the first plurality or the second plurality. In this configuration, both isolated circuits may be utilizing a separate and a respective isolated and separate voltage reference and a separate and a respective isolated impedance path, a separate and a respective isolated common impedance path and at least one separate and respective low inductance pathway such as REF 1 and REF 2 in FIG. 7.

Referring now to FIG. 4A thru to FIG. 7, the termination electrodes 890A, 890B, and 891A, 891B, 802GA, 802 GB, and 902GA, 902 GB, may be monolithic or multi-layered. Termination electrodes 802GA, 802 GB, 902GA, 902 GB, may be located at other respective portions of a sintered body. Each main body electrode layers 81 or 80, and the associate electrode extensions 99/79G"X" or 812"X", may define an electrode which extends to, and conductively couples to, the associated termination electrodes 802GA, 802 GB, 902GA, 902 GB and 890A, 890B, and 891A, 891B.

The present invention may be utilized for many energy conditioning functions that utilize commonly coupled shielding structure element for emulating a center tap of resistor/voltage divider network. This resistor/voltage divider network may be normally constructed using a ratio of various integrated circuit resistors. However, various integrated circuit resistors may be replaced by a device according to an aspect of the present invention, the device utilizing, for example, specific conductive/resistive materials 799A or naturally occurring resistance properties of pathway material 799, or utilizing a varied physical layout. A voltage dividing function may be present as portions of a common and shared pathway shield structure are utilized to define a common voltage reference located at both respective sides of the common pathway shield structure.

In embodiments, whether initially stacked vertically during a manufacturing process, or in combination with a coplanar pairings as described hereinabove, the number of complementary pathways pairings may be multiplied in a predetermined manner to create a number of pathway element combinations of a generally physically or electrically parallel nature.

Further, although not shown, a device of the present invention may be fabricated in silicon and directly incorporated into integrated circuit microprocessor circuitry or microprocessor chip packaging. Any suitable method for depositing electrically conductive materials may be used, such as plating, sputtering, vapor, electrical, screening, stenciling, vacuum, and chemical including chemical vapor deposition (CVD).

While certain embodiments have been herein described in position as "upper" or "above", or "lower" or "below", or any other positional or directional description, it will be understood that these descriptions are merely relative and are not intended to be limiting.

The present invention may be implemented in a number of different embodiments, including a energy conditioning embodiment as an energy conditioner for an electronic assembly, an energy conditioning substrate, an integrated circuit package, an electronic assembly or an electronic system in the form of a energy conditioning system, and may be fabricated using various methods. Other embodiments will be readily apparent to those of ordinary skill in the art.

We claim:

1. A method for making a conductive pathway arrangement, comprising:
   electrically isolating an upper pathway, a center pathway and a lower pathway from a first pathway and a second pathway;
   separating by a first horizontal distance a first and a second perimeter edge portion of a bottom surface area of a superposed first pathway shielded area of a first pathway shielded area of said first pathway;
   separating by a second horizontal distance a first and a second perimeter edge portion of a top surface area of a superposed second pathway shielded area of a second pathway shielded area of said second pathway;
   electrically coupling an upper pathway shielding area that is larger in size than either said superposed first pathway shielded area or said superposed second pathway shielded area to a center pathway shielding area that is larger in size than either said superposed first pathway shielded area or said superposed second pathway shielded area;
   electrically coupling said center pathway shielding area to a lower pathway shielding area that is larger in size than either said superposed first pathway shielded area or said superposed second pathway shielded area; and
   superposing with one another a top surface area of said superposed first pathway shielded area, said bottom surface area of said superposed first pathway shielded area, said top surface area of said superposed second pathway shielded area and a bottom surface area of said superposed second pathway shielded area.

2. An arrangement for energy conditioning, comprising:
   an upper electrode comprising an upper electrode surface area that includes an upper electrode shielding area;
   a first electrode comprising a first electrode surface area that includes a superposed first electrode area and a non-superposed first electrode area;
   a center electrode comprising a center electrode surface area that includes a center electrode shielding area;
   a second electrode comprising a second electrode surface area that includes a superposed second electrode area and a non-superposed second electrode area;
   a lower electrode comprising a lower electrode surface area that includes a lower electrode shielding area;
   wherein said upper electrode, said center electrode and said lower electrode are electrically isolated from said first electrode and said second electrode, and wherein said first electrode and said second electrode are electrically isolated from each other;
   wherein the bottom of said upper electrode shielding area is electrically coupled to the top of said center electrode shielding area, and wherein the bottom of said center electrode shielding area is electrically coupled to the top of said lower electrode shielding area;
   wherein said superposed first electrode area and said superposed second electrode area are each smaller than said upper electrode shielding area;

wherein said superposed first electrode area and said superposed second electrode area are each smaller than said center electrode shielding area;

wherein said superposed first electrode area and said superposed second electrode area are each smaller than said lower electrode shielding area;

wherein said superposed first electrode area is underneath said bottom of said upper electrode shielding area, and wherein said superposed first electrode area is over said top of said center electrode shielding area, and wherein said superposed second electrode area is underneath said bottom of said center electrode shielding area, and wherein said superposed second electrode area is over said top of said lower electrode shielding area;

wherein said superposed first electrode area is shielded between said bottom of said upper electrode shielding area and said top of said center electrode shielding area, and wherein said superposed second electrode area is shielded between said bottom of said center electrode shielding area and said top of said lower electrode shielding area, and wherein said superposed first electrode area and said superposed second electrode area are shielded from one another by at least said center electrode shielding area;

wherein said upper electrode shielding area further comprises a top superposed surface area and a bottom superposed surface area that together form a shielding, superposed upper electrode area section;

wherein said center electrode shielding area further comprises a top superposed surface area and a bottom superposed surface area that together form a shielding, superposed center electrode area section;

wherein said lower electrode shielding area further comprises a top superposed surface area and a bottom superposed surface area that together form a shielding, superposed lower electrode area section;

wherein said superposed first electrode area further comprises a top first shielded surface area and a bottom first shielded surface area, and wherein said top first shielded surface area includes a first perimeter edge portion and a second perimeter edge portion that are parallel to one another and spaced apart from one another, and wherein said bottom first shielded surface area includes a first perimeter edge portion and a second perimeter edge portion that are parallel to one another and spaced apart from one another;

wherein said superposed second electrode area further comprises a top second shielded surface area and a bottom second shielded surface area, and wherein said top second shielded surface area includes a first perimeter edge portion and a second perimeter edge portion that are parallel to one another and spaced apart from one another, and wherein said bottom second shielded surface area includes a first perimeter edge portion and a second perimeter edge portion that are parallel to one another and spaced apart from one another;

wherein said first perimeter edge portion of said top first shielded surface area is longer than the distance between said first perimeter edge portion of said top first shielded surface area and said second perimeter edge portion of said top first shielded surface area;

wherein said top first shielded surface area, said bottom first shielded surface area, said top second shielded surface area, and said bottom second shielded surface area are arranged superposed with one another; and wherein said shielding, superposed upper electrode area section, said top first shielded surface area, said bottom first shielded surface area, said shielding, superposed center electrode area section, said top second shielded surface area, said bottom second shielded surface area and said shielding, superposed lower electrode area section are superposed with one another.

3. The arrangement for energy conditioning of claim 2, wherein said non-superposed first electrode area comprises at least a shielded, non-superposed area;

wherein said non-superposed second electrode area comprises at least a shielded, non-superposed area;

wherein non-superposed first electrode area and said non-superposed second electrode area are not arranged superposed with one another; and wherein said first electrode is a first bypass electrode, and wherein said second electrode is a second bypass electrode.

4. The arrangement for energy conditioning of claim 3, wherein said non-superposed first electrode area and said non-superposed second electrode area are each smaller than said upper electrode shielding area;

wherein said non-superposed first electrode area and said non-superposed second electrode area are each smaller than said center electrode shielding area; and wherein said non-superposed first electrode area and said non-superposed second electrode area are each smaller than said lower electrode shielding area.

5. The arrangement for energy conditioning of claim 4, further comprising:
an integrated circuit die;
wherein said first electrode is electrically coupled to said integrated circuit die; and
wherein said second electrode is electrically coupled to said integrated circuit die.

6. The arrangement for energy conditioning of claim 2, further comprising:
a substrate, and wherein said substrate comprises a substrate top surface area and a substrate bottom surface area that are superposed with one another;
wherein said bottom of said upper electrode shielding area is spaced a first distance from said top first shielded surface area, and wherein said bottom first shielded surface area is spaced said first distance from said top of said center electrode shielding area, and wherein said bottom of said center electrode shielding area is spaced said first distance from said top second shielded surface area; and
wherein said bottom second shielded surface area is spaced said first distance from said top of said lower electrode shielding area;
wherein said second perimeter edge portion of said top first shielded surface area, said second perimeter edge portion of said bottom first shielded surface area, said second perimeter edge portion of said top second shielded surface area and said second perimeter edge portion of said bottom second shielded surface area are superposed with one another; and
wherein said shielding, superposed upper electrode area section, said top first shielded surface area, said bottom first shielded surface area, said shielding, superposed center electrode area section, said top second shielded surface area, said bottom second shielded surface area and said shielding, superposed lower electrode area section are all located between said substrate top surface area and said substrate bottom surface area.

7. The arrangement for energy conditioning of claim 6, further comprising:

an integrated circuit die;
wherein said integrated circuit die is attached to said substrate;
wherein said first electrode is electrically coupled to said integrated circuit die; and
wherein said second electrode is electrically coupled to said integrated circuit die.

8. The arrangement for energy conditioning of claim 7, wherein said first electrode is a first feed-through electrode, and wherein said second electrode is a second feed-through electrode.

9. The arrangement for energy conditioning of claim 2, wherein said bottom of said upper electrode shielding area is spaced a first distance from said top first shielded surface area;
wherein said bottom first shielded surface area is spaced said first distance from said top of said center electrode shielding area;
wherein said bottom of said center electrode shielding area is spaced said first distance from said top second shielded surface area; and
wherein said bottom second shielded surface area is spaced said first distance from said top of said lower electrode shielding area.

10. An integrated circuit die comprising the arrangement for energy conditioning of claim 9.

11. The arrangement for energy conditioning of claim 9, further comprising:
an integrated circuit die;
wherein said first electrode is a first feed-through electrode;
wherein said second electrode is a second feed-through electrode;
wherein said first feed-through electrode is electrically coupled to said integrated circuit die; and
wherein said second feed-through electrode is electrically coupled to said integrated circuit die.

12. The arrangement for energy conditioning of claim 2, further comprising:
a support material;
a first layer of said support material comprising a first layer section having a first thickness, and wherein said first layer section includes a top first section surface area and a bottom first section surface area that are superposed with one another;
a second layer of said support material comprising a second layer section having said first thickness, and wherein said second layer section includes a top second section surface area and a bottom second section surface area that are superposed with one another;
a third layer of said support material comprising a third layer section having said first thickness, and wherein said third layer section includes a top third section surface area and a bottom third section surface area that are superposed with one another;
a fourth layer of said support material comprising a fourth layer section having said first thickness, and wherein said fourth layer section includes a top fourth section surface area and a bottom fourth section surface area that are superposed with one another;
wherein said bottom superposed surface area of said shielding, superposed upper electrode area section is spaced apart from said top first shielded surface area by said first layer section;
wherein said bottom first shielded surface area is spaced apart from said top superposed surface area of said shielding, superposed center electrode area section by said second layer section;
wherein said bottom superposed surface area of said shielding, superposed center electrode area section is spaced apart from said top second shielded surface area by said third layer section;
wherein said bottom second shielded surface area is spaced apart from said top superposed surface area of said shielding, superposed lower electrode area section by said fourth layer section; and
wherein said shielding, superposed upper electrode area section, said first layer section, said top first shielded surface area, said bottom first shielded surface area, said second layer section, said shielding, superposed center electrode area section, said third layer section, said top second shielded surface area, said bottom second shielded surface area, said fourth layer section and said shielding, superposed lower electrode area section are superposed with one another.

13. The arrangement for energy conditioning of claim 12, wherein said first electrode is a first feed-through electrode, and wherein said second electrode is a second feed-through electrode.

14. The arrangement for energy conditioning of claim 13, wherein said non-superposed first electrode area and said non-superposed second electrode area are each smaller than said upper electrode shielding area;
wherein said non-superposed first electrode area and said non-superposed second electrode area are each smaller than said center electrode shielding area; and
wherein said non-superposed first electrode area and said non-superposed second electrode area are each smaller than said lower electrode shielding area.

15. The arrangement for energy conditioning of claim 2, further comprising:
a dielectric material;
a first layer of said dielectric material comprising a first layer section having a first thickness, and wherein said first layer section includes a top first section surface area and a bottom first section surface area that are superposed with one another;
a second layer of said dielectric material comprising a second layer section having said first thickness, and wherein said second layer section includes a top second section surface area and a bottom second section surface area that are superposed with one another;
a third layer of said dielectric material comprising a third layer section having said first thickness, and wherein said third layer section includes a top third section surface area and a bottom third section surface area that are superposed with one another;
a fourth layer of said dielectric material comprising a fourth layer section having said first thickness, and wherein said fourth layer section includes a top fourth section surface area and a bottom fourth section surface area that are superposed with one another;
wherein said bottom superposed surface area of said shielding, superposed upper electrode area section is spaced apart from said top first shielded surface area by said first layer section;
wherein said bottom first shielded surface area is spaced apart from said top superposed surface area of said shielding, superposed center electrode area section by said second layer section;

wherein said bottom superposed surface area of said shielding, superposed center electrode area section is spaced apart from said top second shielded surface area by said third layer section;

wherein said bottom second shielded surface area is spaced apart from said top superposed surface area of said shielding, superposed lower electrode area by said fourth layer section; and wherein said shielding, superposed upper electrode area section, said first layer section, said top first shielded surface area, said bottom first shielded surface area, said second layer section, said shielding, superposed center electrode area section, said third layer section, said top second shielded surface area, said bottom second shielded surface area, said fourth layer section and said shielding, superposed lower electrode area section are superposed with one another.

16. The arrangement for energy conditioning of claim 15, further comprising:

a substrate, and wherein said substrate comprises a substrate top surface area and a substrate bottom surface area that are superposed with one another; and wherein said shielding, superposed upper electrode area section, said first layer section, said top first shielded surface area, said bottom first shielded surface area, said second layer section, said shielding, superposed center electrode area section, said third layer section, said top second shielded surface area, said bottom second shielded surface area, said fourth layer section and said shielding, superposed lower electrode area section are located between said substrate top surface area and said substrate bottom surface area.

17. The arrangement for energy conditioning of claim 16, further comprising:

an integrated circuit die;

wherein said integrated circuit die is attached to said substrate;

wherein said first electrode is electrically coupled to said integrated circuit die; and wherein said second electrode is electrically coupled to said integrated circuit die.

18. The arrangement for energy conditioning of claim 17, wherein said shielding, superposed upper electrode area section, said first layer section, said top first shielded surface area, said bottom first shielded surface area, said second layer section, said shielding, superposed center electrode area section, said third layer section, said top second shielded surface area, said bottom second shielded surface area, said fourth layer section and said shielding, superposed lower electrode area section together form a three-dimensional section that is operable for energy conditioning when said integrated circuit die is energized.

19. The arrangement for energy conditioning of claim 2, wherein said bottom of said upper electrode shielding area is spaced a first distance from said top first shielded surface area;

wherein said bottom first shielded surface area is spaced said first distance from said top of said center electrode shielding area;

wherein said bottom of said center electrode shielding area is spaced said first distance from said top second shielded surface area; and wherein said bottom second shielded surface area is spaced said first distance from said top of said lower electrode shielding area.

20. The arrangement for energy conditioning of claim 19, further comprising:

an integrated circuit die;

wherein said first electrode is electrically coupled to said integrated circuit die; and wherein said second electrode is electrically coupled to said integrated circuit die.

21. The arrangement for energy conditioning of claim 20, further comprising:

a substrate, and wherein said substrate comprises a substrate top surface area and a substrate bottom surface area that are superposed with one another;

wherein said shielding, superposed upper electrode area section, said top first shielded surface area, said bottom first shielded surface area, said shielding, superposed center electrode area section, said top second shielded surface area, said bottom second shielded surface area and said shielding, superposed lower electrode area section are arranged between said substrate top surface area and said substrate bottom surface area; and wherein said integrated circuit die is attached to said top substrate surface area.

22. The arrangement for energy conditioning of claim 21, wherein said non-superposed first electrode area and said non-superposed second electrode area are each smaller than said upper electrode shielding area;

wherein said non-superposed first electrode area and said non-superposed second electrode area are each smaller than said center electrode shielding area; and wherein said non-superposed first electrode area and said non-superposed second electrode area are each smaller than said lower electrode shielding area.

23. The arrangement for energy conditioning of claim 22, wherein said first electrode is operable as a first feed-through electrode when said integrated circuit die is energized; and wherein said second electrode is operable as a second feed-through electrode when said integrated circuit die is energized.

24. The arrangement for energy conditioning of claim 23, wherein said shielding, superposed upper electrode area section, said top first shielded surface area, said bottom first shielded surface area, said shielding, superposed center electrode area section, said top second shielded surface area, said bottom second shielded surface area and said shielding, superposed lower electrode area section together form a three-dimensional energy conditioning section; and wherein said three-dimensional energy conditioning section is operable for conditioning energy propagating within said three-dimensional energy conditioning section when said integrated circuit die is energized.

25. An arrangement for energy conditioning, comprising:

an upper energy pathway comprising an upper pathway surface area that includes a top upper pathway surface area and a bottom upper pathway surface area, and wherein said top upper pathway surface area and said bottom upper pathway surface area are superposed with one another;

a center energy pathway comprising a center pathway surface area that includes a top center pathway surface area and a bottom center pathway surface area, and wherein said top center pathway surface area and said bottom center pathway surface area are superposed with one another;

a lower energy pathway comprising a lower pathway surface area that includes a top lower pathway surface area and a bottom lower pathway surface area, and wherein said top lower pathway surface area and said bottom lower pathway surface area are superposed with one another;

wherein said bottom upper pathway surface area is electrically coupled to said top center pathway surface area, and wherein said bottom center pathway surface area is electrically coupled to said top lower pathway surface area;

a first feed-through energy pathway comprising a first pathway surface area;

a second feed-through energy pathway comprising a second pathway surface area;

a third feed-through energy pathway comprising a third pathway surface area;

a fourth feed-through energy pathway comprising a fourth pathway surface area;

wherein said upper energy pathway, said center energy pathway and said lower energy pathway are each electrically isolated from said first feed-through energy pathway, said second feed-through energy pathway, said third feed-through energy pathway and said fourth feed-through energy pathway;

wherein said first feed-through energy pathway, said second feed-through energy pathway, said third feed-through energy pathway and said fourth feed-through energy pathway are electrically isolated from each other;

wherein said first pathway surface area comprises a shielded, superposed first pathway surface area, and wherein said shielded, superposed first pathway surface area is underneath said upper pathway surface area, and wherein said shielded, superposed first pathway surface area is over said center pathway surface area;

wherein said second pathway surface area comprises a shielded, superposed second pathway surface area, and wherein said shielded, superposed second pathway surface area is underneath said upper pathway surface area, and wherein said shielded, superposed second pathway surface area is over said center pathway surface area;

wherein said third pathway surface area comprises a shielded, superposed third pathway surface area, and wherein said shielded, superposed third pathway surface area is underneath said center pathway surface area, and wherein said shielded, superposed third pathway surface area is over said lower pathway surface area;

wherein said fourth pathway surface area comprises a shielded, superposed fourth pathway surface area, and wherein said shielded, superposed fourth pathway surface area is underneath said center pathway surface area, and wherein said shielded, superposed fourth pathway surface area is over said lower pathway surface area;

wherein said shielded, superposed first pathway surface area, said shielded, superposed second pathway surface area, said shielded, superposed third pathway surface area and said shielded, superposed fourth pathway surface area are each smaller than said upper pathway surface area;

wherein said shielded, superposed first pathway surface area, said shielded, superposed second pathway surface area, said shielded, superposed third pathway surface area and said shielded, superposed fourth pathway surface area are each smaller than said center pathway surface area;

wherein said shielded, superposed first pathway surface area, said shielded, superposed second pathway surface area, said shielded, superposed third pathway surface area and said shielded, superposed fourth pathway surface area are each smaller than said lower pathway surface area;

wherein said shielded, superposed first pathway surface area and said shielded, superposed third pathway surface area are physically shielded from one another by said center pathway surface area;

wherein said shielded, superposed second pathway surface area and said shielded, superposed fourth pathway surface area are physically shielded from one another by said center pathway surface area;

wherein said shielded, superposed first pathway surface area and said shielded, superposed fourth pathway surface area are physically shielded from one another by said center pathway surface area;

wherein said shielded, superposed first pathway surface area includes a top first area and a bottom first area, and wherein said top first area comprises a top first area first perimeter edge portion and a top first area second perimeter edge portion that are parallel to one another and spaced apart from one another, and wherein said bottom first area includes a bottom first area first perimeter edge portion and a bottom first area second perimeter edge portion that are parallel to one another and spaced apart from one another;

wherein said shielded, superposed second pathway surface area includes a top second area and a bottom second area, and wherein said top second area comprises a top second area first perimeter edge portion and a top second area second perimeter edge portion that are parallel to one another and spaced apart from one another, and wherein said bottom second area includes a bottom second area first perimeter edge portion and a bottom second area second perimeter edge portion that are parallel to one another and spaced apart from one another;

wherein said shielded, superposed third pathway surface area includes a top third area and a bottom third area, and wherein said top third area comprises a top third area first perimeter edge portion and a top third area second perimeter edge portion that are parallel to one another and spaced apart from one another, and wherein said bottom third area includes a bottom third area first perimeter edge portion and a bottom third area second perimeter edge portion that are parallel to one another and spaced apart from one another;

wherein said shielded, superposed fourth pathway surface area includes a top fourth area and a bottom fourth area, and wherein said top fourth area comprises a top fourth area first perimeter edge portion and a top fourth area second perimeter edge portion that are parallel to one another and spaced apart from one another, and wherein said bottom fourth area includes a bottom fourth area first perimeter edge portion and a bottom fourth area second perimeter edge portion that are parallel to one another and spaced apart from one another;

wherein said bottom upper pathway surface area is spaced a first distance from said top first area, and wherein said bottom first area is spaced said first distance from said top center pathway surface area, and wherein said bottom center pathway surface area is spaced said first distance from said top third area, and wherein said bottom third area is spaced said first distance from said top lower pathway surface area;

wherein said top first area and said top second area are co-planar, and wherein said bottom first area and said bottom second area are co-planar;

wherein said top third area and said top fourth area are co-planar, and wherein said bottom third area and said bottom fourth area are co-planar;

wherein said top first area, said bottom first area, said top third area and said bottom third area are arranged superposed with one another; and wherein said top second area, said bottom second area, said top fourth area and said bottom fourth area are arranged superposed with one another.

26. The arrangement for energy conditioning of claim 25, further comprising:
    a substrate;
    a second upper energy pathway comprising a second upper pathway surface area that includes a top second upper pathway surface area and a bottom second upper pathway surface area, and wherein said top second upper pathway surface area and said bottom second upper pathway surface area are superposed with one another;
    a second center energy pathway comprising a second center pathway surface area that includes a top second center pathway surface area and a bottom second center pathway surface area, and wherein said top second center pathway surface area and said bottom second center pathway surface area are superposed with one another;
    a second lower energy pathway comprising a second lower pathway surface area that includes a top second lower pathway surface area and a bottom second lower pathway surface area, and wherein said top second lower pathway surface area and said bottom second lower pathway surface area are superposed with one another;
    wherein said bottom second upper pathway surface area is electrically coupled to said top second center pathway surface area, and wherein said bottom second center pathway surface area is electrically coupled to said top second lower pathway surface area;
    wherein said second upper energy pathway, said second center energy pathway and said second lower energy pathway are each electrically isolated from said first feed-through energy pathway, said second feed-through energy pathway, said third feed-through energy pathway and said fourth feed-through energy pathway; and
    wherein said lower energy pathway is electrically coupled to said second upper energy pathway.

27. The arrangement for energy conditioning of claim 26, further comprising:
    an integrated circuit die; and
    wherein said integrated circuit die is coupled to said substrate.

28. The arrangement for energy conditioning of claim 27, wherein said first feed-through energy pathway is electrically coupled to said integrated circuit die;
    wherein said second feed-through energy pathway is electrically coupled to said integrated circuit die;
    wherein said third feed-through energy pathway is electrically coupled to said integrated circuit die; and
    wherein said fourth feed-through energy pathway is electrically coupled to said integrated circuit die.

29. The arrangement for energy conditioning of claim 28, wherein said substrate further comprises a substrate top surface area and a substrate bottom surface area that together are superposed with one another; and
    wherein said top first area, said bottom first area, said top second area, said bottom second area, said top third area, said bottom third area, said top fourth area and said bottom fourth area are located between said substrate top surface area and said substrate bottom surface area.

30. The arrangement for energy conditioning of claim 29, wherein said bottom first area first perimeter edge portion is longer than the distance between said top first area first perimeter edge portion and said top first area second perimeter edge portion;
    wherein said bottom second area first perimeter edge portion is longer than the distance between said top second area first perimeter edge portion and said top second area second perimeter edge portion;
    wherein said top first area first perimeter edge portion is approximately the same length as said top first area second perimeter edge portion;
    wherein said bottom first area first perimeter edge portion is approximately the same length as said bottom first area second perimeter edge portion;
    wherein said top second area first perimeter edge portion is approximately the same length as said top second area second perimeter edge portion; and
    wherein said bottom second area first perimeter edge portion is approximately the same length as said bottom second area second perimeter edge portion.

31. The arrangement for energy conditioning of claim 25, wherein said top first area second perimeter edge portion, said bottom first area second perimeter edge portion, said top third area second perimeter edge portion and said bottom third area second perimeter edge portion are superposed with one another;
    wherein said top second area second perimeter edge portion, said bottom second area second perimeter edge portion, said top fourth area second perimeter edge portion and said bottom fourth area second perimeter edge portion are superposed with one another;
    wherein said bottom first area first perimeter edge portion is longer than the distance between said top first area first perimeter edge portion and said top first area second perimeter edge portion;
    wherein said bottom second area first perimeter edge portion is longer than the distance between said top second area first perimeter edge portion and said top second area second perimeter edge portion;
    wherein said top first area first perimeter edge portion is approximately the same length as said top first area second perimeter edge portion;
    wherein said bottom first area first perimeter edge portion is approximately the same length as said bottom first area second perimeter edge portion;
    wherein said top second area first perimeter edge portion is approximately the same length as said top second area second perimeter edge portion; and
    wherein said bottom second area first perimeter edge portion is approximately the same length as said bottom second area second perimeter edge portion.

32. An integrated circuit die comprising the arrangement for energy conditioning of claim 31.

33. The arrangement for energy conditioning of claim 31, further comprising:
    a substrate, and wherein said substrate includes a substrate top surface area and a substrate bottom surface area that are superposed with one another;
    an integrated circuit die;
    wherein said integrated circuit die is coupled to said substrate top surface area; and
    wherein said top first area, said bottom first area, said top second area, said bottom second area, said top third area, said bottom third area, said top fourth area and said bottom fourth area are located between said substrate top surface area and said substrate bottom surface area.

34. The arrangement for energy conditioning of claim 33, wherein said first feed-through energy pathway is electrically coupled to said integrated circuit die.

35. The arrangement for energy conditioning of claim 34, wherein said substrate bottom surface area of said substrate is coupled to a PC board.

36. The arrangement for energy conditioning of claim 33, wherein said first feed-through energy pathway is electrically coupled to said integrated circuit die;
wherein said second feed-through energy pathway is electrically coupled to said integrated circuit die;
wherein said third feed-through energy pathway is electrically coupled to said integrated circuit die; and
wherein said fourth feed-through energy pathway is electrically coupled to said integrated circuit die.

37. A microprocessor package comprising the arrangement for energy conditioning of claim 36.

38. A conductor arrangement comprising:
A) a first group of four conductors, wherein each conductor in the first group includes a shielded conductor bottom left edge, a shielded conductor bottom right edge and a bottom main-body conductive area, and wherein the bottom main-body conductive area of each conductor in the first group comprises
  (1) a left edge portion of the respective shielded conductor bottom left edge,
  (2) a right edge portion of the respective shielded conductor bottom right edge, and
  (3) a first conductive plane area, and wherein
    (a) the respective left edge portion and the respective right edge portion are parallel and separated from one another by a first distance as measured orthogonal therebetween, and
    (b) the respective left edge portion, the respective first conductive plane area and the respective right edge portion are aligned co-planar with one another such that the width of the respective first conductive plane area extends the first distance from the respective left edge portion to the respective right edge portion;
B) a second group of four conductors, wherein each conductor in the second group includes a shielded conductor bottom left edge, a shielded conductor bottom right edge and a bottom main-body conductive area, and wherein the bottom main-body conductive area of each conductor in the second group comprises
  (1) a left edge portion of the respective shielded conductor bottom left edge,
  (2) a right edge portion of the respective shielded conductor bottom right edge, and
  (3) a second conductive plane area, and wherein
    (a) the respective left edge portion and the respective right edge portion are parallel and separated from one another by the first distance as measured orthogonal therebetween, and
    (b) the respective left edge portion, the respective second conductive plane area and the respective right edge portion are aligned co-planar with one another such that the width of the respective second conductive plane area extends the first distance from the respective left edge portion to the respective right edge portion;
C) a group of shielding conductors that are conductively connected to one another, wherein the group comprises a first shielding conductor having a first shielding conductive area, a second shielding conductor having a second shielding conductive area and a third shielding conductor having a third shielding conductive area;
wherein
a) each conductor in the first group is not a conductor in the second group,
b) the group of shielding conductors is conductively isolated from the first group and the second group,
c) all the first conductive plane areas in the first group are co-planar with one another,
d) all the second conductive plane areas in the second group are co-planar with one another,
e) all the first conductive plane areas and all the second conductive plane areas are located between the first and third shielding conductive areas,
f) the first conductive plane areas, the first, second and third shielding conductive areas and the second conductive plane areas are all parallel with one another,
g) the first conductive plane areas are physically shielded from the second conductive plane areas by the second shielding conductive area in position therebetween,
h) the width of each first conductive plane area in the first group is equal to the width of each second conductive plane area in the second group,
i) the first conductive plane area of the bottom main-body conductive area of a first conductor of the first group is in stacked superposed alignment with the second conductive plane area of the bottom main-body conductive area of a first conductor of the second group such that the left edge portion of the shielded conductor bottom left edge of the first conductor in the first group and the left edge portion of the shielded conductor bottom left edge of the first conductor in the second group are the same length,
j) the first conductive plane area of the bottom main-body conductive area of a second conductor in the first group is in stacked superposed alignment with the second conductive plane area of the bottom main-body conductive area of a second conductor in the second group such that the left edge portion of the shielded conductor bottom left edge of the second conductor in the first group and the left edge portion of the shielded conductor bottom left edge of the second conductor in the second group are the same length, and
k) within the first group, the right edge portion of the shielded conductor bottom right edge of the first conductor is separated from the left edge portion of the shielded conductor bottom left edge of the second conductor by a second distance as measured orthogonal therebetween.

39. The conductor arrangement of claim 38, wherein
a) the first conductive plane area of the bottom main-body conductive area of a third conductor in the first group is in stacked superposed alignment with the second conductive plane area of the bottom main-body conductive area of a third conductor in the second group such that the left edge portion of the shielded conductor bottom left edge of the third conductor in the first group and the left edge portion of the shielded conductor bottom left edge of the third conductor in the second group are the same length,
b) the first conductive plane area of the bottom main-body conductive area of a fourth conductor in the first group is in stacked superposed alignment with the second conductive plane area of the bottom main-body conductive area of a fourth conductor in the second group such that the left edge portion of the shielded conductor bottom left edge of the fourth conductor in the first group and the left edge portion of the shielded conductor bottom left edge of the fourth conductor in the second group are the same length, c) within the first group, the right edge portion of the shielded conductor bottom right edge of the third conductor is separated from the left edge portion of the shielded conductor bottom left edge of the fourth conductor by the second distance as measured orthogonal therebetween, d) within the first group, the second distance separating the right edge portion of the shielded conductor bottom right edge of the first conductor from the left edge portion of the shielded conductor bottom left edge of the second conductor is occupied by dielectric therebetween, and e) within the first group, the second distance separating the right edge portion of the shielded conductor bottom right edge of the third conductor from the left edge portion of the shielded conductor bottom left edge of the fourth conductor is occupied by dielectric therebetween.

40. The conductor arrangement of claim 39, wherein within the first group, the right edge portion of the shielded conductor bottom right edge of the second conductor is separated from the left edge portion of the shielded conductor bottom left edge of the third conductor by a third distance as measured orthogonal therebetween.

41. The conductor arrangement of claim 40, wherein
a) one or more of the conductors in the first group is configured as an electrical data line,
b) one or more of the conductors in the second group is configured as an electrical data line,
c) one or more of the conductors in the first group is conductively connected to an integrated circuit die, and
d) one or more of the shielding conductors in the group of shielding conductors is conductively connected to the integrated circuit die.

42. The conductor arrangement of claim 39, further comprising:
A) a third group of four conductors, wherein each conductor in the third group includes a shielded conductor bottom left edge, a shielded conductor bottom right edge and a bottom main-body conductive area, and wherein the bottom main-body conductive area of each conductor in the third group comprises
(1) a left edge portion of the respective shielded conductor bottom left edge,
(2) a right edge portion of the respective shielded conductor bottom right edge, and
(3) a third conductive plane area, and wherein
(a) the respective left edge portion and the respective right edge portion are parallel and separated from one another by a fourth distance as measured orthogonal therebetween, and
(b) the respective left edge portion, the respective third conductive plane area and the respective right edge portion are aligned co-planar with one another such that the width of the respective third conductive plane area extends the fourth distance from the respective left edge portion to the respective right edge portion;
B) a fourth group of four conductors, wherein each conductor in the fourth group includes a shielded conductor bottom left edge, a shielded conductor bottom right edge and a bottom main-body conductive area, and wherein the bottom main-body conductive area of each conductor in the fourth group comprises
(1) a left edge portion of the respective shielded conductor bottom left edge,
(2) a right edge portion of the respective shielded conductor bottom right edge, and
(3) a fourth conductive plane area, and wherein
(a) the respective left edge portion and the respective right edge portion are parallel and separated from one another by the fourth distance as measured orthogonal therebetween, and
(b) the respective left edge portion, the respective fourth conductive plane area and the respective right edge portion are aligned co-planar with one another such that the width of the respective fourth conductive plane area extends the fourth distance from the respective left edge portion to the respective right edge portion;

wherein
a) each conductor in the third group is not a conductor in the fourth group,
b) the group of shielding conductors is conductively isolated from the third group and the fourth group,
c) all the third conductive plane areas in the third group are co-planar with one another,
d) all the fourth conductive plane areas in the fourth group are co-planar with one another,
e) all the third conductive plane areas and all the fourth conductive plane areas are all located between the shielding conductive areas of first and third shielding conductors,
f) the third conductive plane areas, the fourth conductive plane areas, and the shielding conductive areas of the first, second and third shielding conductors are all parallel with one another,
g) the third superposed conductive plane areas are physically shielded from the fourth conductive plane areas by the shielding conductive area of the second shielding conductor in position therebetween,
h) the width of each third conductive plane area of the third group is equal to the width of each fourth conductive plane area of the fourth group,
i) the third conductive plane area of the bottom main-body conductive area of a first conductor of the third group is in stacked superposed alignment with the fourth conductive plane area of the bottom main-body conductive area of a first conductor of the fourth group such that the left edge portion of the shielded conductor bottom left edge of the first conductor in the third group and the left edge portion of the shielded conductor bottom left edge of the first conductor in the fourth group are the same length, and
j) the third conductive plane area of the bottom main-body conductive area of a second conductor in the third group is in stacked superposed alignment with the fourth conductive plane area of the bottom main-body conductive area of a second conductor in the fourth group such that the left edge portion of the shielded conductor bottom left edge of the second conductor in the third group and the left edge portion of the shielded conductor bottom left edge of the second conductor in the fourth group are the same length,
k) the third conductive plane area of the bottom main-body conductive area of a third conductor in the third group is in stacked superposed alignment with the fourth conductive plane area of the bottom main-body conductive area of a third conductor in the fourth group such that the left edge portion of the shielded conductor bottom left edge of the third conductor in the third group and the left edge portion of the shielded conductor bottom left edge of the third conductor in the fourth group are the same length, and l) the third conductive plane area of the bottom main-body conductive area of a fourth conductor in the third group is in stacked superposed alignment with the fourth conductive plane area of the bottom main-body conductive area of a fourth conductor in the fourth group such that the left edge portion of the shielded conductor bottom left edge of the fourth conductor in the third group and the left edge portion of the shielded conductor bottom left edge of the fourth conductor in the fourth group are the same length, m) within the third group, the right edge portion of the shielded conductor bottom right edge of the first conductor is separated from the left edge portion of the shielded conductor bottom left edge of the second conductor by the second distance as measured orthogonal therebetween, n) within the third group, the right edge portion of the shielded conductor bottom right edge of the third conductor is separated from the left edge portion of the shielded conductor bottom left edge of the fourth conductor by the second distance as measured orthogonal therebetween, o) within the third group, the second distance separating the right edge portion of the shielded conductor bottom right edge of the first conductor from the left edge portion of the shielded conductor bottom left edge of the second conductor is occupied by dielectric therebetween, and p) within the third group, the second distance separating the right edge portion of the shielded conductor bottom right edge of the third conductor from the left edge portion of the shielded conductor bottom left edge of the fourth conductor is occupied by dielectric therebetween.

43. The conductor arrangement of claim 42, wherein
a) within the first group, the right edge portion of the shielded conductor bottom right edge of the second conductor is separated from the left edge portion of the shielded conductor bottom left edge of the third conductor by a third distance as measured orthogonal therebetween,
b) within the first group, the third distance separating the right edge portion of the shielded conductor bottom right edge of the second conductor from the left edge portion of the shielded conductor bottom left edge of the third conductor is occupied by dielectric therebetween,
c) within the third group, the right edge portion of the shielded conductor bottom right edge of the second conductor is separated from the left edge portion of the shielded conductor bottom left edge of the third conductor by the third distance as measured orthogonal therebetween, and
d) within the third group, the third distance separating the right edge portion of the shielded conductor bottom right edge of the second conductor from the left edge portion of the shielded conductor bottom left edge of the third conductor is occupied by dielectric therebetween.

44. The conductor arrangement of claim 43, wherein
a) one or more of the conductors in the first group is configured as an electrical data line,
b) one or more of the conductors in the second group is configured as an electrical data line,
c) one or more of the conductors in the third group is configured as an electrical data line, and d) one or more of the conductors in the fourth group is configured as an electrical data line.

45. The conductor arrangement of claim 43, wherein
a) one or more of the conductors in the first group is configured as an electrical data line,
b) one or more of the conductors in the second group is configured as an electrical data line,
c) one or more of the conductors in the third group is configured as an electrical data line,
d) one or more of the conductors in the fourth group is configured as an electrical data line, and
e) one or more of the first, second or third shielding conductive areas is configured as a shielding electrical node of a circuit that comprises at least one or more of the conductors in the first group.

46. The conductor arrangement of claim 43, wherein the conductor arrangement is partially embedded within an integrated circuit die.

47. The conductor arrangement of claim 43, wherein the conductor arrangement is partially embedded within a substrate.

48. An integrated circuit wafer comprising the conductor arrangement of claim 40.

49. An integrated circuit wafer comprising the conductor arrangement of claim 43.

50. A substrate comprising the conductor arrangement of claim 40.

51. A substrate comprising the conductor arrangement of claim 41.

52. The conductor arrangement of claim 43, further comprising:
A) a substrate; and
B) an integrated circuit die;
wherein
a) the integrated circuit die is attached to the substrate,
b) at least one or more of the conductors in the first group is conductively connected to the integrated circuit die,
c) at least one or more of the conductors in the second group is conductively connected to the integrated circuit die,
d) at least one or more of the conductors in the third group is conductively connected to the integrated circuit die, and
e) at least one or more of the conductors in the fourth group is conductively connected to the integrated circuit die.

53. The conductor arrangement of claim 52, wherein
a) one or more of the conductors in the first group is configured to operate as a feedthrough conductor when the integrated circuit die is energized,
b) one or more of the conductors in the second group is configured to operate as a feedthrough conductor when the integrated circuit die is energized,
c) one or more of the conductors in the third group is configured to operate as a feedthrough conductor when the integrated circuit die is energized, and
d) one or more of the conductors in the fourth group is configured to operate as a feedthrough conductor when the integrated circuit die is energized.

54. The conductor arrangement of claim 43, further comprising:
A) a substrate; and
B) an integrated circuit chip;
wherein
a) the integrated circuit chip is attached to the substrate,
b) at least one or more of the shielding conductors in the group of shielding conductors is conductively connected to the integrated circuit chip, c) one or more of the conductors in the first group is conductively connected to the integrated circuit chip,
d) one or more of the conductors in the second group is conductively connected to the integrated circuit chip,
e) one or more of the conductors in the third group is conductively connected to the integrated circuit chip, and
f) one or more of the conductors in the fourth group is conductively connected to the integrated circuit chip.

55. The conductor arrangement of claim 54, wherein
a) one or more of the conductors in the first group is configured to operate as a feedthrough conductor when the conductor arrangement is energized,
b) one or more of the conductors in the second group is configured to operate as a feedthrough conductor when the conductor arrangement is energized,
c) one or more of the conductors in the third group is configured to operate as a feedthrough conductor when the conductor arrangement is energized, and
d) one or more of the conductors in the fourth group is configured to operate as a feedthrough conductor when the conductor arrangement is energized.

56. A conductor arrangement comprising:
A) a first group of at least three conductors, wherein each conductor in the first group includes a shielded conductor bottom left edge, a shielded conductor bottom right edge and a bottom main-body conductive area, and wherein the bottom main-body conductive area of each conductor in the first group comprises
  (1) a left edge portion of the respective shielded conductor bottom left edge,
  (2) a right edge portion of the respective shielded conductor bottom right edge, and
  (3) a first conductive plane area, and wherein
    (a) the respective left edge portion and the respective right edge portion are of an equal length,
    (b) the respective left edge portion and the respective right edge portion are parallel and separated from one another by a first distance as measured orthogonal therebetween, and
    (c) the respective left edge portion, the respective first conductive plane area and the respective right edge portion are aligned co-planar with one another such that the width of the respective first conductive plane area extends the first distance from the respective left edge portion to the respective right edge portion;
B) a second group of at least three conductors, wherein each conductor in the second group includes a shielded conductor bottom left edge, a shielded conductor bottom right edge and a bottom main-body conductive area, and wherein the bottom main-body conductive area of each conductor in the second group comprises
  (1) a left edge portion of the respective shielded conductor bottom left edge,
  (2) a right edge portion of the respective shielded conductor bottom right edge, and
  (3) a second conductive plane area, and wherein
    (a) the respective left edge portion and the respective right edge portion are of an equal length,
    (b) the respective left edge portion and the respective right edge portion are parallel and separated from one another by the first distance as measured orthogonal therebetween, and
    (c) the respective left edge portion, the respective second conductive plane area and the respective right edge portion are aligned co-planar with one another such that the width of the respective second conductive plane area extends the first distance from the respective left edge portion to the respective right edge portion;
C) a group of common conductors that are conductively connected to one another, wherein the group comprises a first common conductor having a first shielding conductive area, a second common conductor having a second shielding conductive area and a third common conductor having a third shielding conductive area;

wherein
a) each conductor in the first group is not conductively connected to a conductor in the second group, and wherein each conductor in the first group is not conductively connected to a common conductor in the group of common conductors,
b) all the first conductive plane areas and all the second conductive plane areas are located between the first, second and third shielding conductive areas,
c) the first conductive plane areas, the second conductive plane areas, and the first, second and third shielding conductive areas are all parallel with one another,
d) the first conductive plane areas are physically shielded from the second conductive plane areas by the second shielding conductive area in position therebetween,
e) the width of each first conductive plane area in the first group is equal to the width of each second conductive plane area in the second group,
f) the first conductive plane area of the bottom main-body conductive area of a first conductor of the first group is stacked and aligned symmetrically with the second conductive plane area of the bottom main-body conductive area of a first conductor of the second group,
g) the first conductive plane area of the bottom main-body conductive area of a second conductor in the first group is stacked and aligned symmetrically with the second conductive plane area of the bottom main-body conductive area of a second conductor in the second group,
h) the first conductive plane area of the bottom main-body conductive area of a third conductor in the first group is stacked and aligned symmetrically with the second conductive plane area of the bottom main-body conductive area of a third conductor in the second group,
i) within the first group, the right edge portion of the shielded conductor bottom right edge of the first conductor is separated from the left edge portion of the shielded conductor bottom left edge of the second conductor by a second distance as measured orthogonal therebetween,
j) within the first group, the right edge portion of the shielded conductor bottom right edge of the second conductor is separated from the left edge portion of the shielded conductor bottom left edge of the third conductor by the second distance as measured orthogonal therebetween,
k) within the first group, the second distance separating the right edge portion of the shielded conductor bottom right edge of the first conductor from the left edge portion of the shielded conductor bottom left edge of the second conductor is occupied by dielectric therebetween, and
l) within the first group, the second distance separating the right edge portion of the shielded conductor bottom right edge of the second conductor from the left edge portion of the shielded conductor bottom left edge of the third conductor is occupied by dielectric therebetween.

57. The conductor arrangement of claim 56, wherein
a) one or more of the conductors in the first group is configured as an electrical data line,
b) one or more of the conductors in the second group is configured as an electrical data line, and
c) one or more of the common conductors of the group of common conductors is configured as a common electrical node for a circuit when the conductor arrangement is energized.

58. The conductor arrangement of claim 56, wherein the conductor arrangement is at least partially embedded within an integrated circuit die.

59. The conductor arrangement of claim 56, wherein the conductor arrangement is at least partially embedded within a substrate.

60. The conductor arrangement of claim 59, wherein
a) one or more of the conductors in the first group is a feedthrough conductor,
b) one or more of the conductors in the second group is a feedthrough conductor,
c) one or more of the common conductors in the group of common conductors is a shielding conductor, and
d) the second shielding conductive area is configured to operate as an electrically-shielding conductive area when the conductor arrangement is energized.

61. An electronic arrangement comprising:
[A] a first conductive shield;
[B] a second conductive shield that is spaced apart from the first conductive shield;
[C] a third conductive shield that is spaced apart from both the first and second conductive shields, wherein the second conductive shield is positioned between the first and third conductive shields;
[D] a first group of at least three substantially linear conductors that are positioned parallel to each other between the first and second conductive shields, and that each define a respective substantially planar bottom surface that is disposed within a first plane;
[E] a second group of at least three substantially linear conductors that are positioned parallel to each other between the second and third conductive shields and that each define a respective substantially planar top surface that is disposed within a second plane that is parallel to, and offset from, the first plane, wherein:
[a] the first, second, and third conductive shields are conductively connected to each other;
[b] each particular conductor within the first group of conductors comprises:
1. a first side edge that is longer than the width of the particular conductor; and
2. a second side edge that is longer than the width of the particular conductor;
[c] each specific conductor within the second group of conductors comprises:
1. a first side edge that is longer than the width of the specific conductor; and
2. a second side edge that is longer than the width of the specific conductor; and
[d] each individual conductor within the first group of conductors is positioned relative to a corresponding one of the second group of conductors so that:
1. the first side edge of the individual conductor aligns with the first side edge of the corresponding one of the second group of conductors, and
2. the second side edge of the individual conductor aligns with the second side edge of the corresponding one of the second group of conductors;
[e] each conductor within the first group of conductors is a substantially linear segment of a larger, elongated conductor; and
[f] each conductor within the second group of conductors is a substantially linear segment of a larger, elongated conductor.

62. The electronic arrangement of claim 61, wherein:
[a] the second conductive shield comprises a substantially planar upper surface that is parallel to both the first plane and the second plane;
[b] the second conductive shield comprises a substantially planar lower surface that is parallel to both the first plane and the second plane; and
[c] a distance between the first plane and the second conductive shield's substantially planar upper surface is equal to a distance between the second plane and the second conductive shield's substantially planar lower surface.

63. The electronic arrangement of claim 61, wherein:
[a] the second conductive shield comprises a substantially planar upper surface that is parallel to both the first plane and the second plane;
[b] the second conductive shield comprises a substantially planar lower surface that is parallel to both the first plane and the second plane;
[c] a distance between the first plane and the second conductive shield's substantially planar upper surface is equal to a distance between the second plane and the second conductive shield's substantially planar lower surface;
[d] the first conductive shield comprises a substantially planar lower surface that is parallel to both the first plane and the second plane;
[e] the third conductive shield comprises a substantially planar upper surface that is parallel to both the first plane and the second plane; and
[f] the distance between the first plane and the first conductive shield's substantially planar lower surface is equal to the distance between the second plane and the third conductive shield's upper surface.

64. The electronic arrangement of claim 61, wherein:
[a] the second conductive shield comprises a substantially planar upper surface that is parallel to both the first plane and the second plane;
[b] the second conductive shield comprises a substantially planar lower surface that is parallel to both the first plane and the second plane;
[c] a distance between the first plane and the second conductive shield's substantially planar upper surface is equal to a distance between the second plane and the second conductive shield's substantially planar lower surface;
[d] the first conductive shield comprises a substantially planar lower surface that is parallel to both the first plane and the second plane;
[e] the third conductive shield comprises a substantially planar upper surface that is parallel to both the first plane and the second plane;
[f] the distance between the first plane and the first conductive shield's substantially planar lower surface is equal to the distance between the second plane and the third conductive shield's upper surface;
[g] the conductors within the first group of conductors are spaced evenly apart; and
[h] the conductors within the second group of conductors are spaced evenly apart.

65. The electronic arrangement of claim 61, wherein:
[a] the second conductive shield comprises a substantially planar upper surface that is parallel to both the first plane and the second plane;
[b] the second conductive shield comprises a substantially planar lower surface that is parallel to both the first plane and the second plane;
[c] a distance between the first plane and the second conductive shield's substantially planar upper surface is equal to a distance between the second plane and the second conductive shield's substantially planar lower surface;
[d] the first conductive shield comprises a substantially planar lower surface that is parallel to both the first plane and the second plane;
[e] the third conductive shield comprises a substantially planar upper surface that is parallel to both the first plane and the second plane;
[f] the distance between the first plane and the first conductive shield's substantially planar lower surface is equal to the distance between the second plane and the third conductive shield's upper surface;
[g] the conductors within the first group of conductors are spaced evenly apart;
[h] the conductors within the second group of conductors are spaced evenly apart;
[i] there are no conductors positioned, within the first plane, between neighboring conductors within the first group of conductors; and
[j] there are no conductors positioned, within the second plane, between neighboring conductors within the second group of conductors.

66. The electronic arrangement of claim 61, wherein:
[a] the first group of conductors comprises at least four conductors;
[b] the second group of conductors comprises at least four conductors;
[c] the second conductive shield comprises a substantially planar upper surface that is parallel to both the first plane and the second plane;
[d] the second conductive shield comprises a substantially planar lower surface that is parallel to both the first plane and the second plane;
[e] a distance between the first plane and the second conductive shield's substantially planar upper surface is equal to a distance between the second plane and the second conductive shield's substantially planar lower surface;
[f] the first conductive shield comprises a substantially planar lower surface that is parallel to both the first plane and the second plane;
[g] the third conductive shield comprises a substantially planar upper surface that is parallel to both the first plane and the second plane;
[h] the distance between the first plane and the first conductive shield's substantially planar lower surface is equal to the distance between the second plane and the third conductive shield's upper surface;
[i] the conductors within the first group of conductors are spaced evenly apart;
[j] the conductors within the second group of conductors are spaced evenly apart;
[k] there are no conductors positioned, within the first plane, between neighboring conductors within the first group of conductors; and
[l] there are no conductors positioned, within the second plane, between neighboring conductors within the second group of conductors.

67. The electronic arrangement of claim 61, wherein each conductor within the first group of conductors is:
[a] electrically isolated from each of the other conductors within the first group of conductors; and
[b] electrically isolated from each of the conductors within the second group of conductors, and
each conductor within the second group of conductors is:
[a] electrically isolated from each of the other conductors within the second group of conductors; and
[b] electrically isolated from each of the conductors within the first group of conductors.

68. The electronic arrangement of claim 61, wherein:
[a] the first group of conductors comprises at least four conductors;
[b] the second group of conductors comprises at least four conductors;
[c] the second conductive shield comprises a substantially planar upper surface that is parallel to both the first plane and the second plane;
[d] the second conductive shield comprises a substantially planar lower surface that is parallel to both the first plane and the second plane;
[e] a distance between the first plane and the second conductive shield's substantially planar upper surface is equal to a distance between the second plane and the second conductive shield's substantially planar lower surface;
[f] the first conductive shield comprises a substantially planar lower surface that is parallel to both the first plane and the second plane;
[g] the third conductive shield comprises a substantially planar upper surface that is parallel to both the first plane and the second plane;
[h] the distance between the first plane and the first conductive shield's substantially planar lower surface is equal to the distance between the second plane and the third conductive shield's upper surface;
[i] the conductors within the first group of conductors are spaced evenly apart;
[j] the conductors within the second group of conductors are spaced evenly apart;
[k] there are no conductors positioned, within the first plane, between neighboring conductors within the first group of conductors;
[l] there are no conductors positioned, within the second plane, between neighboring conductors within the second group of conductors;
[1] each conductor within the first group of conductors is:
[a] electrically isolated from each of the other conductors within the first group of conductors; and
[b] electrically isolated from each of the conductors within the second group of conductors, and
[2] each conductor within the second group of conductors is:
[c] electrically isolated from each of the other conductors within the second group of conductors; and
[d] electrically isolated from each of the conductors within the first group of conductors.

69. The electronic arrangement of claim 61, wherein:
[a] the second conductive shield comprises a substantially planar upper surface that is parallel to both the first plane and the second plane;

[b] the second conductive shield comprises a substantially planar lower surface that is parallel to both the first plane and the second plane;
[c] a distance between the first plane and the second conductive shield's substantially planar upper surface is equal to a distance between the second plane and the second conductive shield's substantially planar lower surface;
[d] the first conductive shield comprises a substantially planar lower surface that is parallel to both the first plane and the second plane;
[e] the third conductive shield comprises a substantially planar upper surface that is parallel to both the first plane and the second plane;
[f] the distance between the first plane and the first conductive shield's substantially planar lower surface is equal to the distance between the second plane and the third conductive shield's upper surface;
[g] the conductors within the first group of conductors are spaced evenly apart;
[h] the conductors within the second group of conductors are spaced evenly apart;
[i] there are no conductors positioned, within the first plane, between neighboring conductors within the first group of conductors;
[j] there are no conductors positioned, within the second plane, between neighboring conductors within the second group of conductors;
[k] each conductor within the first group of conductors is:
[1] electrically isolated from each of the other conductors within the first group of conductors; and
[2] electrically isolated from each of the conductors within the second group of conductors, and
each conductor within the second group of conductors is:
[3] electrically isolated from each of the other conductors within the second group of conductors; and
[4] electrically isolated from each of the conductors within the first group of conductors,
and wherein
[a] the first conductive shield is positioned within a first layer of an integrated electronic component;
[b] the first group of conductors is positioned within a second layer of the electronic component;
[c] the second conductive shield is positioned within a third layer of the electronic component;
[d] the second group of conductors is positioned within a fourth layer of the electronic component; and
[e] the third conductive shield is positioned within a fifth layer of the electronic component.

70. The electronic arrangement of claim 61, wherein the second conductive shield and first and second groups of conductors are at least partially embedded within a substrate.

71. The electronic arrangement of claim 61, wherein:
[a] each conductor within the first group of conductors consists of a single, continuous linear length of material;
[b] each conductor within the second group of conductors consists of a single, continuous linear length of material;
[c] the first group of conductors comprises at least four conductors;
[d] the second group of conductors comprises at least four conductors;
[e] the second conductive shield comprises a substantially planar upper surface that is parallel to both the first plane and the second plane;
[f] the second conductive shield comprises a substantially planar lower surface that is parallel to both the first plane and the second plane;
[g] a distance between the first plane and the second conductive shield's substantially planar upper surface is equal to a distance between the second plane and the second conductive shield's substantially planar lower surface;
[h] the first conductive shield comprises a substantially planar lower surface that is parallel to both the first plane and the second plane;
[i] the third conductive shield comprises a substantially planar upper surface that is parallel to both the first plane and the second plane;
[j] the distance between the first plane and the first conductive shield's substantially planar lower surface is equal to the distance between the second plane and the third conductive shield's upper surface;
[k] the conductors within the first group of conductors are spaced evenly apart;
[l] the conductors within the second group of conductors are spaced evenly apart;
[m] there are no conductors positioned, within the first plane, between neighboring conductors within the first group of conductors;
[n] there are no conductors positioned, within the second plane, between neighboring conductors within the second group of conductors;
[o] each conductor within the first group of conductors is:
[a] electrically isolated from each of the other conductors within the first group of conductors; and
[b] electrically isolated from each of the conductors within the second group of conductors, and
[p] each conductor within the second group of conductors is:
[a] electrically isolated from each of the other conductors within the second group of conductors; and
[b] electrically isolated from each of the conductors within the first group of conductors.

72. A conductive arrangement comprising:
[1.] a first conductor plate, a second conductor plate that is spaced apart from the first conductor plate, and a third conductor plate that is spaced apart from both the first and second conductor plates, wherein
(1) the second conductor plate is positioned between the first and third conductor plates,
(2) the first, second and third conductor plates are parallel to one another,
(3) the first, second and third conductor plates are conductively connected to one another;
[2.] a first plurality of three conductors and a second plurality of three conductors, wherein each respective conductor of the first and second pluralities comprises a respective superposed elongated conductor portion that includes:
(1) a respective straight conductor edge first portion that is part of a respective first structural edge of the respective conductor, and
(2) a respective straight conductor edge second portion that is part of a respective second structural edge of the respective conductor, and
wherein the respective straight conductor edge first portion and the respective straight conductor edge second portion are
(1) co-planar with one another, and
(2) uniformly separated a first distance from one another as measured orthogonal therebetween, and
(3) each longer than the first distance;

wherein
- [A] the first, second and third conductor plates are each not conductively connected to any of the respective conductors,
- [B] the respective conductors of the first plurality are not respective conductors of the second plurality,
- [C] the respective superposed elongated conductor portions of the first plurality are
  - (1. all grouped together in close proximity to one another, and
  - (2. all horizontally spaced apart from one another, and
  - (3. each located between the first and second conductor plates such that the respective straight conductor edge first portions of the first plurality are
    - (a) all parallel to one another,
    - (b) all co-planar with one another, and
    - (c) each parallel to the second conductor plate,
  - (4. all uniformly spaced apart from the first conductor plate,
  - (5. all uniformly spaced apart from the second conductor plate, and
- [D] the respective superposed elongated conductor portions of the second plurality are
  - (1. all grouped together in close proximity to one another, and
  - (2. all horizontally spaced apart from one another, and
  - (3. each located between the second and third conductor plates such that the respective straight conductor edge second portions of the second plurality are
    - (a) all parallel to one another,
    - (b) all co-planar with one another, and
    - (c) each parallel to the second conductor plate,
  - (4. all uniformly spaced apart from the second conductor plate,
  - (5. all uniformly spaced apart from the third conductor plate, and
- [E] the second conductor plate physically shields all the respective superposed elongated conductor portions of the first plurality from all the respective superposed elongated conductor portions of the second plurality,
- [F] each one of the respective conductor edge straight aligned first portions is parallel to each one of the respective conductor edge straight aligned second portions,
- [G] the first and second pluralities each comprise a respective first conductor, a respective second conductor and a respective third conductor,
- [H] together, the respective superposed elongated conductor portions of the respective first conductors of the first and second pluralities are in superposed alignment,
- [I] together, the respective superposed elongated conductor portions of the respective second conductors of the first and second pluralities are in superposed alignment, and
- [J] together, the respective superposed elongated conductor portions of the respective third conductors of the first and second pluralities are in superposed alignment.

73. The conductive arrangement of claim 72, wherein
- [K] each respective straight conductor edge first portion defines a respective aligned left physical boundary of the respective superposed elongated conductor portion,
- [L] each respective straight conductor edge second portion defines a respective aligned right physical boundary of the respective superposed elongated conductor portion,
- [M] the lengths of the respective aligned left physical boundaries of the respective superposed elongated conductor portions of the respective first conductors are equal,
- [N] the lengths of the respective aligned right physical boundaries of the respective superposed elongated conductor portions of the respective first conductors are equal,
- [O] the lengths of the respective aligned left physical boundaries of the respective superposed elongated conductor portions of the respective second conductors are equal,
- [P] the lengths of the respective aligned right physical boundaries of the respective superposed elongated conductor portions of the respective second conductors are equal,
- [Q] the lengths of the respective aligned left physical boundaries of the respective superposed elongated conductor portions of the respective third conductors are equal,
- [R] the lengths of the respective aligned right physical boundaries of the respective superposed elongated conductor portions of the respective third conductors are equal,
- [S] the length of the respective aligned left physical boundary of the respective superposed elongated conductor portion of any of the respective conductors is always greater than the first distance, and
- [T] the length of the respective aligned right physical boundary of the respective superposed elongated conductor portion of any of the respective conductors is always greater than the first distance.

74. The conductive arrangement of claim 73, wherein in each of the first and second pluralities,
- [U] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured co-planar therebetween,
- [V] the respective aligned right physical boundary of the respective superposed elongated conductor portion of the respective second conductor and the respective aligned left physical boundary of the respective superposed elongated conductor portion of the respective third conductor are uniformly spaced apart from one another the second distance as measured co-planar therebetween,
- [W] the second distance extending directly between the respective aligned right physical boundary of the respective superposed elongated conductor portion of the respective first conductor and the respective aligned left physical boundary of the respective superposed elongated conductor portion of the respective second conductor is occupied only by a dielectric, and
- [X] the second distance extending directly between the respective aligned right physical boundary of the respective superposed elongated conductor portion of the respective second conductor and the respective aligned left physical boundary of the respective superposed elongated conductor portion of the respective third conductor is occupied only by the dielectric.

75. The conductive arrangement of claim 74, wherein in each of the first and second pluralities, the length of each one of the respective aligned left physical boundaries is equal to the length of each one of the respective aligned right physical boundaries.

76. The conductive arrangement of claim 72, wherein
- [K] each respective straight conductor edge first portion defines a respective aligned left physical boundary of the respective superposed elongated conductor portion,
- [L] each respective straight conductor edge second portion defines a respective aligned right physical boundary of the respective superposed elongated conductor portion,
- [M] the lengths of the respective aligned left physical boundaries of the respective superposed elongated conductor portions of the respective first conductors are equal,
- [N] the lengths of the respective aligned right physical boundaries of the respective superposed elongated conductor portions of the respective first conductors are equal,
- [O] the lengths of the respective aligned left physical boundaries of the respective superposed elongated conductor portions of the respective second conductors are equal,
- [P] the length of the respective aligned right physical boundaries of the respective superposed elongated conductor portions of the respective second conductors are equal,
- [Q] the lengths of the respective aligned left physical boundaries of the respective superposed elongated conductor portions of the respective third conductors are equal,
- [R] the lengths of the respective aligned right physical boundaries of the respective superposed elongated conductor portions of the respective third conductors are equal,
- [S] the length of the respective aligned left physical boundary of the respective superposed elongated conductor portion of any of the respective conductors is always greater than the first distance, and wherein in each of the first and second pluralities,
- [T] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured co-planar therebetween,
- [U] the respective aligned right physical boundary of the respective superposed elongated conductor portion of the respective second conductor and the respective aligned left physical boundary of the respective superposed elongated conductor portion of the respective third conductor are uniformly spaced apart from one another a third distance as measured co-planar therebetween,
- [V] the second distance extending directly between the respective aligned right physical boundary of the respective superposed elongated conductor portion of the respective first conductor and the respective aligned left physical boundary of the respective superposed elongated conductor portion of the respective second conductor is occupied only by a dielectric, and
- [W] the third distance extending directly between the respective aligned right physical boundary of the respective superposed elongated conductor portion of the respective second conductor and the respective aligned left physical boundary of the respective superposed elongated conductor portion of the respective third conductor is occupied only by the dielectric,
- [X] the length of each one of the respective aligned left physical boundaries is equal to the length of each one of the respective aligned right physical boundaries.

77. The conductive arrangement of claim 73, wherein in each of the first and second pluralities,
- [U] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured orthogonal therebetween,
- [V] the respective aligned right physical boundary of the respective superposed elongated conductor portion of the respective second conductor and the respective aligned left physical boundary of the respective superposed elongated conductor portion of the respective third conductor are uniformly spaced apart from one another the second distance as measured orthogonal therebetween,
- [W] the second distance extending directly between the respective aligned right physical boundary of the respective superposed elongated conductor portion of the respective first conductor and the respective aligned left physical boundary of the respective superposed elongated conductor portion of the respective second conductor is occupied only by a material, and
- [X] the second distance extending directly between the respective aligned right physical boundary of the respective superposed elongated conductor portion of the respective second conductor and the respective aligned left physical boundary of the respective superposed elongated conductor portion of the respective third conductor is occupied only by the material, and [Y] the length of each one of the respective aligned left physical boundaries is equal to the length of each one of the respective aligned right physical boundaries.

78. The conductive arrangement of claim 73, wherein in each of the first and second pluralities,
- [U] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured orthogonal therebetween,
- [V] the respective aligned right physical boundary of the respective superposed elongated conductor portion of the respective second conductor and the respective aligned left physical boundary of the respective superposed elongated conductor portion of the respective third conductor are uniformly spaced apart from one another a third distance as measured orthogonal therebetween,
- [W] the second distance extending directly between the respective aligned right physical boundary of the respective superposed elongated conductor portion of the respective first conductor and the respective aligned left physical boundary of the respective superposed elongated conductor portion of the respective second conductor is occupied only by a material, and
- [X] the third distance extending directly between the respective aligned right physical boundary of the respective superposed elongated conductor portion of the respective second conductor and the respective aligned left physical boundary of the respective superposed elongated conductor portion of the respective third conductor is occupied only by the material, and

[Y] the length of each one of the respective aligned left physical boundaries is equal to the length of each one of the respective aligned right physical boundaries.

79. The conductive arrangement of claim 72, wherein

[K] each respective straight conductor edge first portion defines a respective aligned left physical boundary of the respective superposed elongated conductor portion,

[L] each respective straight conductor edge second portion defines a respective aligned right physical boundary of the respective superposed elongated conductor portion,

[M] the length of each one of the respective aligned left physical boundaries is equal to the length of each one of the respective aligned right physical boundaries,

[N] the lengths of the respective aligned left physical boundaries are all equal to one another,

[O] the lengths of the respective aligned right physical boundaries are all equal to one another,

[P] the lengths of the respective aligned left physical boundaries are each always greater than the first distance, wherein in each of the first and second pluralities,

[Q] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured orthogonal therebetween,

[R] the respective aligned right physical boundary of the respective superposed elongated conductor portion of the respective second conductor and the respective aligned left physical boundary of the respective superposed elongated conductor portion of the respective third conductor are uniformly spaced apart from one another a third distance as measured orthogonal therebetween,

[S] the second distance extending directly between the respective aligned right physical boundary of the respective superposed elongated conductor portion of the respective first conductor and the respective aligned left physical boundary of the respective superposed elongated conductor portion of the respective second conductor is occupied only by a dielectric, and

[T] the third distance extending directly between the respective aligned right physical boundary of the respective superposed elongated conductor portion of the respective second conductor and the respective aligned left physical boundary of the respective superposed elongated conductor portion of the respective third conductor is occupied only by the dielectric.

80. The conductive arrangement of claim 72, wherein

[K] each respective straight conductor edge first portion defines a respective aligned left physical boundary of the respective superposed elongated conductor portion,

[L] each respective straight conductor edge second portion defines a respective aligned right physical boundary of the respective superposed elongated conductor portion,

[M] the length of each one of the respective aligned left physical boundaries is equal to the length of each one of the respective aligned right physical boundaries,

[N] the lengths of the respective aligned left physical boundaries are all equal to one another,

[O] the lengths of the respective aligned right physical boundaries are all equal to one another,

[P] the lengths of the respective aligned left physical boundaries are each always greater than the first distance, wherein in each of the first and second pluralities,

[Q] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured orthogonal therebetween,

[R] the respective aligned right physical boundary of the respective superposed elongated conductor portion of the respective second conductor and the respective aligned left physical boundary of the respective superposed elongated conductor portion of the respective third conductor are uniformly spaced apart from one another a third distance as measured orthogonal therebetween,

[S] the second distance between the respective aligned right physical boundary of the respective superposed elongated conductor portion of the respective first conductor and the respective aligned left physical boundary of the respective superposed elongated conductor portion of the respective second conductor is occupied only by a dielectric material extending completely therebetween, and

[T] the third distance between the respective aligned right physical boundary of the respective superposed elongated conductor portion of the respective second conductor and the respective aligned left physical boundary of the respective superposed elongated conductor portion of the respective third conductor is occupied only by the dielectric material extending completely therebetween.

81. The conductive arrangement of claim 72, wherein

[K] each respective straight conductor edge first portion defines a respective aligned left physical boundary of the respective superposed elongated conductor portion,

[L] each respective straight conductor edge second portion defines a respective aligned right physical boundary of the respective superposed elongated conductor portion,

[M] the length of each one of the respective aligned left physical boundaries is equal to the length of each one of the respective aligned right physical boundaries,

[N] the lengths of the respective aligned left physical boundaries are each always greater than the first distance, wherein in each of the first and second pluralities,

[O] the respective aligned right physical boundary of the respective superposed elongated conductor portion of the respective first conductor and the respective aligned left physical boundary of the respective superposed elongated conductor portion of the respective second conductor are uniformly spaced apart from one another a second distance as measured orthogonal therebetween,

[P] the respective aligned right physical boundary of the respective superposed elongated conductor portion of the respective second conductor and the respective aligned left physical boundary of the respective superposed elongated conductor portion of the respective third conductor are uniformly spaced apart from one another the second distance as measured orthogonal therebetween,

[Q] the second distance between the respective aligned right physical boundary of the respective superposed elongated conductor portion of the respective first conductor and the respective aligned left physical boundary of the respective superposed elongated conductor portion of the respective second conductor is occupied only by a dielectric material extending completely therebetween, and

[R] the second distance between the respective aligned right physical boundary of the respective superposed elongated conductor portion of the respective second conductor and the respective aligned left physical boundary of the respective superposed elongated conductor portion of the respective third conductor is occupied only by the dielectric material extending completely therebetween.

82. The conductive arrangement of claim 75, wherein the first distance is equal to the second distance.

83. The conductive arrangement of claim 77, wherein the first distance is equal to the second distance.

84. The conductive arrangement of claim 76, at least partially embedded within a microprocessor.

85. The conductive arrangement of claim 77, at least partially embedded within a microprocessor.

86. The conductive arrangement of claim 78, at least partially embedded within a microprocessor.

87. The conductive arrangement of claim 79, at least partially embedded within a processor comprising one or more transistors.

88. The conductive arrangement of claim 80, at least partially embedded within a processor comprising one or more transistors.

89. The conductive arrangement of claim 81, at least partially integrated within a component that includes both silicon material and one or more transistors.

90. The conductive arrangement of claim 74, at least partially integrated within a component that includes both silicon material and one or more transistors.

91. The conductive arrangement of claim 76, at least partially integrated within a component that includes both silicon material and one or more transistors.

92. The conductive arrangement of claim 75, at least partially embedded within a substrate.

93. The conductive arrangement of claim 76, at least partially embedded within a substrate.

94. The conductive arrangement of claim 77, at least partially embedded within a substrate.

95. The conductive arrangement of claim 78, at least partially embedded within a substrate.

96. The conductive arrangement of claim 79, at least partially embedded within a substrate.

97. The conductive arrangement of claim 80, at least partially embedded within a substrate.

98. The conductive arrangement of claim 81, at least partially embedded within a substrate.

99. The conductive arrangement of claim 93, further comprising:
[3.] a fourth conductor plate, a fifth conductor plate that is spaced apart from the fourth conductor plate, and a sixth conductor plate that is spaced apart from both the fourth and fifth conductor plates, wherein
[A] the fifth conductor plate is positioned between the fourth and sixth conductor plates,
[B] the fourth, fifth and sixth conductor plates are parallel to one another,
[C] the fourth, fifth and sixth conductor plates are conductively connected to one another;
[4.] a first energy conductor plate and a second energy conductor plate; wherein
[A] the fourth, fifth and sixth conductor plates are each larger in size than any one of the first and second energy conductor plates,
[B] the first and second energy conductor plates are each parallel to the fifth conductor plate,
[C] the first and second energy conductor plates are not conductively connected to any of the first, second, third, fourth, fifth and sixth conductor plates,
[D] the first energy conductor plate is sandwiched between the fourth and fifth conductor plates, and
[E] the second energy conductor plate is sandwiched between the fifth and sixth conductor plates.

100. The conductive arrangement of claim 94, further comprising:
[3.] a fourth conductor plate, a fifth conductor plate that is spaced apart from the fourth conductor plate, and a sixth conductor plate that is spaced apart from both the fourth and fifth conductor plates, wherein
[A] the fifth conductor plate is positioned between the fourth and sixth conductor plates,
[B] the fourth, fifth and sixth conductor plates are parallel to one another,
[C] the fourth, fifth and sixth conductor plates are conductively connected to one another;
[4.] a first energy conductor plate and a second energy conductor plate; wherein
[A] the fourth, fifth and sixth conductor plates are each larger in size than any one of the first and second energy conductor plates,
[B] the first and second energy conductor plates are each parallel to the fifth conductor plate,
[C] the first and second energy conductor plates are not conductively connected to any of the first, second, third, fourth, fifth and sixth conductor plates,
[D] the first energy conductor plate is sandwiched between the fourth and fifth conductor plates, and
[E] the second energy conductor plate is sandwiched between the fifth and sixth conductor plates.

101. The conductive arrangement of claim 95, further comprising:
[3.] a fourth conductor plate, a fifth conductor plate that is spaced apart from the fourth conductor plate, and a sixth conductor plate that is spaced apart from both the fourth and fifth conductor plates, wherein
[A] the fifth conductor plate is positioned between the fourth and sixth conductor plates,
[B] the fourth, fifth and sixth conductor plates are parallel to one another,
[C] the fourth, fifth and sixth conductor plates are conductively connected to one another;
[4.] a first energy conductor plate and a second energy conductor plate; wherein
[A] the fourth, fifth and sixth conductor plates are each larger in size than any one of the first and second energy conductor plates,
[B] the first and second energy conductor plates are each parallel to the fifth conductor plate,
[C] the first and second energy conductor plates are not conductively connected to any of the first, second, third, fourth, fifth and sixth conductor plates,
[D] the first energy conductor plate is sandwiched between the fourth and fifth conductor plates, and
[E] the second energy conductor plate is sandwiched between the fifth and sixth conductor plates.

102. The conductive arrangement of claim 98, further comprising:

[3.] a fourth conductor plate, a fifth conductor plate that is spaced apart from the fourth conductor plate, and a sixth conductor plate that is spaced apart from both the fourth and fifth conductor plates, wherein
  [A] the fifth conductor plate is positioned between the fourth and sixth conductor plates,
  [B] the fourth, fifth and sixth conductor plates are parallel to one another,
  [C] the fourth, fifth and sixth conductor plates are conductively connected to one another;
[4.] a first energy conductor plate and a second energy conductor plate; wherein
  [A] the fourth, fifth and sixth conductor plates are each larger in size than any one of the first and second energy conductor plates,
  [B] the first and second energy conductor plates are each parallel to the fifth conductor plate,
  [C] the first and second energy conductor plates are not conductively connected to any of the first, second, third, fourth, fifth and sixth conductor plates,
  [D] the first energy conductor plate is sandwiched between the fourth and fifth conductor plates, and
  [E] the second energy conductor plate is sandwiched between the fifth and sixth conductor plates, and
  [F] one or more of the fourth, fifth and sixth conductor plates is conductively connected to one or more of the first, second and third conductor plates.

103. The conductive arrangement of claim 99, wherein one or more of the fourth, fifth and sixth conductor plates is conductively connected to one or more of the first, second and third conductor plates.

104. The conductive arrangement of claim 100, further comprising:
[5.] a processor comprising one or more transistors, and wherein
  [A] the processor is attached to the substrate,
  [B] one or more of the fourth, fifth and sixth conductor plates is conductively connected to one or more of the first, second and third conductor plates, and
  [C] one or more of the first and second energy conductor plates is conductively connected to the processor.

105. The conductive arrangement of claim 101, further comprising:
[5.] a processor comprising one or more transistors, and wherein
  [A] the processor is attached to the substrate,
  [B] one or more of the fourth, fifth and sixth conductor plates is conductively connected to one or more of the first, second and third conductor plates, and
  [C] one or more of the first and second energy conductor plates is conductively connected to the processor.

106. The conductive arrangement of claim 103, wherein one or more of the first and second energy conductor plates is conductively connected to a processor comprising one or more transistors.

107. The conductive arrangement of claim 96, further comprising:
[3.] a processor comprising one or more transistors, and wherein
  [A] the processor is attached to the substrate, and
  [B] one or more of the first and second energy conductor plates is conductively connected to the processor.

108. The conductive arrangement of claim 97, further comprising:
[3.] a processor comprising one or more transistors, and wherein
  [A] the processor is attached to the substrate, and
  [B] one or more of the first and second energy conductor plates is conductively connected to the processor.

109. The conductive arrangement of claim 102, further comprising:
[5.] a processor comprising one or more transistors, and wherein
  [A] the processor is attached to the substrate.

110. The conductive arrangement of claim 92, further comprising:
[3.] a first energy conductor plate and a second energy conductor plate; wherein
  [A] the first, second and third conductor plates are each larger in size than any one of the first and second energy conductor plates,
  [B] the first and second energy conductor plates are each parallel to the second conductor plate,
  [C] the first and second energy conductor plates are not conductively connected to any of the first, second and third conductor plates,
  [D] the first energy conductor plate is sandwiched between the first and second conductor plates, and
  [E] the second energy conductor plate is sandwiched between the second and third conductor plates.

111. The conductive arrangement of claim 72, further comprising:
[3.] a third plurality of three conductors and a fourth plurality of three conductors, wherein each respective conductor of the third and fourth pluralities comprises a respective superposed elongated conductor portion that includes:
  (1) a respective straight conductor edge first portion that is part of a respective first structural edge of the respective conductor, and
  (2) a respective straight conductor edge second portion that is part of a respective second structural edge of the respective conductor, and
wherein the respective straight conductor edge first portion and the respective straight conductor edge second portion are
  (1) co-planar with one another, and
  (2) uniformly separated the first distance from one another as measured orthogonal therebetween, and
  (3) each longer than the first distance;
wherein
[A] the second conductor plate is not conductively connected to any one of the respective conductors of the third and fourth pluralities,
[B] the respective conductors of the third plurality are not respective conductors of the first, second and fourth pluralities,
[C] the respective conductors of the fourth plurality are not respective conductors of the first and second pluralities,
[D] the respective superposed elongated conductor portions of the third plurality are
  (1. all grouped together in close proximity to one another, and
  (2. all horizontally spaced apart from one another, and
  (3. each located between the first and second conductor plates such that the respective straight conductor edge first portions of the third plurality are
    (a) all parallel to one another,
    (b) all co-planar with one another, and
    (c) each parallel to the second conductor plate,
  (4. all uniformly spaced apart from the first conductor plate, (5. all uniformly spaced apart from the second conductor plate, and
[E] the respective superposed elongated conductor portions of the fourth plurality are
(1. all grouped together in close proximity to one another, and
(2. all horizontally spaced apart from one another, and
(3. each located between the second and third conductor plates such that the respective straight conductor edge second portions of the fourth plurality are
(a) all parallel to one another,
(b) all co-planar with one another, and
(c) each parallel to the second conductor plate,
(4. all uniformly spaced apart from the second conductor plate,
(5. all uniformly spaced apart from the third conductor plate, and
[F] the second conductor plate physically shields all the respective superposed elongated conductor portions of the third plurality from all the respective superposed elongated conductor portions of the fourth plurality,
[G] each one of the respective conductor edge straight aligned first portions of the third plurality is parallel to each one of the respective conductor edge straight aligned second portions of the fourth plurality,
[H] the third and fourth pluralities each comprise a respective first conductor, a respective second conductor, a respective third conductor and a respective fourth conductor,
[I] together, the respective superposed elongated conductor portions of the respective first conductors of the third and fourth pluralities are in superposed alignment,
[J] together, the respective superposed elongated conductor portions of the respective second conductors of the third and fourth pluralities are in superposed alignment,
[K] together, the respective superposed elongated conductor portions of the respective third conductors of the third and fourth pluralities are in superposed alignment.

112. The conductive arrangement of claim 111, wherein
[L] each respective straight conductor edge first portion defines a respective aligned left physical boundary of the respective superposed elongated conductor portion,
[M] each respective straight conductor edge second portion defines a respective aligned right physical boundary of the respective superposed elongated conductor portion,
[N] the length of each one of the respective aligned left physical boundaries is equal to the length of each one of the respective aligned right physical boundaries,
[O] the lengths of the respective aligned left physical boundaries are each always greater than the first distance,
[P] the lengths of the respective aligned right physical boundaries are each always greater than the first distance,
wherein in each of the first, second, third and fourth pluralities,
[Q] the respective aligned right physical boundary of the respective superposed elongated conductor portion of the respective first conductor and the respective aligned left physical boundary of the respective superposed elongated conductor portion of the respective second conductor are uniformly spaced apart from one another the second distance as measured orthogonal therebetween,
[R] the respective aligned right physical boundary of the respective superposed elongated conductor portion of the respective second conductor and the respective aligned left physical boundary of the respective superposed elongated conductor portion of the respective third conductor are uniformly spaced apart from one another the third distance as measured orthogonal therebetween,
[S] the second distance extending directly between the respective aligned right physical boundary of the respective superposed elongated conductor portion of the respective first conductor and the respective aligned left physical boundary of the respective superposed elongated conductor portion of the respective second conductor is occupied only by the dielectric, and
[T] the third distance extending directly between the respective aligned right physical boundary of the respective superposed elongated conductor portion of the respective second conductor and the respective aligned left physical boundary of the respective superposed elongated conductor portion of the respective third conductor is occupied only by the dielectric.

113. The conductive arrangement of claim 112, at least partially embedded within a substrate.

114. The conductive arrangement of claim 113, further comprising a processor comprising one or more transistors, wherein the processor is attached to the substrate.

115. The conductive arrangement of claim 114, further comprising:
[4.] a fourth conductor plate, a fifth conductor plate that is spaced apart from the fourth conductor plate, and a sixth conductor plate that is spaced apart from both the fourth and fifth conductor plates, wherein
[A] the fifth conductor plate is positioned between the fourth and sixth conductor plates,
[B] the fourth, fifth and sixth conductor plates are parallel to one another,
[C] the fourth, fifth and sixth conductor plates are conductively connected to one another;
[5.] a first energy conductor plate and a second energy conductor plate; wherein
[A] the fourth, fifth and sixth conductor plates are each larger in size than any one of the first and second energy conductor plates,
[B] the first and second energy conductor plates are each parallel to the fifth conductor plate,
[C] the first and second energy conductor plates are not conductively connected to any of the first, second, third, fourth, fifth and sixth conductor plates,
[D] the first energy conductor plate is sandwiched between the fourth and fifth conductor plates, and
[E] the second energy conductor plate is sandwiched between the fifth and sixth conductor plates, and
[F] one or more of the fourth, fifth and sixth conductor plates is conductively connected to one or more of the first, second and third conductor plates.

116. The conductive arrangement of claim 114, further comprising:
[4.] a first energy conductor plate and a second energy conductor plate; wherein
[A] the first, second and third conductor plates are each larger in size than any one of the first and second energy conductor plates,
[B] the first and second energy conductor plates are each parallel to the second conductor plate,
[C] the first and second energy conductor plates are not conductively connected to any of the first, second and third conductor plates,
[D] the first energy conductor plate is sandwiched between the first and second conductor plates, and

[E] the second energy conductor plate is sandwiched between the second and third conductor plates.

117. The conductive arrangement of claim 115, wherein
[G] two or more of the respective conductors of the first plurality are conductively connected to the processor,
[H] two or more of the respective conductors of the second plurality are conductively connected to the processor,
[I] two or more of the respective conductors of the third plurality are conductively connected to the processor,
[J] two or more of the respective conductors of the fourth plurality are conductively connected to the processor, and
[K] one or more of the first, second and third conductor plates is conductively connected to the processor.

118. The conductive arrangement of claim 116, wherein
[F] two or more of the respective conductors of the first plurality are conductively connected to the processor,
[G] two or more of the respective conductors of the second plurality are conductively connected to the processor,
[H] two or more of the respective conductors of the third plurality are conductively connected to the processor,
[I] two or more of the respective conductors of the fourth plurality are conductively connected to the processor, and
[J] one or more of the first, second and third conductor plates is conductively connected to the processor.

119. A transmission line conductor arrangement comprising:
1.] a first conductor plate, a second conductor plate that is spaced apart from the first conductor plate, and a third conductor plate that is spaced apart from both the first and second conductor plates, and wherein
  [a] the second conductor plate is positioned between the first and third conductor plates,
  [b] the first, second and third conductor plates are parallel to one another, and
  [c] the first, second and third conductor plates are conductively connected to one another;
2.] a first group of transmission line conductors and a second group of transmission line conductors, and wherein each respective transmission line conductor of the first group and each respective transmission line conductor of the second group comprises a respective superposed transmission line portion that is elongated and straight; wherein
[A] the first and second group of transmission line conductors total six respective transmission line conductors, and wherein none of the conductor plates are conductively connected to any of the respective transmission line conductors,
[B] the respective superposed transmission line portions of the first group are all
  1) located between the first and second conductor plates,
  2) uniformly spaced apart from the first conductor plate by only a dielectric therebetween,
  3) uniformly spaced apart from the second conductor plate by only the dielectric therebetween, and
  4) arranged in close proximity to one another such that
    (a) only the dielectric occupies the space that is directly between the respective superposed transmission line portion of a respective first transmission line conductor and the respective superposed transmission line portion of a respective second transmission line conductor, and
    (b) only the dielectric occupies the space that is directly between the respective superposed transmission line portion of the respective second transmission line conductor and the respective superposed transmission line portion of a respective third transmission line conductor, and
    (c) only the dielectric and the respective superposed transmission line portion of the respective second transmission line conductor occupies the space directly between the respective superposed transmission line portion of the respective first transmission line conductor and the respective superposed transmission line portion of the respective third transmission line conductor,
[C] the respective superposed transmission line portions of the second group are all
  1) located between the second and third conductor plates,
  2) uniformly spaced apart from the second conductor plate by only the dielectric therebetween,
  3) uniformly spaced apart from the third conductor plate by only the dielectric therebetween, and
  4) arranged in close proximity to one another such that
    (a) only the dielectric occupies the space that is directly between the respective superposed transmission line portion of a respective first transmission line conductor and the respective superposed transmission line portion of a respective second transmission line conductor, and
    (b) only the dielectric occupies the space that is directly between the respective superposed transmission line portion of the respective second transmission line conductor and the respective superposed transmission line portion of a respective third transmission line conductor, and
    (c) only the dielectric and the respective superposed transmission line portion of the respective second conductor occupies the space directly between the respective superposed transmission line portion of the respective first transmission line conductor and the respective superposed transmission line portion of the respective third transmission line conductor,
[D] the second conductor plate physically shields all the respective superposed transmission line portions of the first group from all the respective superposed transmission line portions of the second group,
[E] the individual respective superposed transmission line portions of the respective first transmission line conductors of the first and second groups are together stacked in superposition such that
  a. the two respective first transmission line conductors' respective superposed transmission line portions are equal sized structures relative to one another,
  b. the two respective first transmission line conductors' respective superposed transmission line portions are equal shaped structures relative to one another,
[F] the individual respective superposed transmission line portions of the respective second transmission line conductors of the first and second groups are together stacked in superposition such that
  a. the two respective second transmission line conductors' respective superposed transmission line portions are equal sized structures relative to one another,
  b. the two respective second transmission line conductors' respective superposed transmission line portions are equal shaped structures relative to one another,
[G] the individual respective superposed transmission line portions of the respective third transmission line conductors of the first and second groups are together stacked in superposition such that a. the two respective third transmission line conductors' respective superposed transmission line portions are equal sized structures relative to one another,
b. the two respective third transmission line conductors' respective superposed transmission line portions are equal shaped structures relative to one another.

120. A transmission line conductor arrangement comprising:
1.] a substrate;
2.] a first conductor plate, a second conductor plate that is spaced apart from the first conductor plate, and a third conductor plate that is spaced apart from both the first and second conductor plates, and wherein
  [a] the second conductor plate is positioned between the first and third conductor plates,
  [b] the first, second and third conductor plates are parallel to one another, and
  [c] the first, second and third conductor plates are conductively connected to one another;
3.] a first group of four transmission line conductors and a second group of four transmission line conductors, and wherein each respective transmission line conductor of the first group and each respective transmission line conductor of the second group comprises a respective superposed transmission line portion that is elongated and straight, and wherein the respective superposed transmission line portion is arranged and positioned within the substrate;
wherein
[A] the first and second group of transmission line conductors total eight respective transmission line conductors, and wherein none of the conductor plates are conductively connected to any of the respective transmission line conductors,
[B] the respective superposed transmission line portions of the first group are all
  [a] located between the first and second conductor plates,
  [b] uniformly spaced apart from the first conductor plate by only a dielectric therebetween,
  [c] uniformly spaced apart from the second conductor plate by only the dielectric therebetween, and
  [d] arranged in close proximity to one another such that
    (a.) only the dielectric occupies the space that is directly between the respective superposed transmission line portion of a respective first transmission line conductor and the respective superposed transmission line portion of a respective second transmission line conductor, and
    (b.) only the dielectric occupies the space that is directly between the respective superposed transmission line portion of the respective second transmission line conductor and the respective superposed transmission line portion of a respective third transmission line conductor,
    (c.) only the dielectric occupies the space that is directly between the respective superposed transmission line portion of the respective third transmission line conductor and the respective superposed transmission line portion of a respective fourth transmission line conductor, and
    (d.) only the dielectric and the respective superposed transmission line portions of the respective second and third transmission line conductors occupy the space directly between the respective superposed transmission line portion of the respective first transmission line conductor and the respective superposed transmission line portion of the respective fourth transmission line conductor,
[C] the respective superposed transmission line portions of the second group are all
  1) located between the second and third conductor plates,
  2) uniformly spaced apart from the second conductor plate by only the dielectric therebetween,
  3) uniformly spaced apart from the third conductor plate by only the dielectric therebetween, and
  4) arranged in close proximity to one another such that
    (a) only the dielectric occupies the space that is directly between the respective superposed transmission line portion of a respective first transmission line conductor and the respective superposed transmission line portion of a respective second transmission line conductor, and
    (b) only the dielectric occupies the space that is directly between the respective superposed transmission line portion of the respective second transmission line conductor and the respective superposed transmission line portion of a respective third transmission line conductor,
    (c) only the dielectric occupies the space that is directly between the respective superposed transmission line portion of the respective third transmission line conductor and the respective superposed transmission line portion of a respective fourth transmission line conductor, and
    (d) only the dielectric and the respective superposed transmission line portions of the respective second and third conductors occupy the space directly between the respective superposed transmission line portion of the respective first transmission line conductor and the respective superposed transmission line portion of the respective fourth transmission line conductor,
[D] the second conductor plate physically shields all the respective superposed transmission line portions of the first group from all the respective superposed transmission line portions of the second group,
[E] the individual respective superposed transmission line portions of the respective first transmission line conductors of the first and second groups are together stacked in superposition such that
  a. the two respective first transmission line conductors' respective superposed transmission line portions are equal sized structures relative to one another,
  b. the two respective first transmission line conductors' respective superposed transmission line portions are equal shaped structures relative to one another,
[F] the individual respective superposed transmission line portions of the respective second transmission line conductors of the first and second groups are together stacked in superposition such that
  a. the two respective second transmission line conductors' respective superposed transmission line portions are equal sized structures relative to one another,
  b. the two respective second transmission line conductors' respective superposed transmission line portions are equal shaped structures relative to one another,
[G] the individual respective superposed transmission line portions of the respective third transmission line conductors of the first and second groups are together stacked in superposition such that a. the two respective third transmission line conductors' respective superposed transmission line portions are equal sized structures relative to one another, b. the two respective third transmission line conductors' respective superposed transmission line portions are equal shaped structures relative to one another,

[H] the individual respective superposed transmission line portions of the respective fourth transmission line conductors of the first and second groups are together stacked in superposition such that a. the two respective fourth transmission line conductors' respective superposed transmission line portions are equal sized structures relative to one another, and b. the two respective fourth transmission line conductors' respective superposed transmission line portions are equal shaped structures relative to one another.

121. The transmission line conductor arrangement of claim 119, wherein

[H] in the first group, all of the respective superposed transmission line portions are arranged in a first direction orientation relative to one another,

[I] in the second group, all of the respective superposed transmission line portions are arranged in the first direction orientation relative to one another, and

[J] all of the respective superposed transmission line portions of the first and second groups are in parallel longitudinal alignment relative to one another.

122. The transmission line conductor arrangement of claim 121, wherein

[K] in the first group,
(a) the shortest distance between the respective superposed transmission line portion of the respective first transmission line conductor and the respective superposed transmission line portion of the respective second transmission line conductor is a first distance,
(b) the shortest distance between the respective superposed transmission line portion of the respective second transmission line conductor and the respective superposed transmission line portion of the respective third transmission line conductor is a second distance, and
(c) the shortest distance between the respective superposed transmission line portion of the respective first transmission line conductor and the respective superposed transmission line portion of the respective third transmission line conductor is a third distance,

[L] in the second group,
(a) the shortest distance between the respective superposed transmission line portion of the respective first transmission line conductor and the respective superposed transmission line portion of the respective second transmission line conductor is the first distance,
(b) the shortest distance between the respective superposed transmission line portion of the respective second transmission line conductor and the respective superposed transmission line portion of the respective third transmission line conductor is the second distance, and
(c) the shortest distance between the respective superposed transmission line portion of the respective first transmission line conductor and the respective superposed transmission line portion of the respective third transmission line conductor is the third distance.

123. The transmission line conductor arrangement of claim 122, wherein the first and second distances are equal.

124. The transmission line conductor arrangement of claim 122, wherein the first and second distances are not equal.

125. The transmission line conductor arrangement of claim 122, wherein in each of the first and second groups, the respective superposed transmission line portions of the first, second, and third transmission line conductors are arranged respectively from left to right.

126. The transmission line conductor arrangement of claim 120, wherein

[I] in the first group, all of the respective superposed transmission line portions are arranged in a first direction orientation relative to one another,

[J] in the second group, all of the respective superposed transmission line portions are arranged in the first direction orientation relative to one another, and

[K] all of the respective superposed transmission line portions of the first and second groups are in parallel longitudinal alignment relative to one another.

127. The transmission line conductor arrangement of claim 126, wherein

[L] in the first group,
(a) the shortest distance between the respective superposed transmission line portion of the respective first transmission line conductor and the respective superposed transmission line portion of the respective second transmission line conductor is a first distance,
(b) the shortest distance between the respective superposed transmission line portion of the respective second transmission line conductor and the respective superposed transmission line portion of the respective third transmission line conductor is a second distance,
(c) the shortest distance between the respective superposed transmission line portion of the respective third transmission line conductor and the respective superposed transmission line portion of the respective fourth transmission line conductor is a third distance, and
(d) the shortest distance between the respective superposed transmission line portion of the respective first transmission line conductor and the respective superposed transmission line portion of the respective fourth transmission line conductor is a fourth distance,

[M] in the second group,
(a) the shortest distance between the respective superposed transmission line portion of the respective first transmission line conductor and the respective superposed transmission line portion of the respective second transmission line conductor is the first distance,
(b) the shortest distance between the respective superposed transmission line portion of the respective second transmission line conductor and the respective superposed transmission line portion of the respective third transmission line conductor is the second distance,
(c) the shortest distance between the respective superposed transmission line portion of the respective third transmission line conductor and the respective superposed transmission line portion of the respective fourth transmission line conductor is the third distance, and
(d) the shortest distance between the respective superposed transmission line portion of the respective first transmission line conductor and the respective superposed transmission line portion of the respective fourth transmission line conductor is the fourth distance.

128. The transmission line conductor arrangement of claim 127, wherein the first and third distances are equal to one another.

129. The transmission line conductor arrangement of claim 127, wherein the first, second and third distances are equal to one another.

130. The transmission line conductor arrangement of claim 127, wherein in each of the first and second groups, the respective superposed transmission line portions of the first, second, third and fourth transmission line conductors are arranged respectively from left to right.

131. The transmission line conductor arrangement of claim 128, wherein in each of the first and second groups, the respective superposed transmission line portions of the first, second, third and fourth transmission line conductors are arranged respectively from left to right.

132. A conductor arrangement comprising:
1.] a substrate;
2.] a shield structure that comprises three conductively connected conductor plates including:
  (a) an upper conductor plate,
  (b) a center conductor plate that is spaced apart from the upper conductor plate, and
  (c) a lower conductor plate that is spaced apart from both the upper and center conductor plates, wherein the upper, center and lower conductor plates are each physically parallel to one another, and wherein the center conductor plate is stacked between the upper and lower conductor plates;
3.] a first group of four elongated conductors and a second group of four elongated conductors, and wherein each respective elongated conductor of the first group and each respective elongated conductor of the second group includes a respective superposed elongated straight section that is a three dimensional elongated conductor part of the respective elongated conductor; wherein
  A] none of the respective elongated conductors are conductively connected to any of the upper conductor plate, center conductor plate, and lower conductor plate,
  B] the upper, center and the lower conductor plates and all of the respective superposed elongated straight sections are located within the substrate,
  C] the upper, center and lower conductor plates are each larger in physical size than any one of the respective superposed elongated straight sections,
  D] the respective superposed elongated straight sections are each physically parallel to each one of the upper, center and lower conductor plates,
  E] the respective superposed elongated straight sections are physically parallel to one another,
  F] the respective superposed elongated straight sections are together oriented in common longitudinal alignment relative to one another,
  G] all of the respective superposed elongated straight sections of the first group are
    (1. uniformly spaced a first vertical distance apart from the upper conductor plate,
    (2. uniformly spaced a second vertical distance apart from the center conductor plate,
    (3. sandwiched between the upper and center conductor plates, and
    (4. located and grouped together so that
      (a.) relative to each other, the respective superposed elongated straight section of a respective first elongated conductor is located adjacent to the respective superposed elongated straight section of a respective second elongated conductor such that the respective superposed elongated straight section of the respective first elongated conductor and the respective superposed elongated straight section of the respective second elongated conductor are uniformly spaced apart from each other a first horizontal distance, and
      (b.) the respective superposed elongated straight section of the respective second elongated conductor is adjacent to the respective superposed elongated straight section of a respective third elongated conductor such that the respective superposed elongated straight section of the respective second elongated conductor and the respective superposed elongated straight section of the respective third elongated conductor are uniformly spaced apart from each other a second horizontal distance, and
      (c.) the respective superposed elongated straight section of the respective third elongated conductor is adjacent to the respective superposed elongated straight section of a respective fourth elongated conductor such that the respective superposed elongated straight section of the respective third elongated conductor and the respective superposed elongated straight section of the respective fourth elongated conductor are uniformly spaced apart from each other a third horizontal distance,
  H] all of the respective superposed elongated straight sections of the second group are
    (1. uniformly spaced apart a third vertical distance from the center conductor plate,
    (2. uniformly spaced apart a fourth vertical distance from the lower conductor plate,
    (3. sandwiched between the center and lower conductor plates, and
    (4. located and grouped together so that
      (a.) relative to each other, the respective superposed elongated straight section of a respective first elongated conductor is located adjacent to the respective superposed elongated straight section of a respective second elongated conductor such that the respective superposed elongated straight section of the respective first elongated conductor and the respective superposed elongated straight section of the respective second elongated conductor are uniformly spaced apart from each other the first horizontal distance, and
      (b.) the respective superposed elongated straight section of the respective second elongated conductor is adjacent to the respective superposed elongated straight section of a respective third elongated conductor such that the respective superposed elongated straight section of the respective second elongated conductor and the respective superposed elongated straight section of the respective third elongated conductor are uniformly spaced apart from each other the second horizontal distance, and
      (c.) the respective superposed elongated straight section of the respective third elongated conductor is adjacent to the respective superposed elongated straight section of a respective fourth elongated conductor such that the respective superposed elongated straight section of the respective third elongated conductor and the respective superposed elongated straight section of the respective fourth elongated conductor are uniformly spaced apart from each other the third horizontal distance, I] each one of the respective superposed elongated straight sections of the first group is shielded from each one of the respective superposed elongated straight sections of the second group by the center conductor plate located therebetween, and wherein together, in physical three-dimensional arrangement relative to each other, A] the respective superposed elongated straight sections of the respective first elongated conductors of the first and second groups are in superposition, and B] the respective superposed elongated straight sections of the respective second elongated conductors of the first and second groups are in superposition, and C] the respective superposed elongated straight sections of the respective third elongated conductors of the first and second groups are in superposition, and D] the respective superposed elongated straight sections of the respective fourth elongated conductors of the first and second groups are in superposition.

133. The conductor arrangement of claim 132, wherein each one of the respective elongated conductors is a respective data line conductor.

134. The conductor arrangement of claim 132, wherein each one of the respective elongated conductors is a respective transmission line conductor.

135. The conductor arrangement of claim 132, wherein each one of the respective elongated conductors is a respective bypass conductor.

136. The conductor arrangement of claim 132, wherein the second vertical distance is equal to the third vertical distance.

137. The conductor arrangement of claim 132, wherein the first horizontal distance is equal to the third horizontal distance.

138. The conductor arrangement of claim 132, wherein the first, second and third horizontal distances are equal to one another.

139. The transmission line conductor arrangement of claim 119, further comprising:
- 3.] a third group of transmission line conductors and a fourth group of transmission line conductors, wherein each respective transmission line conductor of the third group and each respective transmission line conductor of the fourth group comprises a respective superposed transmission line portion that is elongated and straight; wherein
- [A] the first, second, third and fourth group of transmission line conductors total twelve respective transmission line conductors, and wherein none of the first, second and third conductor plates are conductively connected to any of the respective transmission line conductors of the third and fourth groups,
- [B] the respective superposed transmission line portions of the third group are all
  - 5) located between the first and second conductor plates,
  - 6) uniformly spaced apart from the first conductor plate by only the dielectric therebetween,
  - 7) uniformly spaced apart from the second conductor plate by only the dielectric therebetween, and
  - 8) arranged in close proximity to one another such that
    - (d) only the dielectric occupies the space that is directly between the respective superposed transmission line portion of a respective first transmission line conductor and the respective superposed transmission line portion of a respective second transmission line conductor, and
    - (e) only the dielectric occupies the space that is directly between the respective superposed transmission line portion of the respective second transmission line conductor and the respective superposed transmission line portion of a respective third transmission line conductor, and
    - (f) only the dielectric and the respective superposed transmission line portion of the respective second transmission line conductor occupies the space directly between the respective superposed transmission line portion of the respective first transmission line conductor and the respective superposed transmission line portion of the respective third transmission line conductor,
- [C] the respective superposed transmission line portions of the fourth group are all
  - 5) located between the second and third conductor plates,
  - 6) uniformly spaced apart from the second conductor plate by only the dielectric therebetween,
  - 7) uniformly spaced apart from the third conductor plate by only the dielectric therebetween, and
  - 8) arranged in close proximity to one another such that
    - (d) only the dielectric occupies the space that is directly between the respective superposed transmission line portion of a respective first transmission line conductor and the respective superposed transmission line portion of a respective second transmission line conductor, and
    - (e) only the dielectric occupies the space that is directly between the respective superposed transmission line portion of the respective second transmission line conductor and the respective superposed transmission line portion of a respective third transmission line conductor, and
    - (f) only the dielectric and the respective superposed transmission line portion of the respective second conductor occupies the space directly between the respective superposed transmission line portion of the respective first transmission line conductor and the respective superposed transmission line portion of the respective third transmission line conductor,
- [D] the second conductor plate physically shields all the respective superposed transmission line portions of the third group from all the respective superposed transmission line portions of the fourth group,
- [E] the individual respective superposed transmission line portions of the respective first transmission line conductors of the third and fourth groups are together stacked in superposition such that
  - a. the two respective first transmission line conductors' respective superposed transmission line portions are equal sized structures relative to one another,
  - b. the two respective first transmission line conductors' respective superposed transmission line portions are equal shaped structures relative to one another,
- [F] the individual respective superposed transmission line portions of the respective second transmission line conductors of the third and fourth groups are together stacked in superposition such that
  - a. the two respective second transmission line conductors' respective superposed transmission line portions are equal sized structures relative to one another,
  - b. the two respective second transmission line conductors' respective superposed transmission line portions are equal shaped structures relative to one another,
- [G] the individual respective superposed transmission line portions of the respective third transmission line conductors of the third and fourth groups are together stacked in superposition such that
  a. the two respective third transmission line conductors' respective superposed transmission line portions are equal sized structures relative to one another, and
  b. the two respective third transmission line conductors' respective superposed transmission line portions are equal shaped structures relative to one another.

140. The transmission line conductor arrangement of claim 139, wherein
  [H] in the first group, all of the respective superposed transmission line portions are arranged in a first direction orientation relative to one another,
  [I] in the second group, all of the respective superposed transmission line portions are arranged in the first direction orientation relative to one another,
  [J] in the third group, all of the respective superposed transmission line portions are arranged in a second direction orientation relative to one another,
  [K] in the fourth group, all of the respective superposed transmission line portions are arranged in the second direction orientation relative to one another,
  [L] all of the respective superposed transmission line portions of the first and second groups are in parallel longitudinal alignment relative to one another, and
  [M] all of the respective superposed transmission line portions of the third and fourth groups are in parallel longitudinal alignment relative to one another.

141. The transmission line conductor arrangement of claim 140, wherein the first direction orientation is the same as the second direction orientation.

142. The transmission line conductor arrangement of claim 140, wherein the first direction orientation is not substantially the same as the second direction orientation.

143. The transmission line conductor arrangement of claim 140, wherein all of the respective transmission line portions of the first, second, third and fourth groups are each in parallel longitudinal alignment relative to one another.

144. The transmission line conductor arrangement of claim 140, at least partially embedded within a substrate.

145. The transmission line conductor arrangement of claim 144, further comprising a processor comprising one or more transistors, wherein the processor is attached to the substrate.

146. The transmission line conductor arrangement for claim 145, further comprising:
  [4] a fourth conductor plate, a fifth conductor plate that is spaced apart from the fourth conductor plate, and a sixth conductor plate that is spaced apart from both the fourth and fifth conductor plates, wherein
    [A] the fourth, fifth and sixth conductor plates are each parallel to one another,
    [B] the fifth conductor plate is stacked between the fourth and sixth conductor plates,
    [C] the fourth, fifth and sixth conductor plates are conductively connected to one another;
  [5] a first energy conductor plate and a second energy conductor plate; wherein
    [A] the fourth, fifth and sixth conductor plates are each larger in size than any one of the first and second energy conductor plates,
    [B] the first and second energy conductor plates are each parallel to the fifth conductor plate,
    [C] the first and second energy conductor plates are not conductively connected to any of the first, second, third, fourth, fifth and sixth conductor plates,
    [D] the first energy conductor plate is sandwiched between the fourth and fifth conductor plates,
    [E] the second energy conductor plate is sandwiched between the fifth and sixth conductor plates, and
    [F] one or more of the fourth, fifth and sixth conductor plates is conductively connected to one or more of the first, second and third conductor plates.

147. The transmission line conductor arrangement of claim 146, further comprising:
  [4] a first energy conductor plate and a second energy conductor plate; wherein
    [A] the first, second and third conductor plates are each larger in size than any one of the first and second energy conductor plates,
    [B] the first and second energy conductor plates are each parallel to the second conductor plate,
    [C] the first and second energy conductor plates are not conductively connected to any of the first, second and third conductor plates,
    [D] the first energy conductor plate is sandwiched between the first and second conductor plates, and
    [E] the second energy conductor plate is sandwiched between the second and third conductor plates.

148. The transmission line conductor arrangement of claim 146, wherein
  [L] two or more of the respective conductors of the first group are conductively connected to the processor,
  [M] two or more of the respective conductors of the second group are conductively connected to the processor,
  [N] two or more of the respective conductors of the third group are conductively connected to the processor,
  [O] two or more of the respective conductors of the fourth group are conductively connected to the processor, and
  [P] one or more of the first, second and third conductor plates is conductively connected to the processor.

149. The transmission line conductor arrangement for claim 147, wherein
  [K] two or more of the respective conductors of the first group are conductively connected to the processor,
  [L] two or more of the respective conductors of the second group are conductively connected to the processor,
  [M] two or more of the respective conductors of the third group are conductively connected to the processor,
  [N] two or more of the respective conductors of the fourth group are conductively connected to the processor, and
  [O] one or more of the first, second and third conductor plates is conductively connected to the processor.

150. The transmission line conductor arrangement of claim 120, further comprising:
  4.] a third group of four transmission line conductors and a fourth group of four transmission line conductors, wherein each respective transmission line conductor of the third group and each respective transmission line conductor of the fourth group comprises a respective superposed transmission line portion that is elongated and straight; wherein
    [H] the third and fourth groups together total eight respective transmission line conductors, and wherein none of the first, second and third conductor plates are conductively connected to any of the respective transmission line conductors of the third and fourth groups,
    [I] the respective superposed transmission line portions of the third group are all
      9) located between the first and second conductor plates,
      10) uniformly spaced apart from the first conductor plate by only the dielectric therebetween,
      11) uniformly spaced apart from the second conductor plate by only the dielectric therebetween, and 12) arranged in close proximity to one another such that
  - (g) only the dielectric occupies the space that is directly between the respective superposed transmission line portion of a respective first transmission line conductor and the respective superposed transmission line portion of a respective second transmission line conductor, and
  - (h) only the dielectric occupies the space that is directly between the respective superposed transmission line portion of the respective second transmission line conductor and the respective superposed transmission line portion of a respective third transmission line conductor, and
  - (i) only the dielectric occupies the space that is directly between the respective superposed transmission line portion of the respective third transmission line conductor and the respective superposed transmission line portion of a respective fourth transmission line conductor, and
  - (j) only the dielectric and the respective superposed transmission line portions of the respective second and third transmission line conductors occupy the space directly between the respective superposed transmission line portion of the respective first transmission line conductor and the respective superposed transmission line portion of the respective fourth transmission line conductor,

[J] the respective superposed transmission line portions of the fourth group are all
  9) located between the second and third conductor plates,
  10) uniformly spaced apart from the second conductor plate by only the dielectric therebetween,
  11) uniformly spaced apart from the third conductor plate by only the dielectric therebetween, and
  12) arranged in close proximity to one another such that
  - (g) only the dielectric occupies the space that is directly between the respective superposed transmission line portion of a respective first transmission line conductor and the respective superposed transmission line portion of a respective second transmission line conductor, and
  - (h) only the dielectric occupies the space that is directly between the respective superposed transmission line portion of the respective second transmission line conductor and the respective superposed transmission line portion of a respective third transmission line conductor, and
  - (i) only the dielectric occupies the space that is directly between the respective superposed transmission line portion of the respective third transmission line conductor and the respective superposed transmission line portion of a respective fourth transmission line conductor, and
  - (j) only the dielectric and the respective superposed transmission line portions of the respective second and third conductors occupy the space directly between the respective superposed transmission line portion of the respective first transmission line conductor and the respective superposed transmission line portion of the respective fourth transmission line conductor,

[K] the second conductor plate physically shields all the respective superposed transmission line portions of the third group from all the respective superposed transmission line portions of the fourth group,

[L] the individual respective superposed transmission line portions of the respective first transmission line conductors of the third and fourth groups are together stacked in superposition such that
  - a. the two respective first transmission line conductors' respective superposed transmission line portions are equal sized structures relative to one another,
  - b. the two respective first transmission line conductors' respective superposed transmission line portions are equal shaped structures relative to one another,

[M] the individual respective superposed transmission line portions of the respective second transmission line conductors of the third and fourth groups are together stacked in superposition such that
  - a. the two respective second transmission line conductors' respective superposed transmission line portions are equal sized structures relative to one another,
  - b. the two respective second transmission line conductors' respective superposed transmission line portions are equal shaped structures relative to one another,

[N] the individual respective superposed transmission line portions of the respective third transmission line conductors of the third and fourth groups are together stacked in superposition such that
  - a. the two respective third transmission line conductors' respective superposed transmission line portions are equal sized structures relative to one another,
  - b. the two respective third transmission line conductors' respective superposed transmission line portions are equal shaped structures relative to one another,

[O] the individual respective superposed transmission line portions of the respective fourth transmission line conductors of the third and fourth groups are together stacked in superposition such that
  - a. the two respective fourth transmission line conductors' respective superposed transmission line portions are equal sized structures relative to one another, and
  - b. the two respective fourth transmission line conductors' respective superposed transmission line portions are equal shaped structures relative to one another.

151. The transmission line conductor arrangement of claim 150, wherein
  [N] in the first group, all of the respective superposed transmission line portions are arranged in a first direction orientation relative to one another,
  [O] in the second group, all of the respective superposed transmission line portions are arranged in the first direction orientation relative to one another,
  [P] in the third group, all of the respective superposed transmission line portions are arranged in a second direction orientation relative to one another,
  [Q] in the fourth group, all of the respective superposed transmission line portions are arranged in the second direction orientation relative to one another,
  [R] all of the respective superposed transmission line portions of the first and second groups are in parallel longitudinal alignment relative to one another, and
  [S] all of the respective superposed transmission line portions of the third and fourth groups are in parallel longitudinal alignment relative to one another.

152. The transmission line conductor arrangement of claim 151, wherein the first direction orientation is the same as the second direction orientation.

153. The transmission line conductor arrangement of claim 151, wherein the first direction orientation is not substantially the same as the second direction orientation.

154. The transmission line conductor arrangement of claim 151, wherein all of the respective transmission line portions of the first, second, third and fourth groups are each in parallel longitudinal alignment relative to one another.

155. The transmission line conductor arrangement of claim 151, further comprising a processor comprising one or more transistors, and wherein the processor is attached to the substrate.

156. The transmission line conductor arrangement for claim 155, further comprising:
  [6] a fourth conductor plate, a fifth conductor plate that is spaced apart from the fourth conductor plate, and a sixth conductor plate that is spaced apart from both the fourth and fifth conductor plates, wherein
    [A] the fourth, fifth and sixth conductor plates are each parallel to one another;
    [B] the fifth conductor plate is stacked between the fourth and sixth conductor plates,
    [C] the fourth, fifth and sixth conductor plates are conductively connected to one another;
  [7] a first energy conductor plate and a second energy conductor plate; wherein
    [G] the fourth, fifth and sixth conductor plates are each larger in size than any one of the first and second energy conductor plates,
    [H] the first and second energy conductor plates are each parallel to the fifth conductor plate,
    [I] the first and second energy conductor plates are not conductively connected to any of the first, second, third, fourth, fifth and sixth conductor plates,
    [J] the first energy conductor plate is sandwiched between the fourth and fifth conductor plates,
    [K] the second energy conductor plate is sandwiched between the fifth and sixth conductor plates, and
    [L] one or more of the fourth, fifth and sixth conductor plates is conductively connected to one or more of the first, second and third conductor plates.

157. The transmission line conductor arrangement of claim 151, further comprising:
  [5] a first energy conductor plate and a second energy conductor plate; wherein
    [F] the first, second and third conductor plates are each larger in size than any one of the first and second energy conductor plates,
    [G] the first and second energy conductor plates are each parallel to the second conductor plate,
    [H] the first and second energy conductor plates are not conductively connected to any of the first, second and third conductor plates,
    [I] the first energy conductor plate is sandwiched between the first and second conductor plates, and
    [J] the second energy conductor plate is sandwiched between the second and third conductor plates.

158. The transmission line conductor arrangement of claim 155, wherein
  [Q] two or more of the respective conductors of the first group are conductively connected to the processor,
  [R] two or more of the respective conductors of the second group are conductively connected to the processor,
  [S] two or more of the respective conductors of the third group are conductively connected to the processor,
  [T] two or more of the respective conductors of the fourth group are conductively connected to the processor, and
  [U] one or more of the first, second and third conductor plates is conductively connected to the processor.

159. The transmission line conductor arrangement for claim 156, wherein
  [P] two or more of the respective conductors of the first group are conductively connected to the processor,
  [Q] two or more of the respective conductors of the second group are conductively connected to the processor,
  [R] two or more of the respective conductors of the third group are conductively connected to the processor,
  [S] two or more of the respective conductors of the fourth group are conductively connected to the processor, and
  [T] one or more of the first, second and third conductor plates is conductively connected to the processor.

160. A conductor arrangement comprising:
1.] a conductive structure having at least three conductively connected conductor plates that include:
    (d) an upper conductor plate,
    (e) a center conductor plate that is spaced apart from the upper conductor plate, and
    (f) a lower conductor plate that is spaced apart from both the upper and center conductor plates, wherein the upper, center and lower conductor plates are each parallel to one another, and wherein the center conductor plate is stacked between the upper and lower conductor plates;
2.] a first group of three electrical conductors and second group of three electrical conductors, and wherein each respective electrical conductor of the first and second groups includes a respective superposed electrical conductor straight section that is elongated;
wherein
J] none of the respective electrical conductors of the first and second groups are conductively connected to the conductive structure,
K] the respective superposed electrical conductor straight sections of the first and second groups are each parallel to one another,
L] all of the respective superposed electrical conductor straight sections of the first and second groups are oriented in common longitudinal alignment relative to one another,
M] the respective superposed electrical conductor straight sections of the first group are together
    (5. uniformly spaced apart a first vertical distance from the upper conductor plate,
    (6. uniformly spaced apart a second vertical distance from the center conductor plate,
    (7. sandwiched between the upper and center conductor plates, and
N] the respective superposed electrical conductor straight sections of the first group are located together so that
    (d.) relative to each other, the respective superposed electrical conductor straight section of a respective first electrical conductor is located adjacent to the respective superposed electrical conductor straight section of a respective second electrical conductor such that the respective superposed electrical conductor straight section of the respective first electrical conductor and the respective superposed electrical conductor straight section of the respective second electrical conductor are separated by a first horizontal distance, and
    (e.) the respective superposed electrical conductor straight section of the respective second electrical conductor is adjacent to the respective superposed electrical conductor straight section of a respective third electrical conductor such that the respective superposed electrical conductor straight section of the respective second electrical conductor and the respective superposed electrical conductor straight section of the respective third electrical conductor are separated from each other by a second horizontal distance, O] the respective superposed electrical conductor straight sections of the second group are together
  (1. uniformly spaced apart a third vertical distance from the center conductor plate,
  (2. uniformly spaced apart a fourth vertical distance from the lower conductor plate,
  (3. sandwiched between the center and lower conductor plates, and P] the respective superposed electrical conductor straight sections of the second group are located together so that
  (d.) relative to each other, the respective superposed electrical conductor straight section of a respective first electrical conductor is located adjacent to the respective superposed electrical conductor straight section of a respective second electrical conductor such that the respective superposed electrical conductor straight section of the respective first electrical conductor and the respective superposed electrical conductor straight section of the respective second electrical conductor are separated by the first horizontal distance, and
  (e.) the respective superposed electrical conductor straight section of the respective second electrical conductor is adjacent to the respective superposed electrical conductor straight section of a respective third electrical conductor such that the respective superposed electrical conductor straight section of the respective second electrical conductor and the respective superposed electrical conductor straight section of the respective third electrical conductor are separated from each other by the second horizontal distance, Q] all of the respective superposed electrical conductor straight sections of the first group are shielded from all of the respective superposed electrical conductor straight sections of the second group by the center conductor plate stacked therebetween, and 3.] a grouping of three dimensional alignment arrangements of particular respective superposed electrical conductor straight sections of the first and second groups that includes:
  (1) the respective first electrical conductors' respective superposed electrical conductor straight sections in superposition relative to each other, and
  (2) the respective second electrical conductors' respective superposed electrical conductor straight sections in superposition relative to each other, and
  (3) the respective third electrical conductors' respective superposed electrical conductor straight sections in superposition relative to each other.

161. The conductor arrangement of claim 160, further comprising:
  4.] a third group of three electrical conductors and fourth group of three electrical conductors, and wherein each respective electrical conductor of the third and fourth groups includes a respective superposed electrical conductor straight section that is elongated;
  wherein
  A] none of the respective electrical conductors are conductively connected to the conductive structure,
  B] the upper, center and lower conductor plates are each larger in size than any one of the respective superposed electrical conductor straight sections,
  C] none of the respective electrical conductors of the third and fourth groups are conductively connected to any one of the respective electrical conductors of the first and second groups,
  D] the respective superposed electrical conductor straight sections of the third and fourth groups are each parallel to one another,
  E] all of the respective superposed electrical conductor straight sections of the third and fourth groups are oriented in common longitudinal alignment relative to one another,
  F] the respective superposed electrical conductor straight sections of the third group are together
    (1. uniformly spaced apart a fifth vertical distance from the upper conductor plate,
    (2. uniformly spaced apart a sixth vertical distance from the center conductor plate,
    (3. sandwiched between the upper and center conductor plates, and
  G] the respective superposed electrical conductor straight sections of the third group are located together so that
    (1. relative to each other, the respective superposed electrical conductor straight section of a respective first electrical conductor is located adjacent to the respective superposed electrical conductor straight section of a respective second electrical conductor such that the respective superposed electrical conductor straight section of the respective first electrical conductor and the respective superposed electrical conductor straight section of the respective second electrical conductor are separated by a third horizontal distance, and
    (2. the respective superposed electrical conductor straight section of the respective second electrical conductor is adjacent to the respective superposed electrical conductor straight section of a respective third electrical conductor such that the respective superposed electrical conductor straight section of the respective second electrical conductor and the respective superposed electrical conductor straight section of the respective third electrical conductor are separated from each other by a fourth horizontal distance,
  H] the respective superposed electrical conductor straight sections of the fourth group are together
    (1. uniformly spaced apart a seventh vertical distance from the center conductor plate,
    (2. uniformly spaced apart an eighth vertical distance from the lower conductor plate,
    (3. sandwiched between the center and lower conductor plates, and
  I] the respective superposed electrical conductor straight sections of the fourth group are located together so that
    (1. relative to each other, the respective superposed electrical conductor straight section of a respective first electrical conductor is located adjacent to the respective superposed electrical conductor straight section of a respective second electrical conductor such that the respective superposed electrical conductor straight section of the respective first electrical conductor and the respective superposed electrical conductor straight section of the respective second electrical conductor are separated by the third horizontal distance, and
    (2. the respective superposed electrical conductor straight section of the respective second electrical conductor is adjacent to the respective superposed electrical conductor straight section of a respective third electrical conductor such that the respective superposed electrical conductor straight section of the respective second electrical conductor and the respective superposed electrical conductor straight section of the respective third electrical conductor are separated from each other by the fourth horizontal distance, J] all of the respective superposed electrical conductor straight sections of the third group are shielded from all of the respective superposed electrical conductor straight sections of the fourth group by the center conductor plate stacked therebetween, 5.] a grouping of three dimensional alignment arrangements of particular respective superposed electrical conductor straight sections of the third and fourth groups that includes:
(1) the respective first electrical conductors' respective superposed electrical conductor straight sections in superposition relative to each other, and
(2) the respective second electrical conductors' respective superposed electrical conductor straight sections in superposition relative to each other, and
(3) the respective third electrical conductors' respective superposed electrical conductor straight sections in superposition relative to each other.

162. The conductor arrangement of claim 160, further comprising:

4.] a third group of three electrical conductors and fourth group of three electrical conductors, and wherein each respective electrical conductor of the third and fourth groups includes a respective superposed electrical conductor straight section that is elongated;

wherein

A] none of the respective electrical conductors are conductively connected to the conductive structure, B] the conductive structure is larger in size than any one of the respective superposed electrical conductor straight sections, C] none of the respective electrical conductors of the third and fourth groups are conductively connected to any one of the respective electrical conductors of the first and second groups, D] the respective superposed electrical conductor straight sections of the third and fourth groups are each parallel to one another, E] all of the respective superposed electrical conductor straight sections of the third and fourth groups are oriented in common longitudinal alignment relative to one another, F] the respective superposed electrical conductor straight sections of the third group are together
(1. uniformly spaced apart the first vertical distance from the upper conductor plate,
(2. uniformly spaced apart the second vertical distance from the center conductor plate,
(3. sandwiched between the upper and center conductor plates, and G] the respective superposed electrical conductor straight sections of the third group are located together so that
(1. relative to each other, the respective superposed electrical conductor straight section of a respective first electrical conductor is located adjacent to the respective superposed electrical conductor straight section of a respective second electrical conductor such that the respective superposed electrical conductor straight section of the respective first electrical conductor and the respective superposed electrical conductor straight section of the respective second electrical conductor are separated by the first horizontal distance, and
(2. the respective superposed electrical conductor straight section of the respective second electrical conductor is adjacent to the respective superposed electrical conductor straight section of a respective third electrical conductor such that the respective superposed electrical conductor straight section of the respective second electrical conductor and the respective superposed electrical conductor straight section of the respective third electrical conductor are separated from each other by the second horizontal distance, H] the respective superposed electrical conductor straight sections of the fourth group are together
(1. uniformly spaced apart the third vertical distance from the center conductor plate,
(2. uniformly spaced apart the fourth vertical distance from the lower conductor plate,
(3. sandwiched between the center and lower conductor plates, and I] the respective superposed electrical conductor straight sections of the fourth group are located together so that
(1. relative to each other, the respective superposed electrical conductor straight section of a respective first electrical conductor is located adjacent to the respective superposed electrical conductor straight section of a respective second electrical conductor such that the respective superposed electrical conductor straight section of the respective first electrical conductor and the respective superposed electrical conductor straight section of the respective second electrical conductor are separated by the first horizontal distance, and
(2. the respective superposed electrical conductor straight section of the respective second electrical conductor is adjacent to the respective superposed electrical conductor straight section of a respective third electrical conductor such that the respective superposed electrical conductor straight section of the respective second electrical conductor and the respective superposed electrical conductor straight section of the respective third electrical conductor are separated from each other by the second horizontal distance, J] all of the respective superposed electrical conductor straight sections of the third group are shielded from all of the respective superposed electrical conductor straight sections of the fourth group by the center conductor plate stacked therebetween, 5.] a grouping of three dimensional alignment arrangements of particular respective superposed electrical conductor straight sections of the third and fourth groups that includes:
(1) the respective first electrical conductors' respective superposed electrical conductor straight sections in superposition relative to each other, and
(2) the respective second electrical conductors' respective superposed electrical conductor straight sections in superposition relative to each other, and
(3) the respective third electrical conductors' respective superposed electrical conductor straight sections in superposition relative to each other.

163. The conductor arrangement of claim 160, further comprising a substrate; and wherein each one of the respective superposed electrical conductor straight sections is located within the substrate.

164. The conductor arrangement of claim 161, further comprising a substrate; and wherein each one of the respective superposed electrical conductor straight sections is located within the substrate.

165. The conductor arrangement of claim 162, further comprising a substrate; and wherein each one of the respective superposed electrical conductor straight sections is located within the substrate.

166. The conductor arrangement of claim 160, wherein each one of the respective electrical conductors is a respective data line.

167. The conductor arrangement of claim 161, wherein each one of the respective electrical conductors is a respective data line.

168. The conductor arrangement of claim 162, wherein each one of the respective electrical conductors is a respective data line.

169. The conductor arrangement of claim 163, wherein each one of the respective electrical conductors is a respective data line.

170. The conductor arrangement of claim 164, wherein each one of the respective electrical conductors is a respective data line.

171. The conductor arrangement of claim 165, wherein each one of the respective electrical conductors is a respective data line.

172. A line conductor arrangement comprising:
1.] a substrate;
2.] three conductively connected shields including:
  (1) a first shield,
  (2) a second shield that is spaced apart from the first shield, and
  (3) a third shield that is spaced apart from both of the first and second shields, and wherein the first, second and third shields are each
    (a.) a conductive shield,
    (b.) at least partially embedded within the substrate, and
    (c.) stacked parallel to one another such that the second shield is located
      1) below the first shield,
      2) above the third shield, and
      3) between the first and third shields;
3.] a first grouping of four individual line conductor structures, and wherein the four individual line conductor structures of the first grouping are
  (1) each horizontally aligned in a close proximity arrangement relative to at least one of the other individual line conductor structures of the first grouping, and
  (2) each positioned in the close proximity arrangement within the space between the first and second shields;
4.] a second grouping of four individual line conductor structures, and wherein the four individual line conductor structures of the second grouping are
  (1) each horizontally aligned in the close proximity arrangement relative to at least one of the other individual line conductor structures of the second grouping, and
  (2) each positioned in the close proximity arrangement within the space between the second and third shields; wherein A} the three conductively connected shields are each larger in size than any one of the individual line conductor structures,
B} the three conductively connected shields are each parallel to all of the individual line conductor structures,
C} the individual line conductor structures are each embedded within the substrate,
D} the individual line conductor structures of the first grouping are not the individual line conductor structures of the second grouping,
E} each of the individual line conductor structures of the first and second groupings is a respective elongated straight portion of a respective larger individual, elongated line conductor of the line conductor arrangement,
F} each of the individual line conductor structures belongs to a different respective larger individual, elongated line conductor of the line conductor arrangement,
G} none of the three conductively connected shields are conductively attached to any of the respective larger individual, elongated line conductors,
H} each of the respective larger individual, elongated line conductors is at least partially embedded within the substrate such that within the substrate, the respective larger individual, elongated line conductors are each conductively isolated from one another,
I} the individual line conductor structures are aligned parallel to one another such that all of the individual line conductor structures are arranged together in the same physically longitudinal structure orientation,
J} each of the individual line conductor structures of the first grouping is vertically aligned to only one corresponding individual line conductor structure of the second grouping and each of the individual line conductor structures of the second grouping is vertically aligned to only one corresponding individual line conductor structure of the first grouping, such that the first and second groupings both include
  (1) a respective first individual line conductor structure such that both respective first individual line conductor structures of the first and second groupings are together
    (a.) physically shielded from one another by the second shield located therebetween, and
    (b.) in superposition,
  (2) a respective second individual line conductor structure such that both respective second individual line conductor structures of the first and second groupings are together
    (a.) physically shielded from one another by the second shield located therebetween, and
    (b.) in superposition,
  (3) a respective third individual line conductor structure such that both respective third individual line conductor structures of the first and second groupings are together
    (a.) physically shielded from one another by the second shield located therebetween, and
    (b.) in superposition,
  (4) a respective fourth individual line conductor structure such that both respective fourth individual line conductor structures of the first and second groupings are together
    (a.) physically shielded from one another by the second shield located therebetween; and
    (b.) in superposition.

173. A straight conductor arrangement comprising:
1.] a substrate;
2.] three conductively connected conductive shields including:
   (1) a first shield,
   (2) a second shield that is spaced apart from the first shield, and
   (3) a third shield that is spaced apart from both of the first and second shields, and wherein the first, second and third shields are each
      (a.) at least partially embedded within the substrate, and
      (b.) stacked parallel to one another such that the second shield is located
         1) below the first shield,
         2) above the third shield, and
         3) between the first and third shields;
3.] a first grouping of four individual structurally aligned straight conductors, and wherein the four individual structurally aligned straight conductors of the first grouping are
   (1) each physically aligned in close proximity relative to at least one of the other individual structurally aligned straight conductors of the first grouping,
   (2) each physically positioned in a side by side arrangement to at least one of the other individual structurally aligned straight conductors of the first grouping within the space between the first and second shields;
4.] a second grouping of four individual structurally aligned straight conductors, and wherein the four individual structurally aligned straight conductors of the second grouping are
   (1) each physically aligned in close proximity relative to at least one of the other individual structurally aligned straight conductors of the second grouping,
   (2) each physically positioned in the side by side arrangement to at least one of the other individual structurally aligned straight conductors of the second grouping within the space between the second and third shields; wherein
A} the three conductively connected shields are parallel to all of the individual structurally aligned straight conductors,
B} the three conductively connected shields are each larger in size than any one of the individual structurally aligned straight conductors,
C} the individual structurally aligned straight conductors are embedded within the substrate,
D} the individual structurally aligned straight conductors of the first grouping are not the individual structurally aligned straight conductors of the second grouping,
E} each of the individual structurally aligned straight conductors of the first and second groupings is a respective individual superposed elongated conductor straight portion of a respective larger individual, elongated conductor of the straight conductor arrangement,
F} each of the individual structurally aligned straight conductors of the first and second groupings belongs to a different respective larger individual, elongated conductor of the straight conductor arrangement,
G} none of the three conductively connected shields are conductively attached to any of the respective larger individual, elongated conductors,
H} the respective larger individual, elongated conductors are each at least partially embedded within the substrate such that within the substrate, the respective larger individual, elongated conductors are each conductively isolated from one another,
I} the individual structurally aligned straight conductors are aligned parallel to one another such that all of the individual structurally aligned straight conductors are arranged together in the same physically longitudinal structure orientation,
J} each of the individual structurally aligned straight conductors of the first grouping is vertically aligned to only one corresponding individual structurally aligned straight conductor of the second grouping and each of the individual structurally aligned straight conductors of the second grouping is vertically aligned to only one corresponding individual structurally aligned straight conductor of the first grouping, such that the first and second groupings both include
   [1] a respective first individual structurally aligned straight conductor such that both respective first individual structurally aligned straight conductors of the first and second groupings are together
      [a] physically shielded from one another by the second shield located therebetween, and
      [b] in a first superposed alignment arrangement,
   [2] a respective second individual structurally aligned straight conductor such that both respective second individual structurally aligned straight conductors of the first and second groupings are together
      [a] physically shielded from one another by the second shield located therebetween, and
      [b] in a second superposed alignment arrangement,
   [3] a respective third individual structurally aligned straight conductor such that both respective third individual structurally aligned straight conductors of the first and second groupings are together
      [a] physically shielded from one another by the second shield located therebetween, and
      [b] in a third superposed alignment arrangement,
   [4] a respective fourth individual structurally aligned straight conductor such that both respective fourth individual structurally aligned straight conductors of the first and second groupings are together
      [a] physically shielded from one another by the second shield located therebetween; and
      [b] in a fourth superposed alignment arrangement.

174. The straight conductor arrangement of claim 173, further comprising:
5.] a microprocessor; wherein
   [a] the microprocessor is attached to the substrate,
   [b] the microprocessor is conductively connected to each one of the respective larger individual, elongated conductors of the straight conductor arrangement,
6.] a first circuit assembly that includes
   [a] the respective first individual structurally aligned straight conductor of the first grouping,
   [b] the respective second individual structurally aligned straight conductor of the first grouping, and
   [c] the microprocessor,
7.] a second circuit assembly that includes
   [a] the respective third individual structurally aligned straight conductor of the first grouping,
   [b] the respective fourth individual structurally aligned straight conductor of the first grouping, and
   [c] the microprocessor,
8.] a third circuit assembly that includes
   [a] the respective first individual structurally aligned straight conductor of the second grouping,

[b] the respective second individual structurally aligned straight conductor of the second grouping, and
[c] the microprocessor, and
9.] a fourth circuit assembly that includes
[a] the respective third individual structurally aligned straight conductor of the second grouping,
[d] the respective fourth individual structurally aligned straight conductor of the second grouping, and
[e] the microprocessor.

175. The straight conductor arrangement of claim 174, further comprising:
10.] a first common conductor plate;
11.] a second common conductor plate that is spaced apart from the first common conductor plate; and
12.] a third common conductor plate that is spaced apart from both the first and second common conductor plates;
wherein
[a] the second common conductor plate is positioned between the first and third common conductor plates,
[b] the first, second and third common conductor plates are stacked parallel to one another, and
[c] the first, second and third common conductor plates are conductively connected to one another;
13.] a first plate-shaped conductor; and
14.] a second plate-shaped conductor;
wherein
[a] the first, second and third common conductor plates are each larger in size than any one of the first and second plate-shaped conductors,
[b] the first and second plate-shaped conductors are each parallel to the first, second and third common conductor plates,
[c] the first and second plate-shaped conductors are each not conductively connected to any of the first, second and third common conductor plates,
[d] the first and second plate-shaped conductors are each not conductively connected to any of the first, second and third shields,
[e] the first plate-shaped conductor is stacked between the first and second common conductor plates,
[f] the second plate-shaped conductor is stacked between the second and third common conductor plates, and
[g] the first and second plate-shaped conductors and the first, second and third common conductor plates are all at least partially embedded within the substrate.

176. The straight conductor arrangement of claim 175, wherein
[a] the first circuit assembly is configured such that none of the four individual structurally aligned straight conductors of the second grouping are of the first circuit assembly,
[b] the second circuit assembly is configured such that none of the four individual structurally aligned straight conductors of the second grouping are of the second circuit assembly,
[c] the third circuit assembly is configured such that none of the four individual structurally aligned straight conductors of the first grouping are of the third circuit assembly, and
[d] the fourth circuit assembly is configured such that none of the four individual structurally aligned straight conductors of the first grouping are of the fourth circuit assembly.

177. The straight conductor arrangement of claim 174, wherein
[a] the first circuit assembly is configured such that none of the four individual structurally aligned straight conductors of the second grouping are of the first circuit assembly,
[b] the second circuit assembly is configured such that none of the four individual structurally aligned straight conductors of the second grouping are of the second circuit assembly,
[c] the third circuit assembly is configured such that none of the four individual structurally aligned straight conductors of the first grouping are of the third circuit assembly, and
[d] the fourth circuit assembly is configured such that none of the four individual structurally aligned straight conductors of the first grouping are of the fourth circuit assembly.

178. The straight conductor arrangement of claim 176, wherein the first, second, third and fourth circuit assemblies are separate from one another.

179. The straight conductor arrangement of claim 177, wherein the first, second, third and fourth circuit assemblies are separate from one another.

180. The straight conductor arrangement of claim 176, wherein when the straight conductor arrangement is energized, the first, second, third and fourth circuit assemblies operate separately from one another.

181. The straight conductor arrangement of claim 177, wherein when the straight conductor arrangement is energized, the first, second, third and fourth circuit assemblies operate separately from one another.

182. The straight conductor arrangement of claim 180, wherein one or both of the first and second plate-shaped conductors is part of a fifth circuit assembly that includes at least an energy source.

183. The straight conductor arrangement of claim 180, wherein when the respective first individual structurally aligned straight conductors of the first and second groupings are both energized, portions of energy arrive simultaneously within the first superposed alignment arrangement.

184. The straight conductor arrangement of claim 183, wherein when the respective second individual structurally aligned straight conductors of the first and second groupings are both energized, portions of energy arrive simultaneously within the second superposed alignment arrangement.

185. The straight conductor arrangement of claim 181, wherein when the respective third individual structurally aligned straight conductors of the first and second groupings are both energized, portions of energy arrive simultaneously within the third superposed alignment arrangement.

186. The straight conductor arrangement of claim 185, wherein when the respective fourth individual structurally aligned straight conductors of the first and second groupings are both energized, portions of energy arrive simultaneously within the fourth superposed alignment arrangement.

187. The straight conductor arrangement of claim 181, wherein when the straight conductor arrangement is energized, any one or more of first, second and third shields are the physical location of a voltage reference for electrical signals propagating along any one or more of the first, second, third and fourth circuit assemblies.

188. The straight conductor arrangement of claim 184, wherein any one or more of the first, second and third shields are configured as a physical location for voltage reference utilized by energy propagating to or from the microprocessor when the microprocessor is energized.

189. The straight conductor arrangement of claim 188, wherein one or both of the first and second plate-shaped conductors is part of a fifth circuit assembly that includes an energy source.

190. The straight conductor arrangement of claim 177, wherein
[a] the first, second, third and fourth circuit assemblies are separate from one another,
[b] in the first grouping,
(1) only a dielectric occupies the space that is directly between the respective first individual structurally aligned straight conductor and the respective second individual structurally aligned straight conductor,
(2) only the dielectric occupies the space that is directly between the respective second individual structurally aligned straight conductor and the respective third individual structurally aligned straight conductor, and
(3) only the dielectric occupies the space that is directly between the respective third individual structurally aligned straight conductor and the respective fourth individual structurally aligned straight conductor,
[c] in the second grouping,
(1) only the dielectric occupies the space that is directly between the respective first individual structurally aligned straight conductor and the respective second individual structurally aligned straight conductor,
(2) only the dielectric occupies the space that is directly between the respective second individual structurally aligned straight conductor and the respective third individual structurally aligned straight conductor, and
(3) only the dielectric occupies the space that is directly between the respective third individual structurally aligned straight conductor and the respective fourth individual structurally aligned straight conductor, and
wherein
(1) only the dielectric occupies the space that is directly between the respective first individual structurally aligned straight conductor of the first grouping and the second shield,
(2) only the dielectric occupies the space that is directly between the second shield and the respective first individual structurally aligned straight conductor of the second grouping,
(3) only the dielectric occupies the space that is directly between the respective second individual structurally aligned straight conductor of the first grouping and the second shield,
(4) only the dielectric occupies the space that is directly between the second shield and the respective second individual structurally aligned straight conductor of the second grouping,
(5) only the dielectric occupies the space that is directly between the respective third individual structurally aligned straight conductor of the first grouping and the second shield,
(6) only the dielectric occupies the space that is directly between the second shield and the respective third individual structurally aligned straight conductor of the second grouping,
(7) only the dielectric occupies the space that is directly between the respective fourth individual structurally aligned straight conductor of the first grouping and the second shield, and
(8) only the dielectric occupies the space that is directly between the second shield and the respective fourth individual structurally aligned straight conductor of the second grouping.

191. The straight conductor arrangement of claim 176, wherein
[a] the first, second, third and fourth circuit assemblies are separate from one another,
[b] in the first grouping,
(1) no conductor occupies the space that is directly between the respective first individual structurally aligned straight conductor and the respective second individual structurally aligned straight conductor,
(2) no conductor occupies the space that is directly between the respective second individual structurally aligned straight conductor and the respective third individual structurally aligned straight conductor,
(3) no conductor occupies the space that is directly between the respective third individual structurally aligned straight conductor and the respective fourth individual structurally aligned straight conductor,
(4) a dielectric occupies the space that is directly between the respective first individual structurally aligned straight conductor and the respective second individual structurally aligned straight conductor,
(5) the dielectric occupies the space that is directly between the respective second individual structurally aligned straight conductor and the respective third individual structurally aligned straight conductor, and
(6) the dielectric occupies the space that is directly between the respective third individual structurally aligned straight conductor and the respective fourth individual structurally aligned straight conductor,
[c] in the second grouping,
(1) no conductor occupies the space that is directly between the respective first individual structurally aligned straight conductor and the respective second individual structurally aligned straight conductor,
(2) no conductor occupies the space that is directly between the respective second individual structurally aligned straight conductor and the respective third individual structurally aligned straight conductor,
(3) no conductor occupies the space that is directly between the respective third individual structurally aligned straight conductor and the respective fourth individual structurally aligned straight conductor,
(4) the dielectric occupies the space that is directly between the respective first individual structurally aligned straight conductor and the respective second individual structurally aligned straight conductor,
(5) the dielectric occupies the space that is directly between the respective second individual structurally aligned straight conductor and the respective third individual structurally aligned straight conductor,
(6) the dielectric occupies the space that is directly between the respective third individual structurally aligned straight conductor and the respective fourth individual structurally aligned straight conductor, and
wherein
(1) no conductor occupies the space that is directly between the respective first individual structurally aligned straight conductor of the first grouping and the second shield,
(2) no conductor occupies the space that is directly between the second shield and the respective first individual structurally aligned straight conductor of the second grouping,
(3) no conductor occupies the space that is directly between the respective second individual structurally aligned straight conductor of the first grouping and the second shield, (4) no conductor occupies the space that is directly between the second shield and the respective second individual structurally aligned straight conductor of the second grouping,
(5) no conductor occupies the space that is directly between the respective third individual structurally aligned straight conductor of the first grouping and the second shield,
(6) no conductor occupies the space that is directly between the second shield and the respective third individual structurally aligned straight conductor of the second grouping,
(7) no conductor occupies the space that is directly between the respective fourth individual structurally aligned straight conductor of the first grouping and the second shield, and
(8) no conductor occupies the space that is directly between the second shield and the respective fourth individual structurally aligned straight conductor of the second grouping.
(9) the dielectric occupies the space that is directly between the respective first individual structurally aligned straight conductor of the first grouping and the second shield,
(10) the dielectric occupies the space that is directly between the second shield and the respective first individual structurally aligned straight conductor of the second grouping,
(11) the dielectric occupies the space that is directly between the respective second individual structurally aligned straight conductor of the first grouping and the second shield,
(12) the dielectric occupies the space that is directly between the second shield and the respective second individual structurally aligned straight conductor of the second grouping,
(13) the dielectric occupies the space that is directly between the respective third individual structurally aligned straight conductor of the first grouping and the second shield,
(14) the dielectric occupies the space that is directly between the second shield and the respective third individual structurally aligned straight conductor of the second grouping,
(15) the dielectric occupies the space that is directly between the respective fourth individual structurally aligned straight conductor of the first grouping and the second shield, and
(16) the dielectric occupies the space that is directly between the second shield and the respective fourth individual structurally aligned straight conductor of the second grouping.

192. The straight conductor arrangement of claim 176, wherein
[a] the first, second, third and fourth circuit assemblies are separate from one another,
[b] in the first grouping,
(1) no conductor occupies the space that is directly between the respective first individual structurally aligned straight conductor and the respective second individual structurally aligned straight conductor,
(2) no conductor occupies the space that is directly between the respective second individual structurally aligned straight conductor and the respective third individual structurally aligned straight conductor,
(3) no conductor occupies the space that is directly between the respective third individual structurally aligned straight conductor and the respective fourth individual structurally aligned straight conductor, and
[c] in the second grouping,
(1) no conductor occupies the space that is directly between the respective first individual structurally aligned straight conductor and the respective second individual structurally aligned straight conductor,
(2) no conductor occupies the space that is directly between the respective second individual structurally aligned straight conductor and the respective third individual structurally aligned straight conductor,
(3) no conductor occupies the space that is directly between the respective third individual structurally aligned straight conductor and the respective fourth individual structurally aligned straight conductor, and
wherein
(1) no conductor occupies the space that is directly between the respective first individual structurally aligned straight conductor of the first grouping and the second shield,
(2) no conductor occupies the space that is directly between the second shield and the respective first individual structurally aligned straight conductor of the second grouping,
(3) no conductor occupies the space that is directly between the respective second individual structurally aligned straight conductor of the first grouping and the second shield,
(4) no conductor occupies the space that is directly between the second shield and the respective second individual structurally aligned straight conductor of the second grouping,
(5) no conductor occupies the space that is directly between the respective third individual structurally aligned straight conductor of the first grouping and the second shield,
(6) no conductor occupies the space that is directly between the second shield and the respective third individual structurally aligned straight conductor of the second grouping,
(7) no conductor occupies the space that is directly between the respective fourth individual structurally aligned straight conductor of the first grouping and the second shield, and
(8) no conductor occupies the space that is directly between the second shield and the respective fourth individual structurally aligned straight conductor of the second grouping.

193. The straight conductor arrangement of claim 192, wherein
[a] in the first grouping,
(1) a dielectric occupies the space that is directly between the respective first individual structurally aligned straight conductor and the respective second individual structurally aligned straight conductor,
(2) the dielectric occupies the space that is directly between the respective second individual structurally aligned straight conductor and the respective third individual structurally aligned straight conductor, and
(3) the dielectric occupies the space that is directly between the respective third individual structurally aligned straight conductor and the respective fourth individual structurally aligned straight conductor,
[b] in the second grouping,
(1) the dielectric occupies the space that is directly between the respective first individual structurally aligned straight conductor and the respective second individual structurally aligned straight conductor,
(2) the dielectric occupies the space that is directly between the respective second individual structurally aligned straight conductor and the respective third individual structurally aligned straight conductor, and
(3) the dielectric occupies the space that is directly between the respective third individual structurally aligned straight conductor and the respective fourth individual structurally aligned straight conductor, and
wherein
(1) the dielectric occupies the space that is directly between the respective first individual structurally aligned straight conductor of the first grouping and the second shield,
(2) the dielectric occupies the space that is directly between the second shield and the respective first individual structurally aligned straight conductor of the second grouping,
(3) the dielectric occupies the space that is directly between the respective second individual structurally aligned straight conductor of the first grouping and the second shield,
(4) the dielectric occupies the space that is directly between the second shield and the respective second individual structurally aligned straight conductor of the second grouping,
(5) the dielectric occupies the space that is directly between the respective third individual structurally aligned straight conductor of the first grouping and the second shield,
(6) the dielectric occupies the space that is directly between the second shield and the respective third individual structurally aligned straight conductor of the second grouping,
(7) the dielectric occupies the space that is directly between the respective fourth individual structurally aligned straight conductor of the first grouping and the second shield, and
(8) the dielectric occupies the space that is directly between the second shield and the respective fourth individual structurally aligned straight conductor of the second grouping.

194. The straight conductor arrangement of claim 190, wherein each of the respective larger individual, elongated conductors of the straight conductor arrangement includes a respective first conductive end and a respective second conductive end.

195. The straight conductor arrangement of claim 191, wherein each of the respective larger individual, elongated conductors of the straight conductor arrangement includes a respective first conductive end and a respective second conductive end; and
wherein only one of the respective first and second conductive ends is conductively connected to the microprocessor.

196. The straight conductor arrangement of claim 192, wherein each of the respective larger individual, elongated conductors of the straight conductor arrangement is configured as a bypass conductor.

197. The straight conductor arrangement of claim 193, wherein each of the respective larger individual, elongated conductors of the straight conductor arrangement is configured as a feed-through conductor.

198. The straight conductor arrangement of claim 194, wherein only one of the respective first and second conductive ends is conductively connected to the microprocessor.

199. The straight conductor arrangement of claim 198, wherein one or more of the first, second and third shields is conductively connected to the microprocessor.

200. The straight conductor arrangement of claim 195, wherein one or more of the first, second and third common conductor plates are conductively connected to one or more of the first, second and third shields; and
wherein one or more of the first, second and third shields is conductively connected to the microprocessor.

201. The straight conductor arrangement of claim 193, wherein each of the respective larger individual, elongated conductors of the straight conductor arrangement includes a respective first conductive end and a respective second conductive end,
wherein only one of the respective first and second conductive ends is conductively connected to the microprocessor,
wherein one or more of the first, second and third common conductor plates are conductively connected to one or more of the first, second and third shields; and
wherein one or more of the first, second and third shields is conductively connected to the microprocessor.

202. The straight conductor arrangement of claim 201, wherein each of the respective larger individual, elongated conductors of the straight conductor arrangement is a respective data line conductor of the straight conductor arrangement.

203. The straight conductor arrangement of claim 202, wherein each of the respective larger individual, elongated conductors of the straight conductor arrangement is a respective signal conductor of the straight conductor arrangement.

204. The line conductor arrangement of claim 172, further comprising:
5.] a microprocessor; wherein
  [a] the microprocessor is attached to the substrate,
  [b] the microprocessor is conductively connected to each one of the respective larger individual, elongated line conductors of the line conductor arrangement,
6.] a first circuit assembly that includes
  [a] the respective first individual line conductor structure of the first grouping,
  [b] the respective second individual line conductor structure of the first grouping, and
  [c] the microprocessor,
7.] a second circuit assembly that includes
  [a] the respective third individual line conductor structure of the first grouping,
  [b] the respective fourth individual line conductor structure of the first grouping, and
  [c] the microprocessor,
8.] a third circuit assembly that includes
  [a] the respective first individual line conductor structure of the second grouping,
  [b] the respective second individual line conductor structure of the second grouping, and
  [c] the microprocessor, and
9.] a fourth circuit assembly that includes
  [a] the respective third individual line conductor structure of the second grouping,
  [b] the respective fourth individual line conductor structure of the second grouping, and
  [c] the microprocessor.

205. The line conductor arrangement of claim 204, further comprising:
10.] a first common conductor plate;
11.] a second common conductor plate that is spaced apart from the first common conductor plate; and 12.] a third common conductor plate that is spaced apart from both the first and second common conductor plates;
wherein
[a] the second common conductor plate is positioned between the first and third common conductor plates,
[b] the first, second and third common conductor plates are stacked parallel to one another, and
[c] the first, second and third common conductor plates are conductively connected to one another;
13.] a first plate-shaped conductor; and
14.] a second plate-shaped conductor;
wherein
[a] the first, second and third common conductor plates are each larger in size than any one of the first and second plate-shaped conductors,
[b] the first and second plate-shaped conductors are each parallel to the first, second and third common conductor plates,
[c] the first and second plate-shaped conductors are each not conductively connected to the first, second and third common conductor plates,
[d] the first and second plate-shaped conductors are each not conductively connected to any of the three conductively connected shields,
[e] the first plate-shaped conductor is stacked between the first and second common conductor plates,
[f] the second plate-shaped conductor is stacked between the second and third common conductor plates, and
[g] the first and second plate-shaped conductors and the first, second and third common conductor plates are all at least partially embedded within the substrate.

206. The line conductor arrangement of claim 205, wherein
[a] the first circuit assembly is configured such that none of the four individual line conductor structures of the second grouping are of the first circuit assembly,
[b] the second circuit assembly is configured such that none of the four individual line conductor structures of the second grouping are of the second circuit assembly,
[c] the third circuit assembly is configured such that none of the four individual line conductor structures of the first grouping are of the third circuit assembly, and
[d] the fourth circuit assembly is configured such that none of the four individual line conductor structures of the first grouping are of the fourth circuit assembly.

207. The line conductor arrangement of claim 204, wherein
[a] the first circuit assembly is configured such that none of the four individual line conductor structures of the second grouping are of the first circuit assembly,
[b] the second circuit assembly is configured such that none of the four individual line conductor structures of the second grouping are of the second circuit assembly,
[c] the third circuit assembly is configured such that none of the four individual line conductor structures of the first grouping are of the third circuit assembly, and
[d] the fourth circuit assembly is configured such that none of the four individual line conductor structures of the first grouping are of the fourth circuit assembly.

208. The line conductor arrangement of claim 206, wherein the first, second, third and fourth circuit assemblies are separate from one another.

209. The line conductor arrangement of claim 207, wherein the first, second, third and fourth circuit assemblies are separate from one another.

210. The line conductor arrangement of claim 207, wherein when the line conductor arrangement is energized, the first, second, third and fourth circuit assemblies operate separately from one another.

211. The line conductor arrangement of claim 206, wherein when the line conductor arrangement is energized, the first, second, third and fourth circuit assemblies operate separately from one another.

212. The line conductor arrangement of claim 211, wherein each of the individual line conductor structures is a feed-through conductor.

213. The line conductor arrangement of claim 207, wherein
[a] the first, second, third and fourth circuit assemblies are separate from one another,
[b] in the first grouping,
(1) only a dielectric occupies the space that is directly between the respective first individual line conductor structure and the respective second individual line conductor structure,
(2) only the dielectric occupies the space that is directly between the respective second individual line conductor structure and the respective third individual line conductor structure, and
(3) only the dielectric occupies the space that is directly between the respective third individual line conductor structure and the respective fourth individual line conductor structure,
[c] in the second grouping,
(1) only the dielectric occupies the space that is directly between the respective first individual line conductor structure and the respective second individual line conductor structure,
(2) only the dielectric occupies the space that is directly between the respective second individual line conductor structure and the respective third individual line conductor structure, and
(3) only the dielectric occupies the space that is directly between the respective third individual line conductor structure and the respective fourth individual line conductor structure, and
wherein
(1) only the dielectric occupies the space that is directly between the respective first individual line conductor structure of the first grouping and the second shield,
(2) only the dielectric occupies the space that is directly between the second shield and the respective first individual line conductor structure of the second grouping,
(3) only the dielectric occupies the space that is directly between the respective second individual line conductor structure of the first grouping and the second shield,
(4) only the dielectric occupies the space that is directly between the second shield and the respective second individual line conductor structure of the second grouping,
(5) only the dielectric occupies the space that is directly between the respective third individual line conductor structure of the first grouping and the second shield,
(6) only the dielectric occupies the space that is directly between the second shield and the respective third individual line conductor structure of the second grouping, (7) only the dielectric occupies the space that is directly between the respective fourth individual line conductor structure of the first grouping and the second shield, and (8) only the dielectric occupies the space that is directly between the second shield and the respective fourth individual line conductor structure of the second grouping.

214. The line conductor arrangement of claim 207, wherein

[a] the first, second, third and fourth circuit assemblies are separate from one another,

[b] in the first grouping, (1) no conductor occupies the space that is directly between the respective first individual line conductor structure and the respective second individual line conductor structure, (2) no conductor occupies the space that is directly between the respective second individual line conductor structure and the respective third individual line conductor structure, (3) no conductor occupies the space that is directly between the respective third individual line conductor structure and the respective fourth individual line conductor structure, (4) a dielectric occupies the space that is directly between the respective first individual line conductor structure and the respective second individual line conductor structure, (5) the dielectric occupies the space that is directly between the respective second individual line conductor structure and the respective third individual line conductor structure, and (6) the dielectric occupies the space that is directly between the respective third individual line conductor structure and the respective fourth individual line conductor structure,

[c] in the second grouping, (1) no conductor occupies the space that is directly between the respective first individual line conductor structure and the respective second individual line conductor structure, (2) no conductor occupies the space that is directly between the respective second individual line conductor structure and the respective third individual line conductor structure, (3) no conductor occupies the space that is directly between the respective third individual line conductor structure and the respective fourth individual line conductor structure, (4) the dielectric occupies the space that is directly between the respective first individual line conductor structure and the respective second individual line conductor structure, (5) the dielectric occupies the space that is directly between the respective second individual line conductor structure and the respective third individual line conductor structure, and (6) the dielectric occupies the space that is directly between the respective third individual line conductor structure and the respective fourth individual line conductor structure, and wherein (1) no conductor occupies the space that is directly between the respective first individual line conductor structure of the first grouping and the second shield, (2) no conductor occupies the space that is directly between the second shield and the respective first individual line conductor structure of the second grouping, (3) no conductor occupies the space that is directly between the respective second individual line conductor structure of the first grouping and the second shield, (4) no conductor occupies the space that is directly between the second shield and the respective second individual line conductor structure of the second grouping, (5) no conductor occupies the space that is directly between the respective third individual line conductor structure of the first grouping and the second shield, (6) no conductor occupies the space that is directly between the second shield and the respective third individual line conductor structure of the second grouping, (7) no conductor occupies the space that is directly between the respective fourth individual line conductor structure of the first grouping and the second shield, and (8) no conductor occupies the space that is directly between the second shield and the respective fourth individual line conductor structure of the second grouping.

(9) the dielectric occupies the space that is directly between the respective first individual line conductor structure of the first grouping and the second shield,

(10) the dielectric occupies the space that is directly between the second shield and the respective first individual line conductor structure of the second grouping,

(11) the dielectric occupies the space that is directly between the respective second individual line conductor structure of the first grouping and the second shield,

(12) the dielectric occupies the space that is directly between the second shield and the respective second individual line conductor structure of the second grouping,

(13) the dielectric occupies the space that is directly between the respective third individual line conductor structure of the first grouping and the second shield,

(14) the dielectric occupies the space that is directly between the second shield and the respective third individual line conductor structure of the second grouping,

(15) the dielectric occupies the space that is directly between the respective fourth individual line conductor structure of the first grouping and the second shield, and

(16) the dielectric occupies the space that is directly between the second shield and the respective fourth individual line conductor structure of the second grouping.

215. The line conductor arrangement of claim 206, wherein

[a] the first, second, third and fourth circuit assemblies are separate from one another,

[b] in the first grouping, (1) no conductor occupies the space that is directly between the respective first individual line conductor structure and the respective second individual line conductor structure, (2) no conductor occupies the space that is directly between the respective second individual line conductor structure and the respective third individual line conductor structure,
(3) no conductor occupies the space that is directly between the respective third individual line conductor structure and the respective fourth individual line conductor structure, and

[c] in the second grouping,
(1) no conductor occupies the space that is directly between the respective first individual line conductor structure and the respective second individual line conductor structure,
(2) no conductor occupies the space that is directly between the respective second individual line conductor structure and the respective third individual line conductor structure,
(3) no conductor occupies the space that is directly between the respective third individual line conductor structure and the respective fourth individual line conductor structure, and wherein
(1) no conductor occupies the space that is directly between the respective first individual line conductor structure of the first grouping and the second shield,
(2) no conductor occupies the space that is directly between the second shield and the respective first individual line conductor structure of the second grouping,
(3) no conductor occupies the space that is directly between the respective second individual line conductor structure of the first grouping and the second shield,
(4) no conductor occupies the space that is directly between the second shield and the respective second individual line conductor structure of the second grouping,
(5) no conductor occupies the space that is directly between the respective third individual line conductor structure of the first grouping and the second shield,
(6) no conductor occupies the space that is directly between the second shield and the respective third individual line conductor structure of the second grouping,
(7) no conductor occupies the space that is directly between the respective fourth individual line conductor structure of the first grouping and the second shield, and
(8) no conductor occupies the space that is directly between the second shield and the respective fourth individual line conductor structure of the second grouping.

216. The line conductor arrangement of claim 215, wherein
[a] in the first grouping,
(1) a dielectric occupies the space that is directly between the respective first individual line conductor structure and the respective second individual line conductor structure,
(2) the dielectric occupies the space that is directly between the respective second individual line conductor structure and the respective third individual line conductor structure, and
(3) the dielectric occupies the space that is directly between the respective third individual line conductor structure and the respective fourth individual line conductor structure,

[b] in the second grouping,
(1) the dielectric occupies the space that is directly between the respective first individual line conductor structure and the respective second individual line conductor structure,
(2) the dielectric occupies the space that is directly between the respective second individual line conductor structure and the respective third individual line conductor structure, and
(3) the dielectric occupies the space that is directly between the respective third individual line conductor structure and the respective fourth individual line conductor structure, and wherein
(1) the dielectric occupies the space that is directly between the respective first individual line conductor structure of the first grouping and the second shield,
(2) the dielectric occupies the space that is directly between the second shield and the respective first individual line conductor structure of the second grouping,
(3) the dielectric occupies the space that is directly between the respective second individual line conductor structure of the first grouping and the second shield,
(4) the dielectric occupies the space that is directly between the second shield and the respective second individual line conductor structure of the second grouping,
(5) the dielectric occupies the space that is directly between the respective third individual line conductor structure of the first grouping and the second shield,
(6) the dielectric occupies the space that is directly between the second shield and the respective third individual line conductor structure of the second grouping,
(7) the dielectric occupies the space that is directly between the respective fourth individual line conductor structure of the first grouping and the second shield, and
(8) the dielectric occupies the space that is directly between the second shield and the respective fourth individual line conductor structure of the second grouping.

217. The line conductor arrangement of claim 213, wherein each of the respective larger individual, elongated line conductors of the line conductor arrangement includes a respective first conductive end and a respective second conductive end; and
wherein only one of the respective first and second conductive ends is conductively connected to the microprocessor.

218. The line conductor arrangement of claim 214, wherein each of the respective larger individual, elongated line conductors of the line conductor arrangement includes a respective first conductive end and a respective second conductive end; and
wherein only one of the respective first and second conductive ends is conductively connected to the microprocessor.

219. The line conductor arrangement of claim 215, wherein each of the respective larger individual, elongated line conductors of the line conductor arrangement includes a respective first conductive end and a respective second conductive end; and wherein only one of the respective first and second conductive ends is conductively connected to the microprocessor.

220. The line conductor arrangement of claim 216, wherein each of the respective larger individual, elongated line conductors of the line conductor arrangement includes a respective first conductive end and a respective second conductive end; and
wherein only one of the respective first and second conductive ends is conductively connected to the microprocessor.

221. The line conductor arrangement of claim 217, wherein each of the respective larger individual, elongated line conductors of the line conductor arrangement is configured as a bypass conductor.

222. The line conductor arrangement of claim 218, wherein each of the respective larger individual, elongated line conductors of the line conductor arrangement is a respective signal conductor of the microprocessor.

223. The line conductor arrangement of claim 219, wherein each of the respective larger individual, elongated line conductors of the line conductor arrangement is a respective data line conductor of the microprocessor.

224. The line conductor arrangement of claim 222, wherein one or more of the respective larger individual, elongated line conductors of the line conductor arrangement are configured to allow energy to propagate to the microprocessor when the line conductor arrangement is energized.

225. The line conductor arrangement of claim 223, wherein one or more of the respective larger individual, elongated line conductors of the line conductor arrangement are configured to allow energy to propagate from the microprocessor when the line conductor arrangement is energized.

226. A conductor arrangement comprising:
1.] a substrate;
2.] an upper conductor plate, a center conductor plate that is spaced apart from the upper conductor plate, and a lower conductor plate that is spaced apart from both the upper and center conductor plates, and wherein
  [d] the center conductor plate is stacked between the upper and lower conductor plates,
  [e] the upper, center and lower conductor plates are parallel to one another, and
  [f] the upper, center and lower conductor plates are conductively connected to one another;
3.] a first group of four conductors that includes a respective first conductor, a respective second conductor, a respective third conductor, and a respective fourth conductor;
4.] a second group of four conductors that includes a respective first conductor, a respective second conductor, a respective third conductor, and a respective fourth conductor;
wherein
[A] none of the upper, center and lower conductor plates are conductively connected to any of the respective conductors of the first and second groups,
[B] none of the respective conductors of the first group are conductively connected to any of the respective conductors of the second group,
[C] each of the respective conductors of the first group includes a respective conductor portion that is elongated and straight, and wherein each of the respective conductors of the second group includes a respective conductor portion that is elongated and straight,
[D] all of the respective conductor portions of the first and second groups are parallel to one another,
[E] all of the respective conductor portions of the first and second groups are located within the substrate,
[F] the upper, center and the lower conductor plates are each at least partially located within the substrate,
[G] all of the respective conductor portions of the first group are
  (1. located between the upper and center conductor plates,
  (2. uniformly spaced apart from the upper conductor plate by a dielectric therebetween,
  (3. uniformly spaced apart from the center conductor plate by the dielectric therebetween, and
  (4. arranged in close proximity to one another such that
    (a.) the dielectric occupies the space that is directly between the respective conductor portion of the respective first conductor and the respective conductor portion of the respective second conductor, and
    (b.) the dielectric occupies the space that is directly between the respective conductor portion of the respective second conductor and the respective conductor portion of the respective third conductor, and
    (c.) the dielectric occupies the space that is directly between the respective conductor portion of the respective third conductor and the respective conductor portion of the respective fourth conductor, and
    (d.) the dielectric and the respective conductor portions of the respective second and third conductors occupy the space that is directly between the respective conductor portion of the respective first conductor and the respective conductor portion of the respective fourth conductor,
[H] all of the respective conductor portions of the second group are
  (1. located between the center and lower conductor plates,
  (2. uniformly spaced apart from the center conductor plate by the dielectric therebetween,
  (3. uniformly spaced apart from the lower conductor plate by the dielectric therebetween, and
  (4. arranged in close proximity to one another such that
    (a) the dielectric occupies the space that is directly between the respective conductor portion of the respective first conductor and the respective conductor portion of the respective second conductor, and
    (b) the dielectric occupies the space that is directly between the respective conductor portion of the respective second conductor and the respective conductor portion of the respective third conductor, and
    (c) the dielectric occupies the space that is directly between the respective conductor portion of the respective third conductor and the respective conductor portion of the respective fourth conductor, and
    (d) the dielectric and the respective conductor portions of the respective second and third conductors occupy the space that is directly between the respective conductor portion of the respective first conductor and the respective conductor portion of the respective fourth conductor,
[I] the center conductor plate physically shields all the respective conductor portions of the first group from all the respective conductor portions of the second group,

[J] the individual respective conductor portions of the respective first conductors of the first and second groups are together stacked in superposition such that
   a. the two respective first conductors' respective conductor portions are equal sized structures relative to one another,
   b. the two respective first conductors' respective conductor portions are equal shaped structures relative to one another,

[K] the individual respective conductor portions of the respective second conductors of the first and second groups are together stacked in superposition such that
   a. the two respective second conductors' respective conductor portions are equal sized structures relative to one another,
   b. the two respective second conductors' respective conductor portions are equal shaped structures relative to one another,

[L] the individual respective conductor portions of the respective third conductors of the first and second groups are together stacked in superposition such that
   a. the two respective third conductors' respective conductor portions are equal sized structures relative to one another,
   b. the two respective third conductors' respective conductor portions are equal shaped structures relative to one another,

[M] the individual respective conductor portions of the respective fourth conductors of the first and second groups are together stacked in superposition such that
   c. the two respective fourth conductors' respective conductor portions are equal sized structures relative to one another, and
   d. the two respective fourth conductors' respective conductor portions are equal shaped structures relative to one another.

227. The conductor arrangement of claim 226, wherein
[N] in the first group, all of the respective conductor portions are arranged in a first common longitudinal orientation relative to one another, and
[O] in the second group, all of the respective conductor portions are arranged in the first common longitudinal orientation relative to one another.

228. The conductor arrangement of claim 227, wherein
[P] in the first group,
   (e) the shortest distance between the respective conductor portion of the respective first conductor and the respective conductor portion of the respective second conductor is a first distance,
   (f) the shortest distance between the respective conductor portion of the respective second conductor and the respective conductor portion of the respective third conductor is a second distance,
   (g) the shortest distance between the respective conductor portion of the respective third conductor and the respective conductor portion of the respective fourth conductor is a third distance, and
   (h) the shortest distance between the respective conductor portion of the respective first conductor and the respective conductor portion of the respective fourth conductor is a fourth distance,
[Q] in the second group,
   (e) the shortest distance between the respective conductor portion of the respective first conductor and the respective conductor portion of the respective second conductor is the first distance,
   (f) the shortest distance between the respective conductor portion of the respective second conductor and the respective conductor portion of the respective third conductor is the second distance,
   (g) the shortest distance between the respective conductor portion of the respective third conductor and the respective conductor portion of the respective fourth conductor is the third distance, and
   (h) the shortest distance between the respective conductor portion of the respective first conductor and the respective conductor portion of the respective fourth conductor is the fourth distance.

229. The conductor arrangement of claim 228, wherein the first and third distances are equal to one another.

230. The conductor arrangement of claim 228, wherein the first, second and third distances are equal to one another.

231. The conductor arrangement of claim 229, further comprising a microprocessor, wherein the microprocessor is attached to the substrate.

232. The conductor arrangement of claim 230, further comprising a microprocessor, wherein the microprocessor is attached to the substrate.

233. The conductor arrangement for claim 231, wherein
[A. the respective conductors of the first group are each conductively connected to the microprocessor,
[B. the respective conductors of the second group are each conductively connected to the microprocessor, and
[C. at least one of the upper, center and lower conductor plates is conductively connected to the microprocessor.

234. The conductor arrangement for claim 233, wherein
[D. the respective conductor portions of the first group are arranged such that within the first group,
   (1. only the dielectric is between the respective conductor portion of the respective first conductor and the respective conductor portion of the respective second conductor,
   (2. only the dielectric is between the respective conductor portion of the respective second conductor and the respective conductor portion of the respective third conductor, and
   (3. only the dielectric is between the respective conductor portion of the respective third conductor and the respective conductor portion of the respective fourth conductor.

235. The conductor arrangement for claim 234, wherein
[E. the respective conductor portions of the second group are arranged such that within the second group,
   (1. only the dielectric is between the respective conductor portion of the respective first conductor and the respective conductor portion of the respective second conductor, and
   (2. only the dielectric is between the respective conductor portion of the respective second conductor and the respective conductor portion of the respective third conductor, and
   (3. only the dielectric is between the respective conductor portion of the respective third conductor and the respective conductor portion of the respective fourth conductor.

236. The conductor arrangement for claim 232, wherein
[A. the respective conductor portions of the first group are arranged such that within the first group,
   (1. no conductor is positioned directly between the respective conductor portion of the respective first conductor and the respective conductor portion of the respective second conductor, (2. no conductor is positioned directly between the respective conductor portion of the respective second conductor and the respective conductor portion of the respective third conductor,
(3. no conductor is positioned directly between the respective conductor portion of the respective third conductor and the respective conductor portion of the respective fourth conductor, and
[B. the respective conductor portions of the second group are arranged such that within the second group,
  (1. no conductor is positioned directly between the respective conductor portion of the respective first conductor and the respective conductor portion of the respective second conductor,
  (2. no conductor is positioned directly between the respective conductor portion of the respective second conductor and the respective conductor portion of the respective third conductor, and
  (3. no conductor is positioned directly between the respective conductor portion of the respective third conductor and the respective conductor portion of the respective fourth conductor.
237. The conductor arrangement of claim 236, wherein
[C. the respective conductors of the first group are each conductively connected to the microprocessor,
[D. the respective conductors of the second group are each conductively connected to the microprocessor, and
[E. at least one of the upper, center and lower conductor plates is conductively connected to the microprocessor.
238. A conductive arrangement comprising:
1.] a substrate;
2.] three common conductors including:
  [a] an upper common conductor,
  [b] a center common conductor that is spaced apart from the upper common conductor, and
  [c] a lower common conductor that is spaced apart from both the upper and center common conductors, wherein the upper, center and lower common conductors are each parallel to one another, and wherein the center common conductor is stacked between the upper and lower common conductors of the first group;
3.] a first group of four elongated conductors, and wherein each respective elongated conductor of the first group includes a respective elongated section that is a three dimensional straight conductor portion of the respective elongated conductor;
4.] a second group of four elongated conductors, and wherein each respective elongated conductor of the second group includes a respective elongated section that is a three dimensional straight conductor portion of the respective elongated conductor of the second group;
wherein
A] the upper, center and the lower common conductors are conductively connected to one another,
B] none of the upper, center and the lower common conductors are conductively connected to any of the respective elongated conductors,
C] the upper, center and the lower common conductors and all of the respective elongated conductors are each at least partially located within the substrate,
D] the upper, center and lower common conductors are each larger in size than any one of the respective elongated sections,
E] the respective elongated sections are each parallel to the upper, center and lower common conductors,
F] the respective elongated sections are parallel to one another,
G] all of the respective elongated sections of the first group are
  (1. uniformly spaced a first vertical distance apart from the upper common conductor,
  (2. uniformly spaced a second vertical distance apart from the center common conductor,
  (3. sandwiched between the upper and center common conductors, and
  (4. arranged such that
    (a) the respective elongated section of a respective first elongated conductor is located adjacent to the respective elongated section of a respective second elongated conductor so that the respective elongated section of the respective first elongated conductor and the respective elongated section of the respective second elongated conductor are spaced apart from each other a first horizontal distance, and
    (b) the respective elongated section of the respective second elongated conductor is adjacent to the respective elongated section of a respective third elongated conductor so that the respective elongated section of the respective second elongated conductor and the respective elongated section of the respective third elongated conductor are spaced apart from each other a second horizontal distance,
    (c) the respective elongated section of the respective third elongated conductor is adjacent to the respective elongated section of a respective fourth elongated conductor so that the respective elongated section of the respective third elongated conductor and the respective elongated section of the respective fourth elongated conductor are spaced apart from each other a third horizontal distance,
    (d) no conductor is positioned directly between the respective elongated section of the respective first elongated conductor and the respective elongated section of the respective second elongated conductor,
    (e) no conductor is positioned directly between the respective elongated section of the respective second elongated conductor and the respective elongated section of the respective third elongated conductor,
    (f) no conductor is positioned directly between the respective elongated section of the respective third elongated conductor and the respective elongated section of the respective fourth elongated conductor,
H] all of the respective elongated sections of the second group are
  (1. uniformly spaced apart a third vertical distance from the center common conductor,
  (2. uniformly spaced apart a fourth vertical distance from the lower common conductor,
  (3. sandwiched between the center and lower common conductors, and
  (4. arranged such that
    (a) the respective elongated section of a respective first elongated conductor is located adjacent to the respective elongated section of a respective second elongated conductor so that the respective elongated section of the respective first elongated conductor and the respective elongated section of the respective second elongated conductor are spaced apart from each other the first horizontal distance, (b) the respective elongated section of the respective second elongated conductor is adjacent to the respective elongated section of a respective third elongated conductor so that the respective elongated section of the respective second elongated conductor and the respective elongated section of the respective third elongated conductor are spaced apart from each other the second horizontal distance, (c) the respective elongated section of the respective third elongated conductor is adjacent to the respective elongated section of a respective fourth elongated conductor so that the respective elongated section of the respective third elongated conductor and the respective elongated section of the respective fourth elongated conductor are spaced apart from each other the third horizontal distance, (d) no conductor is positioned directly between the respective elongated section of the respective first elongated conductor and the respective elongated section of the respective second elongated conductor, (e) no conductor is positioned directly between the respective elongated section of the respective second elongated conductor and the respective elongated section of the respective third elongated conductor, and (f) no conductor is positioned directly between the respective elongated section of the respective third elongated conductor and the respective elongated section of the respective fourth elongated conductor, I] each one of the respective elongated sections of the first group is shielded from each one of the respective elongated sections of the second group by the center common conductor located therebetween, and wherein A] the respective elongated sections of the first and second groups are all arranged in common longitudinal orientation relative to one another such that (1. the respective elongated sections of the respective first elongated conductors of the first and second groups are of equal size and of equal shape relative to one another such that the respective elongated sections of the respective first elongated conductors of the first and second groups are stacked in superposed alignment relative to one another, (2. the respective elongated sections of the respective second elongated conductors of the first and second groups are of equal size and of equal shape relative to one another such that the respective elongated sections of the respective second elongated conductors of the first and second groups are stacked in superposed alignment relative to one another, (3. the respective elongated sections of the respective third elongated conductors of the first and second groups are of equal size and of equal shape relative to one another such that the respective elongated sections of the respective third elongated conductors of the first and second groups are stacked in superposed alignment relative to one another, and (4. the respective elongated sections of the respective fourth elongated conductors of the first and second groups are of equal size and of equal shape relative to one another such that the respective elongated sections of the respective fourth elongated conductors of the first and second groups are stacked in superposed alignment relative to one another.

239. The conductive arrangement of claim 238, wherein the second vertical distance is equal to the third vertical distance.

240. The conductive arrangement of claim 238, wherein the first horizontal distance is equal to the third horizontal distance.

241. A conductive arrangement comprising:

1.] at least three common conductors that include:
(g) an upper common conductor,
(h) a center common conductor that is spaced apart from the upper common conductor, and
(i) a lower common conductor that is spaced apart from both the upper and center common conductors, wherein the upper, center and lower common conductors are each parallel to one another, and wherein the center common conductor is stacked between the upper and lower common conductors;

2.] a first group of three conductors, and wherein each respective conductor of the first group includes a respective conductor straight portion that is an elongated three dimensional conductor section of each respective conductor of the first group;

3.] a second group of three conductors, and wherein each respective conductor of the second group includes a respective conductor straight portion that is an elongated three dimensional conductor section of each respective conductor of the second group;

wherein

A] the upper, center and lower common conductors are conductively connected to one another, B] none of the respective conductors of the first and second groups are conductively connected to any of the upper, center and lower common conductors, C] the upper, center and lower common conductors are each larger in size than any one of the respective conductor straight portions of the respective conductors of the first and second groups, D] the respective conductor straight portions of the first and second groups are each parallel to one another, E] the upper, center and lower common conductors are each parallel to all of the respective conductor straight portions of the first and second groups, F] all of the respective conductor straight portions of the first and second groups are oriented in common longitudinal alignment relative to one another, G] the respective conductor straight portions of the first group are together
(1. uniformly spaced apart a first vertical distance from the upper common conductor,
(2. uniformly spaced apart a second vertical distance from the center common conductor,
(3. sandwiched between the upper and center common conductors, and H] the respective conductor straight portions of the first group are located together so that within the first group,
(a) the respective conductor straight portion of a respective first conductor is located adjacent to the respective conductor straight portion of a respective second conductor such that the respective conductor straight portion of the respective first conductor and the respective conductor straight portion of the respective second conductor are separated by a first horizontal distance, and (b) the respective conductor straight portion of the respective second conductor is adjacent to the respective conductor straight portion of a respective third conductor such that the respective conductor straight portion of the respective second conductor and the respective conductor straight portion of the respective third conductor are separated from each other by a second horizontal distance, I] the respective conductor straight portions of the second group are together
(1. uniformly spaced apart a third vertical distance from the center common conductor,
(2. uniformly spaced apart a fourth vertical distance from the lower common conductor,
(3. sandwiched between the center and lower common conductors, and J] the respective conductor straight portions of the second group are located together so that within the second group,
(a.) the respective conductor straight portion of a respective first conductor is located adjacent to the respective conductor straight portion of a respective second conductor such that the respective conductor straight portion of the respective first conductor and the respective conductor straight portion of the respective second conductor are separated by the first horizontal distance, and
(b.) the respective conductor straight portion of the respective second conductor is adjacent to the respective conductor straight portion of a respective third conductor such that the respective conductor straight portion of the respective second conductor and the respective conductor straight portion of the respective third conductor are separated from each other by the second horizontal distance, K] all of the respective conductor straight portions of the first group are shielded from all of the respective conductor straight portions of the second group by the center common conductor stacked therebetween, and wherein A] the respective conductor straight portions of the respective first conductors of the first and second groups are together in superposed alignment relative to one another, B] the respective conductor straight portions of the respective second conductors of the first and second groups are together in superposed alignment relative to one another, and C] the respective conductor straight portions of the respective third conductors of the first and second groups are together in superposed alignment relative to one another.

242. The conductive arrangement of claim 241, further comprising:

4.] a third group of three conductors, and wherein each respective conductor of the third group includes a respective conductor straight portion that is an elongated three dimensional conductor section of each respective conductor of the third group;

5.] a fourth group of three conductors, and wherein each respective conductor of the fourth group includes a respective conductor straight portion that is an elongated three dimensional conductor section of each respective conductor of the fourth group;

wherein

A] the upper, center and lower common conductors are each larger in size than any one of the respective conductor straight portions of the respective conductors of the third and fourth groups, B] none of the respective conductors of the third and fourth groups are conductively connected to any of the upper, center and lower common conductors, C] none of the respective conductors of the third and fourth groups are conductively connected to any of the respective conductors of the first and second groups, D] the respective conductor straight portions of the third and fourth groups are each parallel to one another, E] the upper, center and lower common conductors are each parallel to all of the respective conductor straight portions of the third and fourth groups, F] all of the respective conductor straight portions of the third and fourth groups are oriented in common longitudinal alignment relative to one another, G] the respective conductor straight portions of the third group are together
(a) uniformly spaced apart the first vertical distance from the upper common conductor,
(b) uniformly spaced apart the second vertical distance from the center common conductor,
(c) sandwiched between the upper and center common conductors, and H] the respective conductor straight portions of the third group are located together so that within the third group,
(a) the respective conductor straight portion of a respective first conductor is located adjacent to the respective conductor straight portion of a respective second conductor such that the respective conductor straight portion of the respective first conductor and the respective conductor straight portion of the respective second conductor are separated by the first horizontal distance, and
(b) the respective conductor straight portion of the respective second conductor is adjacent to the respective conductor straight portion of a respective third conductor such that the respective conductor straight portion of the respective second conductor and the respective conductor straight portion of the respective third conductor are separated from each other by the second horizontal distance, I] the respective conductor straight portions of the fourth group are together
(a) uniformly spaced apart the third vertical distance from the center common conductor,
(b) uniformly spaced apart the fourth vertical distance from the lower common conductor,
(c) sandwiched between the center and lower common conductors, and J] the respective conductor straight portions of the fourth group are located together so that within the fourth group,
(a.) the respective conductor straight portion of a respective first conductor is located adjacent to the respective conductor straight portion of a respective second conductor such that the respective conductor straight portion of the respective first conductor and the respective conductor straight portion of the respective second conductor are separated by the first horizontal distance, and
(b.) the respective conductor straight portion of the respective second conductor is adjacent to the respective conductor straight portion of a respective third conductor such that the respective conductor straight portion of the respective second conductor and the respective conductor straight portion of the respective third conductor are separated from each other by the second horizontal distance, K] all of the respective conductor straight portions of the third group are shielded from all of the respective conductor straight portions of the fourth group by the center common conductor stacked therebetween, L] the respective conductor straight portions of the respective first conductors of the third and fourth groups are in superposition relative to one another, M] the respective conductor straight portions of the respective second conductors of the third and fourth groups are in superposition relative to one another, and N] the respective conductor straight portions of the respective third conductors of the third and fourth groups are in superposition relative to one another.

243. The conductive arrangement of claim 241, further comprising a substrate, wherein each one of the respective conductor straight portions of the first and second groups is located within the substrate.

244. The conductive arrangement of claim 242, further comprising a substrate, wherein each one of the respective conductor straight portions of the first, second, third and fourth groups is located within the substrate.

245. The conductive arrangement of claim 243, wherein the first horizontal distance is equal to the second horizontal distance.

246. The conductive arrangement of claim 244, wherein the first horizontal distance is equal to the second horizontal distance.

247. The conductive arrangement of claim 243, wherein within the first group,
  (1. no conductor is located directly between the respective conductor straight portion of the respective first conductor and the respective conductor straight portion of the respective second conductor,
  (2. no conductor is located directly between the respective conductor straight portion of the respective second conductor and the respective conductor straight portion of the respective third conductor, and
 wherein within the second group,
  (1. no conductor is located directly between the respective conductor straight portion of the respective first conductor and the respective conductor straight portion of the respective second conductor, and
  (2. no conductor is located directly between the respective conductor straight portion of the respective second conductor and the respective conductor straight portion of the respective third conductor.

248. The conductive arrangement of claim 244, wherein within the first group,
  (1. no conductor is located directly between the respective conductor straight portion of the respective first conductor and the respective conductor straight portion of the respective second conductor,
  (2. no conductor is located directly between the respective conductor straight portion of the respective second conductor and the respective conductor straight portion of the respective third conductor,
 wherein within the second group,
  (1. no conductor is located directly between the respective conductor straight portion of the respective first conductor and the respective conductor straight portion of the respective second conductor,
  (2. no conductor is located directly between the respective conductor straight portion of the respective second conductor and the respective conductor straight portion of the respective third conductor,
 wherein within the third group,
  (1. no conductor is located directly between the respective conductor straight portion of the respective first conductor and the respective conductor straight portion of the respective second conductor,
  (2. no conductor is located directly between the respective conductor straight portion of the respective second conductor and the respective conductor straight portion of the respective third conductor, and
 wherein within the fourth group,
  (1. no conductor is located directly between the respective conductor straight portion of the respective first conductor and the respective conductor straight portion of the respective second conductor, and
  (2. no conductor is located directly between the respective conductor straight portion of the respective second conductor and the respective conductor straight portion of the respective third conductor.

249. The conductive arrangement of claim 247, wherein the first horizontal distance is equal to the second horizontal distance.

250. The conductive arrangement of claim 248, wherein the first horizontal distance is equal to the second horizontal distance.

* * * * *